(12) United States Patent
Yamamoto

(10) Patent No.: US 8,314,868 B2
(45) Date of Patent: Nov. 20, 2012

(54) SOLID STATE IMAGING DEVICE, IMAGING APPARATUS, ELECTRONIC APPARATUS, AD CONVERTER, AND AD CONVERSION METHOD

(75) Inventor: Kazunori Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 444 days.

(21) Appl. No.: 12/659,469

(22) Filed: Mar. 10, 2010

(65) Prior Publication Data
US 2010/0253821 A1 Oct. 7, 2010

(30) Foreign Application Priority Data

Apr. 2, 2009 (JP) ................................. 2009-089787

(51) Int. Cl.
*H04N 3/14* (2006.01)
*H04N 5/335* (2011.01)

(52) U.S. Cl. ........ 348/294; 341/155; 341/164; 327/100; 327/184

(58) Field of Classification Search .................. 348/294; 341/155, 156
See application file for complete search history.

(56) References Cited

U.S. PATENT DOCUMENTS

| | | | | |
|---|---|---|---|---|
| 5,920,274 | A * | 7/1999 | Gowda et al. ................. | 341/155 |
| 6,670,904 | B1 | 12/2003 | Yakovlev | |
| 6,930,630 | B1 * | 8/2005 | Kim et al. ...................... | 341/155 |
| 7,405,688 | B2 * | 7/2008 | Prestros ......................... | 341/155 |
| 7,791,524 | B2 * | 9/2010 | Kasuga et al. ................. | 341/156 |
| 7,924,335 | B2 * | 4/2011 | Itakura et al. ................. | 348/308 |
| 7,952,510 | B2 * | 5/2011 | Shimomura et al. .......... | 341/164 |
| 8,115,845 | B2 * | 2/2012 | Koh et al. ...................... | 348/303 |
| 2001/0050628 | A1 * | 12/2001 | Yoda .............................. | 341/167 |
| 2004/0183709 | A1 * | 9/2004 | Kobayashi et al. ........... | 341/164 |
| 2005/0253942 | A1 | 11/2005 | Muramatsu et al. | |
| 2008/0036638 | A1 * | 2/2008 | Suzuki .......................... | 341/155 |
| 2008/0252767 | A1 * | 10/2008 | Muramatsu et al. .......... | 348/312 |
| 2010/0238465 | A1 * | 9/2010 | Kageyama et al. ............ | 358/1.9 |
| 2010/0271525 | A1 * | 10/2010 | Takahashi ...................... | 348/308 |
| 2010/0289931 | A1 * | 11/2010 | Shibata et al. ................ | 348/294 |
| 2011/0063147 | A1 * | 3/2011 | Yoshioka ...................... | 341/118 |

FOREIGN PATENT DOCUMENTS

| | | |
|---|---|---|
| JP | 56-096527 | 8/1981 |
| JP | 2002-232291 | 8/2002 |
| JP | 2005-328135 | 11/2005 |

* cited by examiner

*Primary Examiner* — Jason Chan
*Assistant Examiner* — Cynthia Segura
(74) *Attorney, Agent, or Firm* — Rader Fishman & Grauer, PLLC

(57) ABSTRACT

A solid state imaging device includes: an AD conversion section having a comparing section, which receives a reference signal from a predetermined reference signal generating section and which compares the reference signal with an analog signal to be processed, and a counter section, which receives a count clock for AD conversion and performs a count operation on the basis of a comparison result of the comparing section, and acquiring digital data of the signal on the basis of output data of the counter section; a count operation period control section controlling an operation period of the counter section on the basis of the comparison result; and a driving control section controlling the reference signal generating section and the AD conversion section such that for the signal to be processed, data of upper N−M bits is acquired in first processing and data of lower M bits is acquired in second processing.

16 Claims, 30 Drawing Sheets

FIG.3A
(1) RELATIONSHIP AMONG INCLINATION OF REFERENCE SIGNAL SLP_ADC, FREQUENCY OF COUNT CLOCK CKcnt1, AND BIT RESOLUTION
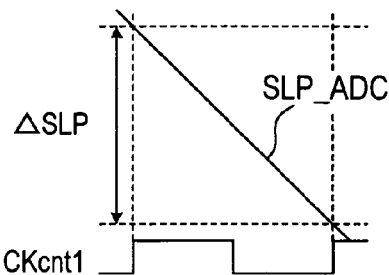
(2) INCLINATION OF REFERENCE SIGNAL SLP_ADC IS CHANGED AND FREQUENCY OF COUNT CLOCK CKcnt1 IS FIXED
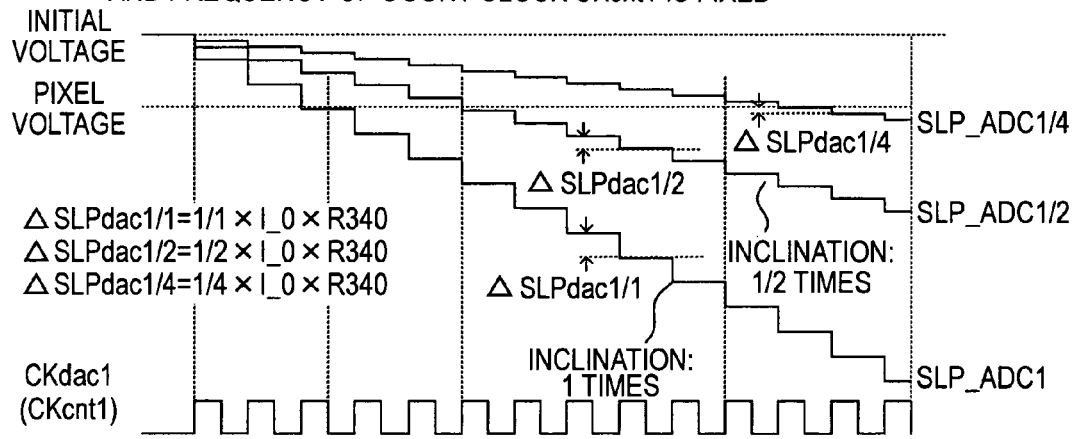
(3) INCLINATION OF REFERENCE SIGNAL SLP_ADC IS FIXED AND FREQUENCY OF COUNT CLOCK CKcnt1 IS CHANGED
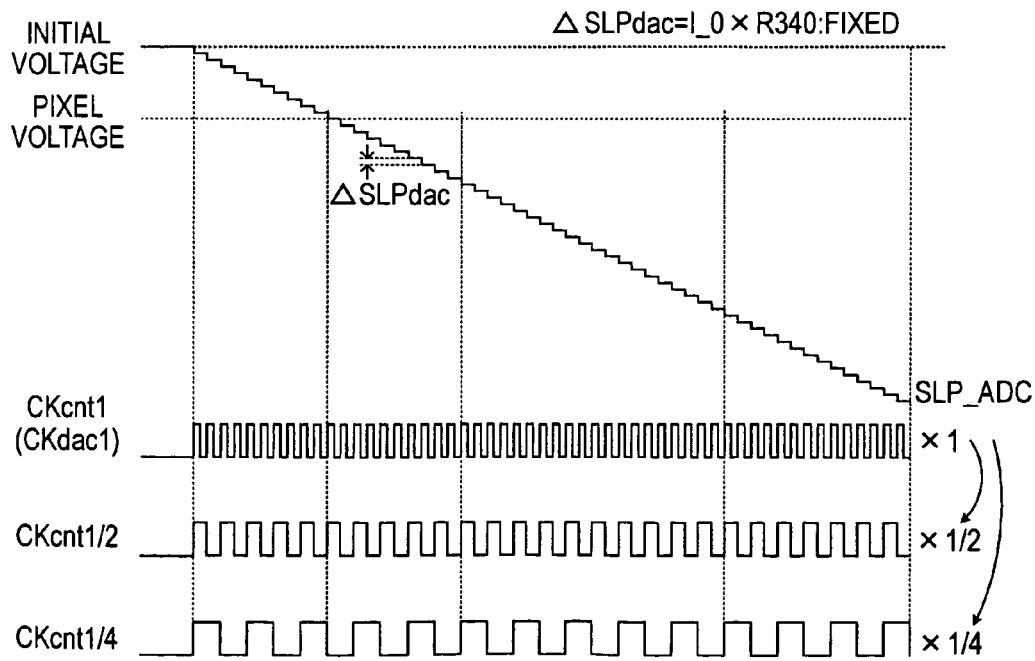

FIG.3B (1)

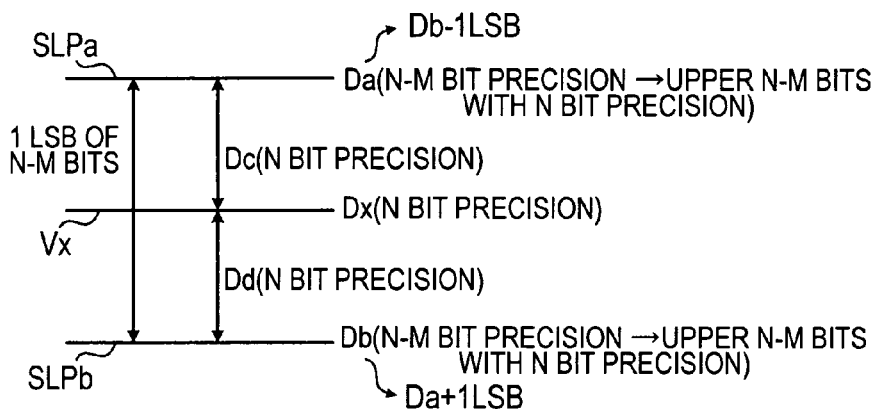

(2) FIRST-HALF COUNT METHOD IN FIRST PROCESSING

| DATA ACQUIRED WITH N-M BIT PRECISION IN FIRST PROCESSING | DATA ACQUIRED WITH N BIT PRECISION IN SECOND PROCESSING | OPERATION EXPRESSION FOR ACQUIRING Dx | COUNT OPERATION IN SECOND PROCESSING | | | |
|---|---|---|---|---|---|---|
| | | | REFERENCE SIGNAL: NEGATIVE DIRECTION | | REFERENCE SIGNAL: POSITIVE DIRECTION | |
| | | | STARTING POINT | STOP POINT | STARTING POINT | STOP POINT |
| Da | Dc | Da+Dc<br>=Da+(Dx-Da)<br>=Dx | SLPa<br>(Da) | Vx<br>(Dx) | Vx<br>(Dx) | SLPa<br>(Da) |
| Da | Dd | Da-Dd<br>=Da+(Db-Dx)<br>=Da-{(Da+1LSB)-Dx}<br>=Dx-1LSB<br>→Dx IS ACQUIRED BY+ CORRECTION OF 1 LSB | Vx<br>(Dx) | SLPb<br>(Db)<br>↓<br>Da+1LSB | SLPb<br>(Db)<br>↓<br>Da+1LSB | Vx<br>(Dx) |
| Db | Dd | Db-Dd<br>=Db-(Db-Dx)<br>=Dx | Vx<br>(Dx) | SLPb<br>(Db) | SLPb<br>(Db) | Vx<br>(Dx) |
| Db | Dc | Db+Dc<br>=Db+(Dx-Da)<br>=Db+{Dx-(Db-1LSB)}<br>=Dx+1LSB<br>→Dx IS ACQUIRED BY- CORRECTION OF 1 LSB | SLPa<br>(Da)<br>↓<br>Db-1LSB | Vx<br>(Dx) | SLPa<br>(Da)<br>↓<br>Db-1LSB | Vx<br>(Dx) |

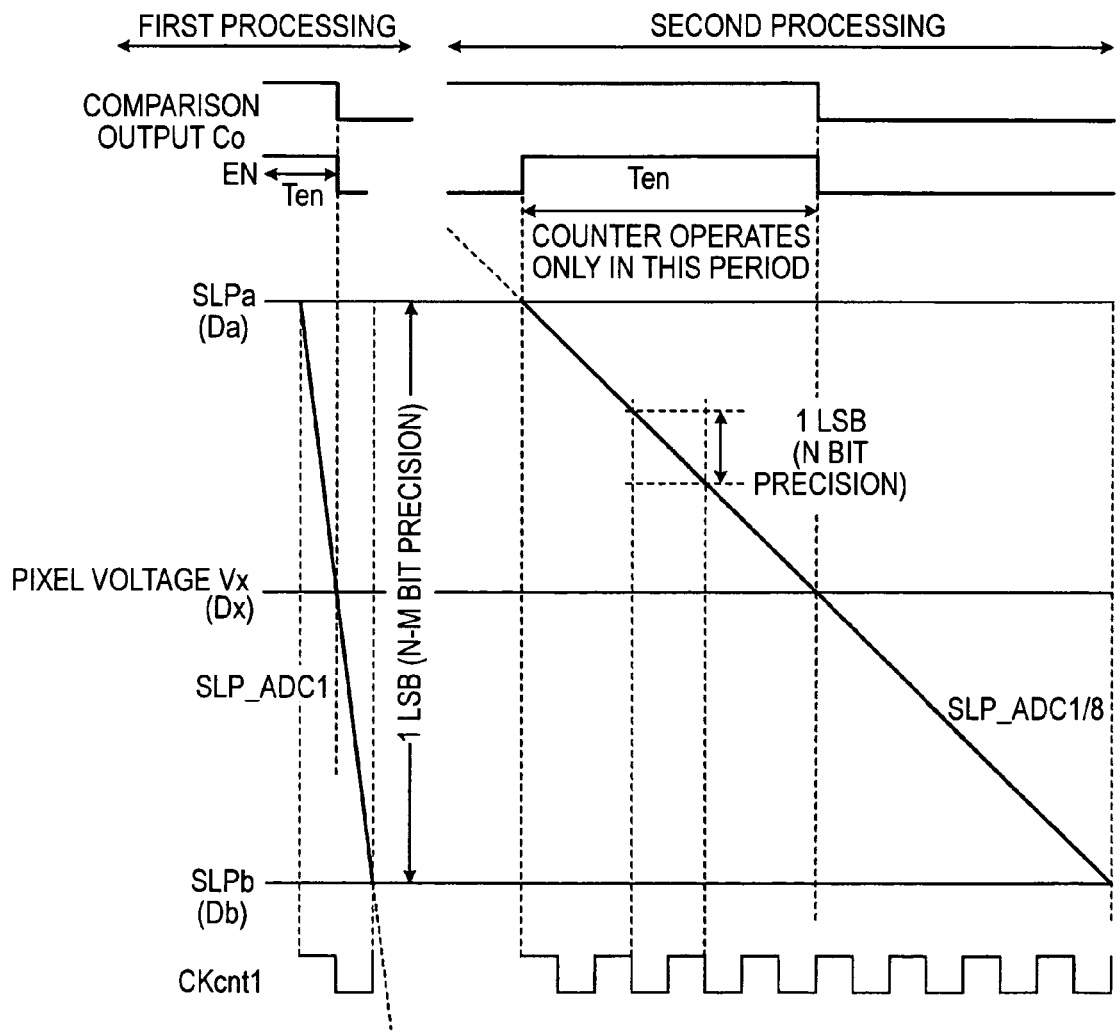

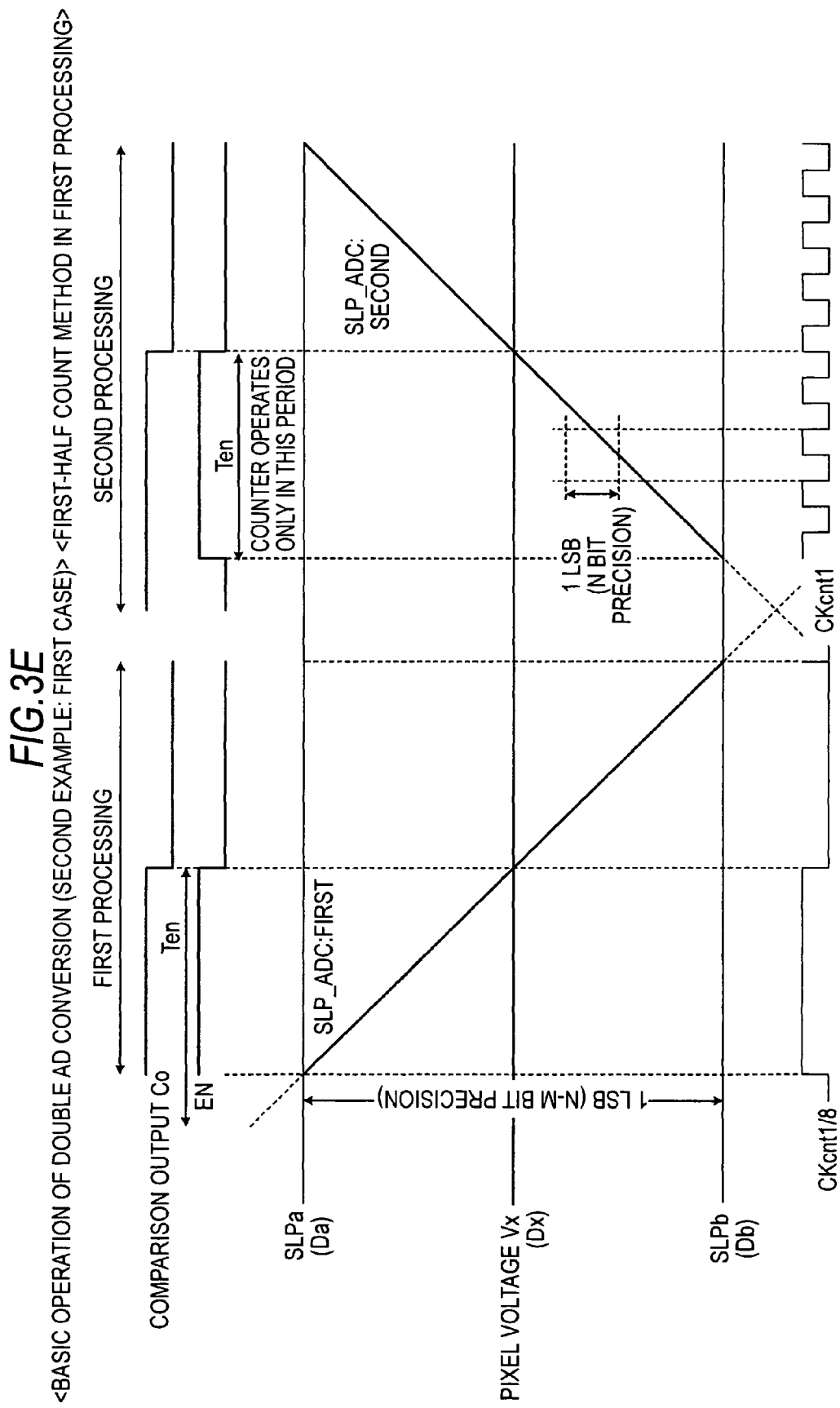

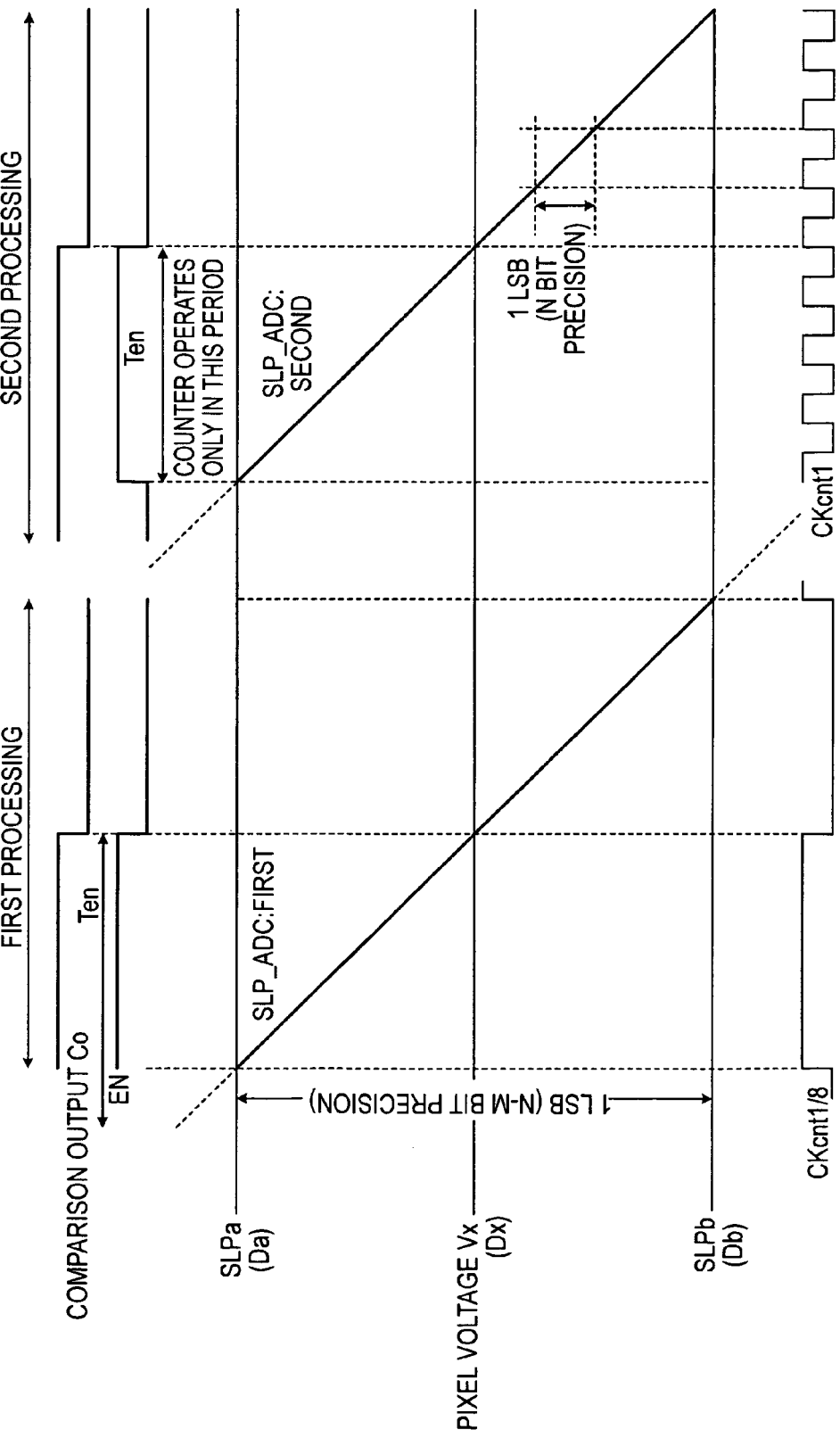

FIG. 3G (1)

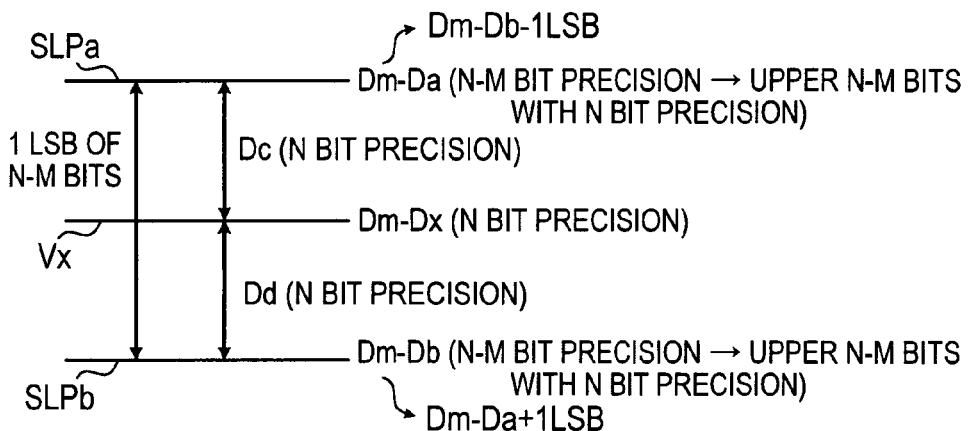

(2) SECOND-HALF COUNT METHOD IN FIRST PROCESSING

| DATA ACQUIRED WITH N-M BIT PRECISION IN FIRST PROCESSING | DATA ACQUIRED WITH N BIT PRECISION IN SECOND PROCESSING | OPERATION EXPRESSION FOR ACQUIRING Dm-Dx | COUNT OPERATION IN SECOND PROCESSING | | | |
|---|---|---|---|---|---|---|
| | | | REFERENCE SIGNAL: NEGATIVE DIRECTION | | REFERENCE SIGNAL: POSITIVE DIRECTION | |
| | | | STARTING POINT | STOP POINT | STARTING POINT | STOP POINT |
| Dm-Da | Dc | Dm-Da-Dc<br>=Dm-Da-(Dx-Da)<br>=Dm-Dx | SLPa<br>(Dm-Da) | Vx<br>(Dm-Dx) | Vx<br>(Dm-Dx) | SLPa<br>(Dm-Da) |
| Dm-Da | Dd | Dm-Da+Db<br>=Dm-Da+(Db-Dx)<br>=Dm-Dx+1LSB<br>→Dm-Dx IS ACQUIRED BY-CORRECTION OF 1 LSB | Vx<br>(Dm-Dx) | SLPb<br>(Dm-Db)<br>↓<br>Dm-Da<br>-1LSB | SLPb<br>(Dm-Db)<br>↓<br>Dm-Da<br>-1LSB | Vx<br>(Dm-Dx) |
| Dm-Db | Dd | Dm-Dd+Dd<br>=Dm-Db+(Db-Dx)<br>=Dm-Dx | Vx<br>(Dm-Dx) | SLPb<br>(Dm-Db) | SLPb<br>(Dm-Db) | Vx<br>(Dm-Dx) |
| Dm-Db | Dc | Dm-Db-Dc<br>=Dm-Db-(Dx-Da)<br>=Dm-Dx-1LSB<br>→Dm-Dx IS ACQUIRED BY+CORRECTION OF 1 LSB | SLPa<br>(Dm-Da)<br>↓<br>Dm-Db<br>+1LSB | Vx<br>(Dm-Dx) | SLPa<br>(Dm-Da)<br>↓<br>Dm-Db<br>+1LSB | Vx<br>(Dm-Dx) |

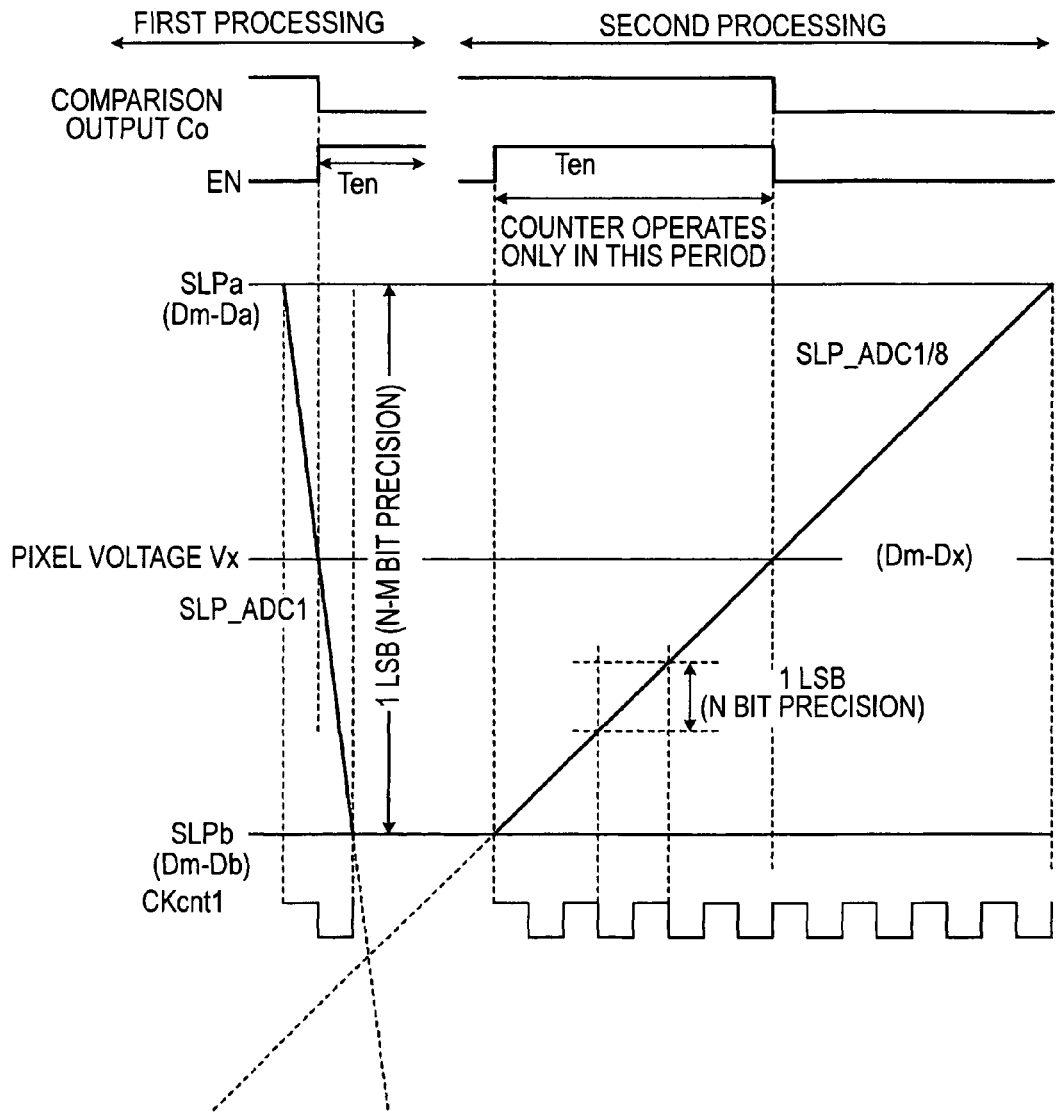

FIG.4B
(1) EXAMPLE OF USING ADDER
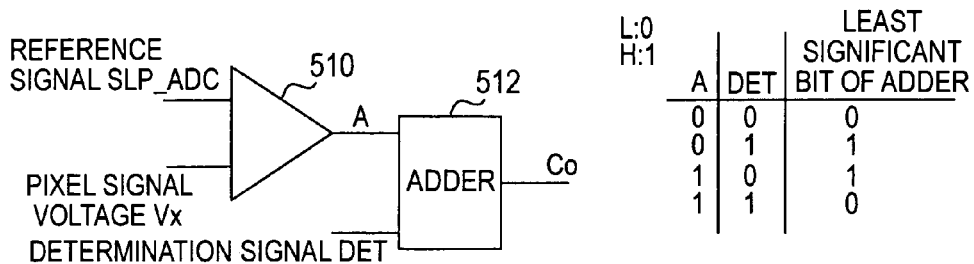
(2) EXAMPLE OF USING EX-OR
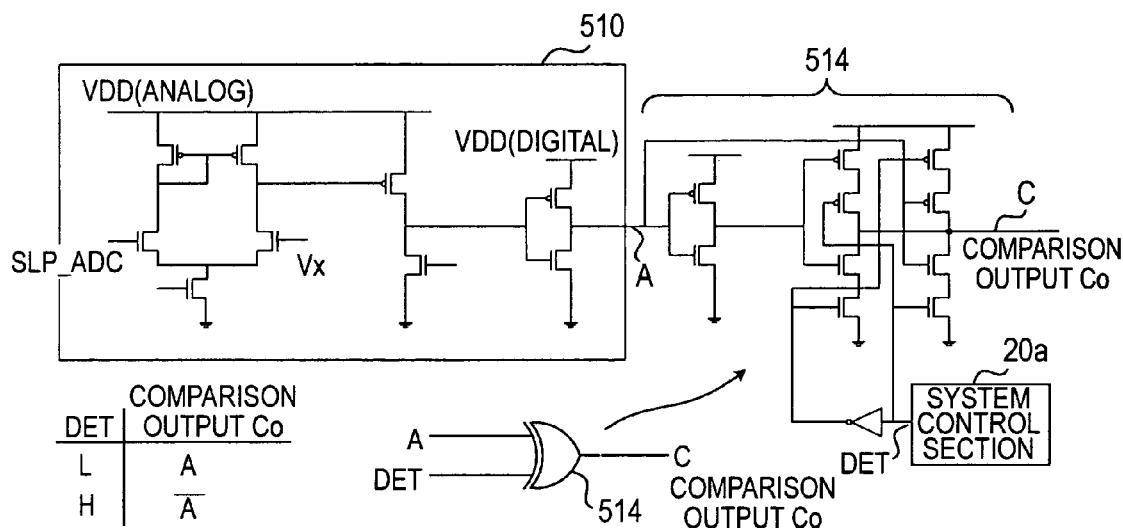
(3) EXAMPLE OF USING INVERTER AND SELECTOR
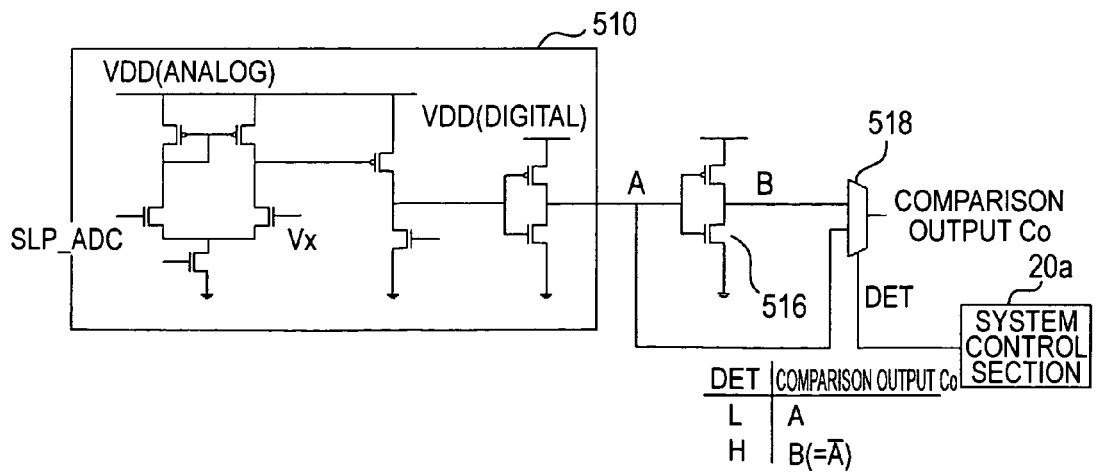

FIG.4C
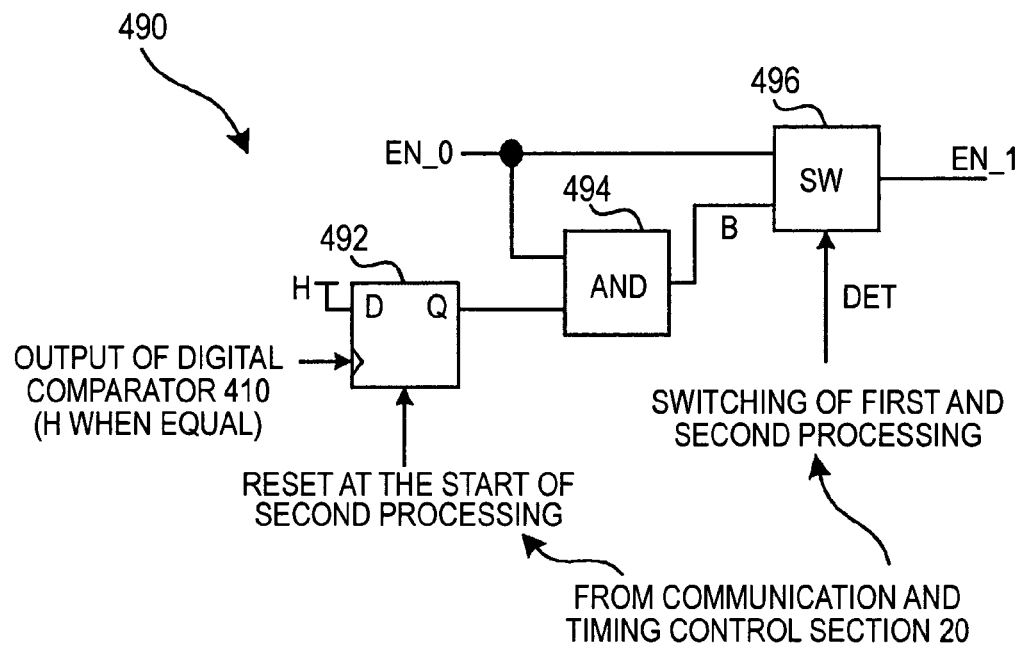
OUTPUT OF DIGITAL COMPARATOR 410 (H WHEN EQUAL)
RESET AT THE START OF SECOND PROCESSING
SWITCHING OF FIRST AND SECOND PROCESSING
FROM COMMUNICATION AND TIMING CONTROL SECTION 20
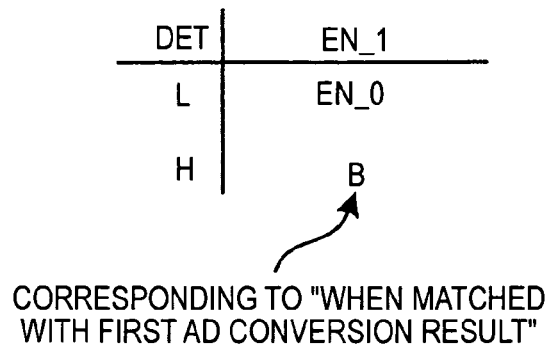
CORRESPONDING TO "WHEN MATCHED WITH FIRST AD CONVERSION RESULT"

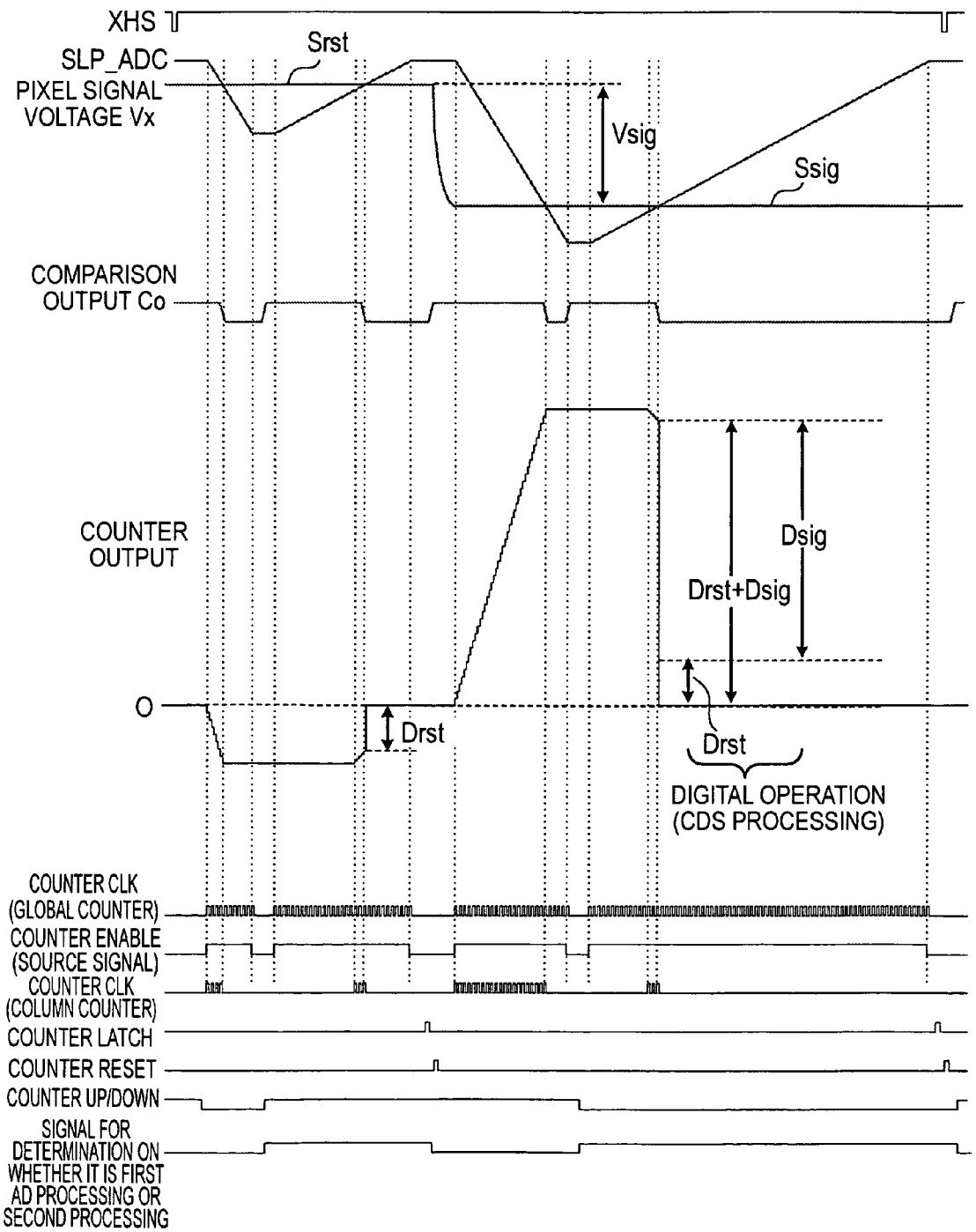

<SECOND EMBODIMENT>

<SECOND EMBODIMENT>

<SECOND EMBODIMENT>

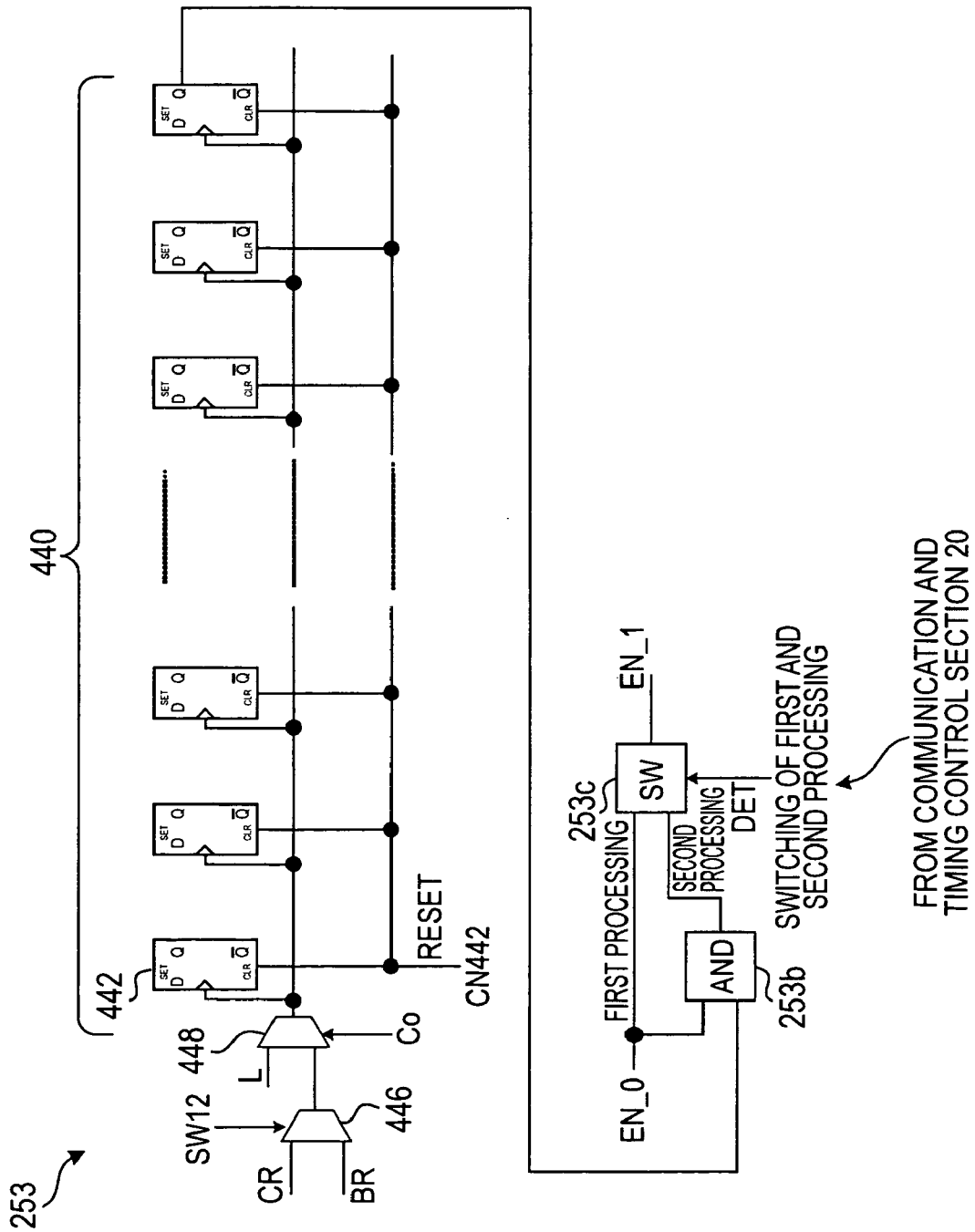

FIG.5F
(1) AT THE TIME OF D PHASE PROCESSING
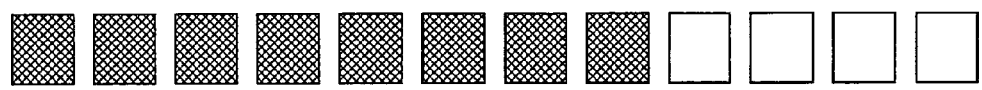
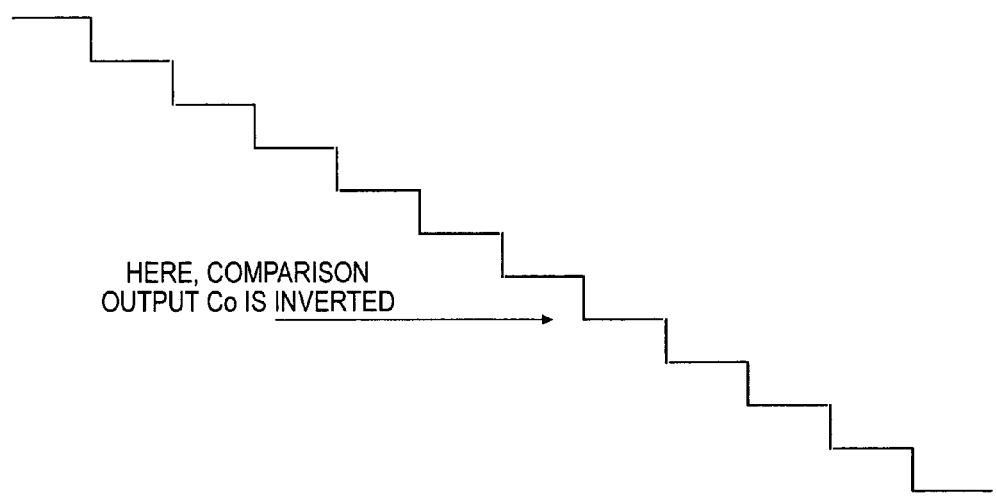
HERE, COMPARISON OUTPUT Co IS INVERTED
(2) AT THE TIME OF P PHASE PROCESSING
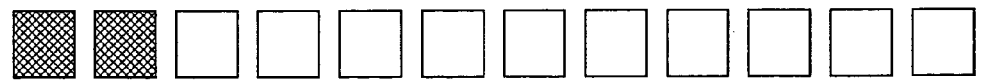
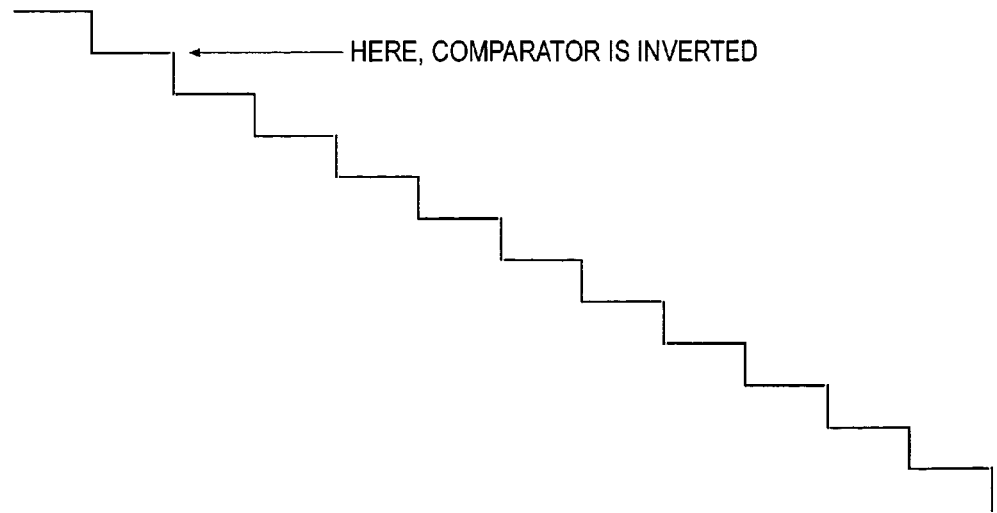
HERE, COMPARATOR IS INVERTED

<SECOND EMBODIMENT>

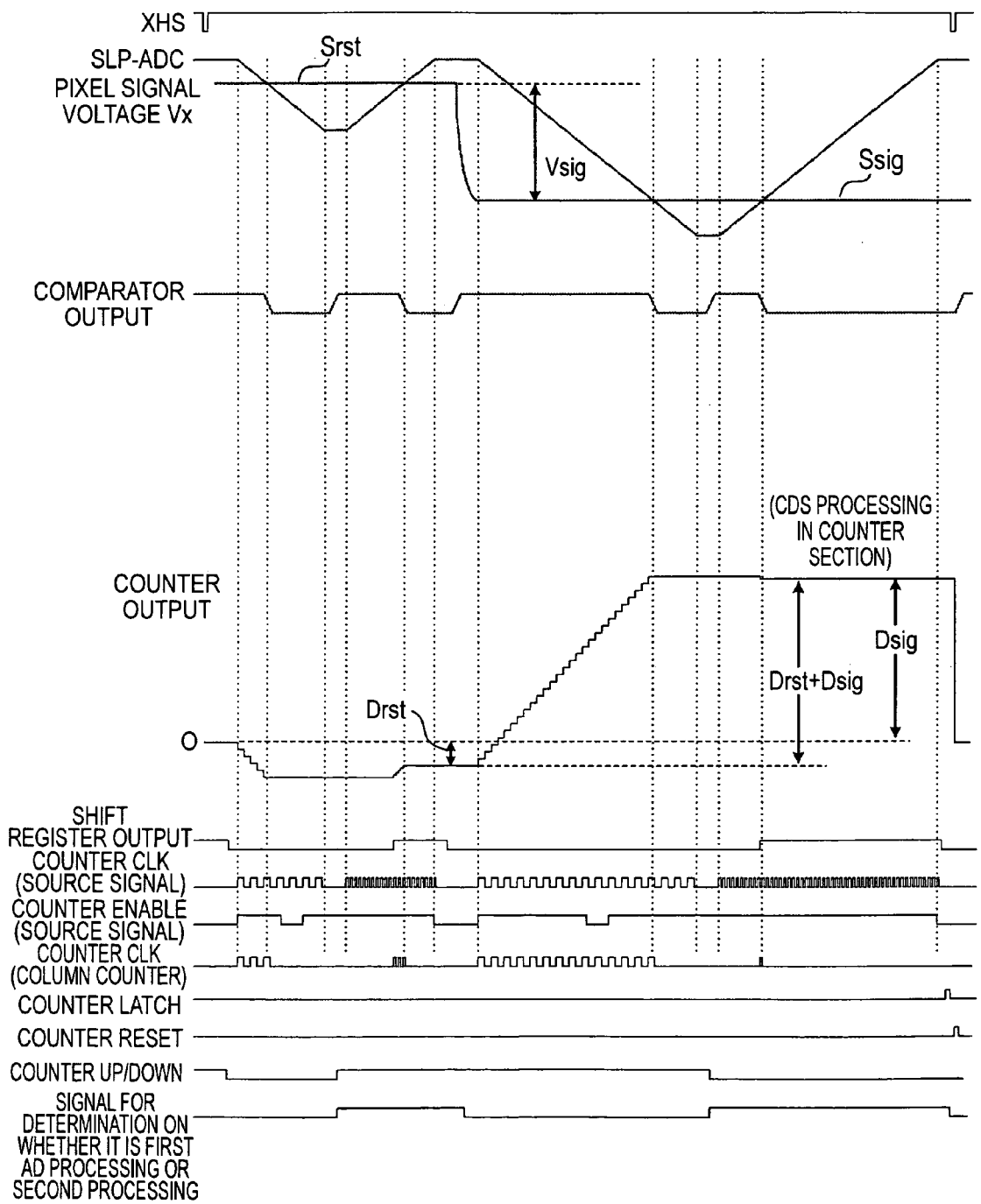

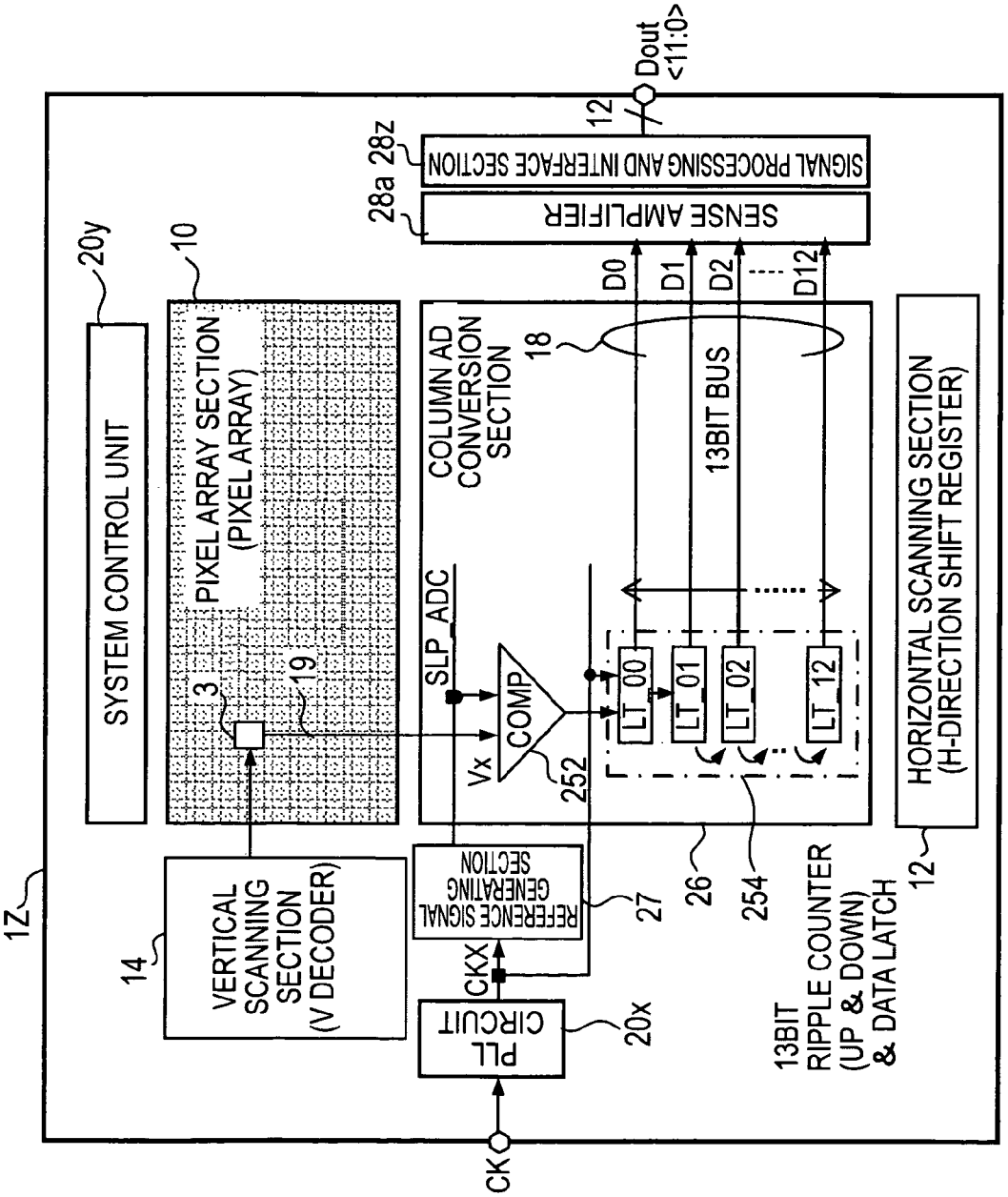

<STRUCTURE DISCLOSED IN JP-A-56-96527>

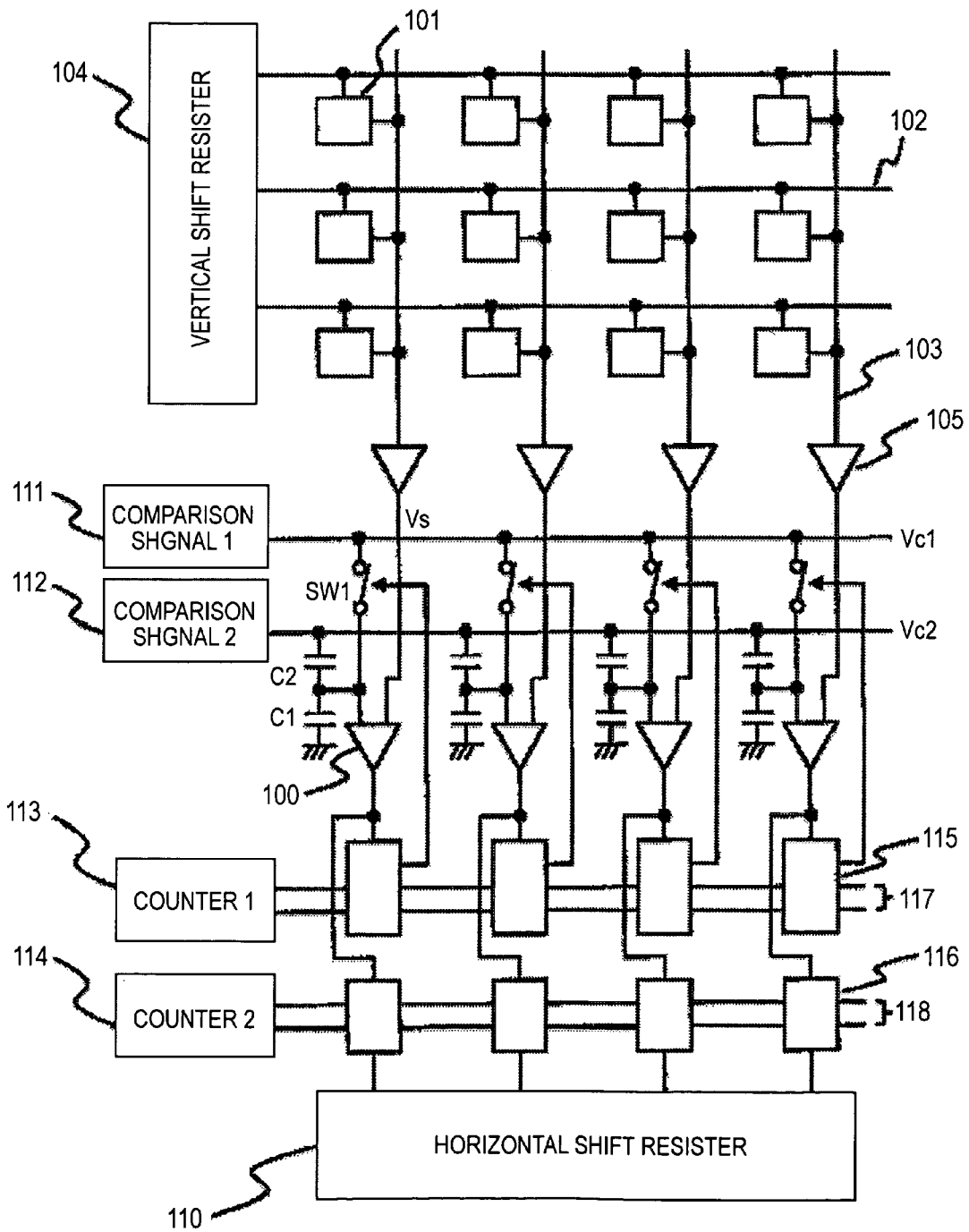

<STRUCTURE DISCLOSED IN JP-A-2002-232291>

SOLID STATE IMAGING DEVICE, IMAGING APPARATUS, ELECTRONIC APPARATUS, AD CONVERTER, AND AD CONVERSION METHOD

BACKGROUND OF THE INVENTION

1. Field of the Invention

The present invention relates to a solid state imaging device, an imaging apparatus, an electronic apparatus, an AD converter, and an AD conversion method.

2. Description of the Related Art

Semiconductor devices for detection of physical quantity distribution in which a plurality of unit elements (for example, pixels) sensitive to electromagnetic waves input from the outside, such as light or radiant rays, are arrayed linearly or in a matrix are used in various fields.

For example, in a field of visual equipment, CCD (Charge Coupled Device) type, MOS (Metal Oxide Semiconductor) type, or CMOS (Complementary Metal Oxide Semiconductor) type solid state imaging devices that detect light (an example of an electromagnetic wave) among the physical quantities are used. These solid state imaging devices read the physical quantity distribution, which has been converted into an electrical signal by unit elements (in a solid state imaging device, pixels), as an electrical signal.

For example, in an X-Y address type solid state imaging device, a plurality of pixel transistors are arrayed in a two-dimensional matrix in order to form a pixel section. In addition, accumulation of signal charges corresponding to incident light is started for every line (row) or every pixel and signals having a current or a voltage based on the accumulated signal charges are read sequentially from each pixel by address designation. Here, in the MOS type solid state imaging device (including the CMOS type solid state imaging device), a column read method (column parallel output method) of reading pixel signals in a row unit from a pixel section by accessing one row simultaneously is often used as an example of address control. The analog pixel signal read from the pixel section is converted into digital data, if necessary, by an analog digital converter (ADC). Accordingly, various methods for AD conversion have been proposed.

As an AD conversion method, various methods may be considered from points of view of circuit structure, processing speed (improvement in the speed), resolution, and the like. As an example, there is a reference signal comparing type AD conversion method (see JP-A-2005-328135). In addition, the reference signal comparing type is also called a slope integration type or a ramp signal comparing type. In the reference signal comparing type. AD conversion method, a so-called ramp shaped reference signal (ramp wave: a wave with predetermined amplitude and inclination; also called a staircase wave) whose level changes gradually is used for voltage comparison for conversion into digital data. Moreover, an analog unit signal and the reference signal are compared with each other, and digital data of the unit signal is acquired on the basis of the count value obtained by performing count processing in a count operation effective period based on the comparison processing result. Using a method (called a column AD method) in which the reference signal comparing type AD conversion method and the column read method are combined, an analog output from a pixel can be AD-converted in column parallel in a low frequency region. This is suitable for an image sensor in which high definition and high speed are requested to be compatible.

In recent years, CMOS sensors are widely mounted in mobile phones, digital cameras (compact type or high-class single-lens reflex type), camcorders, surveillance cameras, guiding apparatuses, and the like due to advantages of low power consumption or high speed. Moreover, high-performance and high-definition CMOS sensors in which functional circuit blocks for image processing and the like are provided together on a chip have also appeared in recent years. It may be considered to apply the reference signal comparing type AD conversion method to those described above.

FIG. 9A is a view showing the structure disclosed in JP-A-2005-328135. Here, the configuration example of a solid state imaging device 1Z to which the reference signal comparing type AD conversion method disclosed in JP-A-2005-328135 is applied is shown after simple change. The solid state imaging device 1Z includes a pixel array section 10, a horizontal scanning section 12, a vertical scanning section 14, a PLL circuit 20x, a system control unit 20y which controls the entire system, a column AD conversion section 26, a reference signal generating section 27 which generates a reference signal SLP_ADC, a sense amplifier 28a, and a signal processing and interface section 28z. In the pixel array section 10, unit pixels 3 are arrayed in a two-dimensional matrix. The PLL circuit 20x generates an internal clock CKX on the basis of a basic clock CK input from the outside and supplies the internal clock CKX to the reference signal generating section 27 or a counter section 254.

The column AD conversion section 26 has a comparing section 252 and a counter section 254 for every vertical column. As an example, the counter section 254 is a ripple counter, in which latches LT_00 to LT_12 provided in 13 stages are connected in series to each other, and has a 13-bit-correspondence configuration in which the latches are connected such that switching between an up count and a down count is possible.

Data D0 to D12 output from the counter section 254 has a small amplitude level (for example, several 100 mVp-p) and are transmitted to the sense amplifier 28a through the horizontal signal line 18. The sense amplifier 28a amplifies the data D0 TO D12 with a small amplitude level up to a logic level (for example, 2 to 3 Vp-p) and then transmits them to the signal processing and interface section 28z. The signal processing and interface section 28z performs predetermined digital signal processing on the 13-bit data D0 TO D12 and transmits them to a subsequent-stage circuit (not shown) as 12-bit output data Dout (D0 to D11).

The AD conversion operation is as follows. First, a pixel signal voltage Vx is read from the unit pixel 3 toward the column AD conversion section 26 through the vertical signal line 19. The comparing section 252 compares the pixel signal voltage Vx with the reference signal SLP_ADC from the reference signal generating section 27 and supplies the comparison result to the latch LT_00 provided in the first stage of the counter section 254. The internal clock CKX is also supplied from the PLL circuit 20x to the latch LT_00. For example, when the comparison result of the counter section 254 is H, the counter section 254 performs a count operation. AD conversion is realized by acquiring the count result as digital data of the pixel signal voltage Vx. That is, an AD converter is provided for every vertical column, the pixel signal voltage Vx (analog signal) of each unit pixel 3 in the selected row is collectively read to each vertical signal line 19, and each of a reset level and a signal level of the pixel signal voltage Vx is directly AD-converted.

In the technique disclosed in JP-A-2005-328135, differential processing of AD conversion results of the reset level and the signal level is also performed simultaneously during the AD conversion processing. This is to perform CDS (Correlated Double Sampling) processing in a digital region by performing the reference signal comparing type AD conversion processing for every vertical column. In this case, since a disadvantage when performing the CDS processing in an analog region is eliminated, highly precise noise removal can be executed. In the column AD method, parallel processing is performed for every row in the horizontal direction of a screen. Accordingly, it is not necessary to perform high-frequency driving for horizontal scanning and the AD conversion is performed only with a low-speed scanning frequency in the vertical direction. This is advantageous in that a noise component and a signal component generated in a high frequency region can be easily separated from each other.

FIG. 9B is a view showing the structure disclosed in JP-A-56-096527. In the technique disclosed in JP-A-56-096527, AD conversion is performed by setting the inclination of a reference signal high before the value reaches the neighborhood of the target value and the result is held, and the AD conversion is performed by changing the inclination to be low after reaching the target value. For such a change of the reference signal, a relatively large (understood as such from the drawing) reference voltage source and logic control circuit are necessary.

FIG. 9C is a view showing the structure disclosed in JP-A-2002-232291. In first processing, a pixel signal is applied to one input terminal of a comparator provided for each column and a staircase wave of a large voltage step is applied to the other input terminal by a reference voltage. The count value corresponding to the number of steps when a signal of the comparator is inverted is held in a latch circuit as an upper bit, and the reference voltage at that time is held in a capacitor. The capacitor is an example of a reference voltage holding means for holding a reference voltage when a comparison result of a comparing means changes. In second processing, a small voltage step is applied through another capacitor by the reference voltage, and the count value when a signal of the comparator is inverted is held again in a latch circuit for lower bits. That is, in the second processing, AD conversion is performed by changing the reference voltage in the shape of a staircase wave in a step corresponding to a lower data bit region with the value of the reference voltage held in the reference voltage holding means (capacitor) as a starting point. This is a method in which a change point of the inclination of the reference voltage is different for every pixel.

FIG. 9D is a view showing the structure disclosed in U.S. Pat. No. 6,670,904. Two kinds of reference signals are used, and a process of conversion from analog to digital is performed through two divided steps of "coarse" and "fine" in order to shorten the conversion cycle time from analog to digital. A configuration is adopted in which a reference signal for "coarse" is input to a comparator 306 through a switch 304 and a reference signal for "fine" is input to the comparator 306 through a capacitor 302. As a preferable mode, the reference signal for "coarse" is made to correspond to a most significant bit (MSB) and the reference signal for "fine" is made to correspond to a least significant bit (LSB). Moreover, in first processing, the switch 304 is turned on to perform comparison with an analog signal using only the reference signal for "coarse". When the comparator 306 detects that the reference signal and the analog signal have become equal, the switch 304 is turned off using the information and the counter value at this time is held. Then, second AD conversion processing is performed by superimposing the reference signal for "fine" on the value (held in the capacitor 302) of the reference signal for "coarse" at the time. Similar to the method disclosed in JP-A-2002-232291, this is a method in which a change point of the inclination of the reference voltage is different for every pixel.

SUMMARY OF THE INVENTION

In the known reference signal comparing type AD conversion methods starting from JP-A-2005-328135, however, an analog signal to be converted is compared with a reference signal with predetermined amplitude and inclination and count processing is performed in a count operation effective period based on the comparison result. Accordingly, the count operation period is influenced by the analog signal level. In this case, depending on the analog signal level, the number of counts may increase (that is, the count operation period may become long). As a result, a problem occurs in which the power consumption caused by the counter operation increases.

On the other hand, in the structures disclosed in JP-A-56-096527 and JP-A-2002-232291, the power consumption can be reduced with a small number of clocks by changing the inclination of a reference signal in first and second processing (large inclination in the first processing and small inclination in the second processing) and quantizing upper bits and lower bits separately.

However, the structures of AD conversion disclosed in JP-A-56-096527, JP-A-2002-232291, and U.S. Pat. No. 6,670,904 use a method in which a change point of the inclination of a reference voltage is different for every signal level. Accordingly, in the case of combination with a method (for example, a column AD method) of performing AD conversion in parallel on a plurality of signals to be processed, a configuration for changing the inclination of a reference voltage from the inclination for low-precision conversion (large inclination) to the inclination for high-precision conversion (small inclination) at the separate position, which corresponds to each signal level, for every signal to be processed is necessary. Since this is a method in which the change point of the inclination of a reference voltage is different for every signal to be processed, that is, a configuration in which a reference voltage source is necessary for every signal to be processed, it is thought that there is a problem in terms of circuit size or precision.

For example, in the case where the AD converter shown in FIG. 9B is provided in parallel for every column on an image sensor using the structure disclosed in JP-A-56-096527, a reference voltage source and a logic control circuit are necessary for every column. As a result, the circuit size becomes large.

In the structure disclosed in JP-A-2002-232291, two capacitors are used for every column. Since it is difficult to make the two capacitors small, it is not suitable for miniaturization. An output of the reference voltage source is referred to as it is at the time of AD conversion of upper bits, while a reference voltage based on the capacitance ratio is referred to at the time of AD conversion of lower bits. For this reason, there is a concern that the linearity may become worse in a boundary of upper and lower bits due to variation at the time of manufacture.

In the structure disclosed in U.S. Pat. No. 6,670,904, the capacitor 302 is used for a reference signal for "fine". Accordingly, the number of capacitors used for every column is smaller than that in the structure disclosed in JP-A-2002-232291. However, since it is difficult to make the capacitor small in the same manner as in the structure disclosed in JP-A-2002-232291, it is not suitable for miniaturization either. Moreover, due to the influence of electric charge injection resulting from an ON/OFF operation of the switch 304, there is a concern that the offset voltages of the comparator 306 changes with every column and appears as a vertical strip shaped noise. This is a method in which the value of a reference signal for "coarse" when the reference signal becomes equal to an analog signal in first processing is held in the capacitor 302 and a reference signal for "fine" is superimposed on the reference signal for "coarse". Accordingly, due to switch noise or random noise, the joint of "coarse" and "fine" may not be secured. In this case, since a level difference occurs, it is difficult to perform the AD conversion correctly.

Therefore, it is desirable to provide a new structure of AD conversion and devices and apparatuses using the structure of AD conversion, which are capable of reducing the power consumption caused by a counter operation while solving at least one of the problems occurring in the structures disclosed in JP-A-56-096527, JP-A-2002-232291, and U.S. Pat. No. 6,670,904.

In a structure of AD conversion according to an embodiment of the present invention, a comparing section compares a reference signal whose level changes gradually with an analog signal to be processed, a counter section receives a count clock for AD conversion and performs a count operation on the basis of the comparison, and digital data of the signal to be processed is acquired on the basis of output data of the counter section. That is, in the AD conversion section, reference signal comparing type AD conversion processing is performed.

In this case, for the same signal, AD conversion processing is performed twice in a state where the bit resolution is different. Hereinafter, this is simply called double AD conversion. The first AD conversion processing is performed with low resolution (N−M bit precision), and the second AD conversion processing is performed with high resolution (N bit precision). In this case, the reference signal is set to change in a full range of AD conversion in both the first and second processing. Moreover, in the first processing, the counter section is made to operate in a first-half period of the full range of AD conversion until the comparison result of the comparing section is inverted, or a second-half period of the full range of AD conversion after the comparison result of the comparing section is inverted. In the second processing, the counter section is made to operate in a period between a point of time when the reference signal reaches a level equivalent to a lower limit or upper limit of one LSB of N−M bit precision to which AD-converted data of the signal to be processed belongs and a point of time when the comparison result of the comparing section is inverted.

In this way, for a signal to be processed, data of upper N−M bits is acquired by performing AD conversion processing with N−M bit precision in the first processing and data of lower M bits is acquired by performing AD conversion processing with N bit precision for one LSB of N−M bit precision, which is difficult to resolve with N−M bit precision in the first processing, in second processing.

In the first and second processing, upper bits and lower bits are divided to be quantized. In both the first and second processing, the reference signal is changed in the full range of AD conversion. Both a method of changing the inclination of a reference signal and a method of changing the clock frequency of a counter section may be adopted as a mechanism of changing the bit resolution.

In order to suppress the count operation period of the counter section within a range of one LSB of N−M bit precision in a state where the reference signal is made to change in a full range of AD conversion, the operation period of the counter section in each processing is controlled on the basis of the comparison result of the comparing section in the embodiment of the present invention.

In such a structure, for the same signal to be processed, first AD conversion processing is performed with low bit resolution and AD conversion of high bit resolution is performed only for one LSB which is difficult to resolve with in the first processing. The change point of the inclination of the reference signal is not different for every signal level, but the reference signal changes in the full range both in the first and second processing. In the second processing, AD conversion is performed with N bit precision, and the count operation period is limited to one LSB of N−M bit precision in the first processing at the most.

Such an AD converter to which the AD conversion structure is applied may be applied to a solid state imaging device, for example. In addition, a solid state imaging device may be formed as a one chip type device or a module type device in which an imaging unit and a signal processing unit or an optical system are collectively packaged and which has an imaging function. The AD converter may be applied not only to the solid state imaging device but also to an imaging apparatus or all other electronic apparatuses. In this case, the same effect as in the AD converter or the solid state imaging device is obtained in the imaging apparatus or all other electronic apparatuses. Here, the imaging apparatus refers to a camera (or a camera system) or a portable apparatus having an imaging function, for example. In addition, the 'imaging' includes not only imaging of an image at the time of normal photographing of a camera but also detection of a fingerprint and the like as a broad sense of meaning.

According to the embodiment of the present invention, AD conversion of high resolution can be realized with low power consumption by shortening an operating time of a counter without decreasing the bit precision. Since the reference signal is changed in a full range in both the first and second processing, a problem when the method, in which the change point of the inclination of the reference voltage is different for every signal level, is adopted does not occur.

Since the reference signal is changed in a full range in both the first and second processing, there is no restriction in the mechanism of changing the bit resolution. Accordingly, both a method of changing the inclination of a reference signal and a method of changing the clock frequency of the counter section may be adopted. In addition, when a plurality of signals are AD-converted in parallel, the reference signal generating section which generates a reference signal may be provided in common. If the column AD conversion method is adopted, the power consumption caused by the counter operation can be reduced without decreasing the bit precision.

BRIEF DESCRIPTION OF THE DRAWINGS

FIG. 3A is a view illustrating the relationship of bit resolution, inclination of a reference signal, and a frequency of a count clock that a counter section uses;

FIG. 3B is a view showing the relationship of the data acquired in first processing by a first-half count method, the data acquired in second processing, an operation expression for acquiring the pixel data on the basis of both the data, and a count operation period in the second processing in the relationship with the change direction of a reference signal;

FIG. 3D is a view illustrating a basic operation (first example: second case) of the double AD conversion in the present embodiment;

FIG. 3E is a view illustrating a basic operation (second example: first case) of the double AD conversion in the present embodiment;

FIG. 3F is a view illustrating a basic operation (second example: second case) of the double AD conversion in the present embodiment;

FIG. 3G is a view showing the relationship of the data acquired in first processing by a second-half count method, the data acquired in second processing, an operation expression for acquiring the pixel data on the basis of both the data, and a count operation period in the second processing in the relationship with the change direction of a reference signal;

FIG. 3H is a view illustrating a basic operation (third example: first case) of the double AD conversion in the present embodiment;

FIG. 4B is a view showing an example of the configuration of a comparing section used in the first embodiment;

FIG. 4C is a view showing an example of the detailed configuration of a part of a count operation period control section used in the first embodiment;

FIG. 4E is a timing chart illustrating double AD conversion operations in the solid state imaging device according to the first embodiment;

FIG. 5D is a view showing an example of the configuration of a count operation period control section in the second embodiment;

FIG. 5F is a view illustrating an operation of the count operation period control section in the second embodiment;

FIG. 6 is a timing chart illustrating double AD conversion operations in a solid state imaging device according to a third embodiment;

FIG. 9A is a view showing the structure disclosed in JP-A-2005-328135;

FIG. 9C is a view showing the structure disclosed in JP-A-2002-232291; and

DESCRIPTION OF THE PREFERRED EMBODIMENTS

Figure 1:
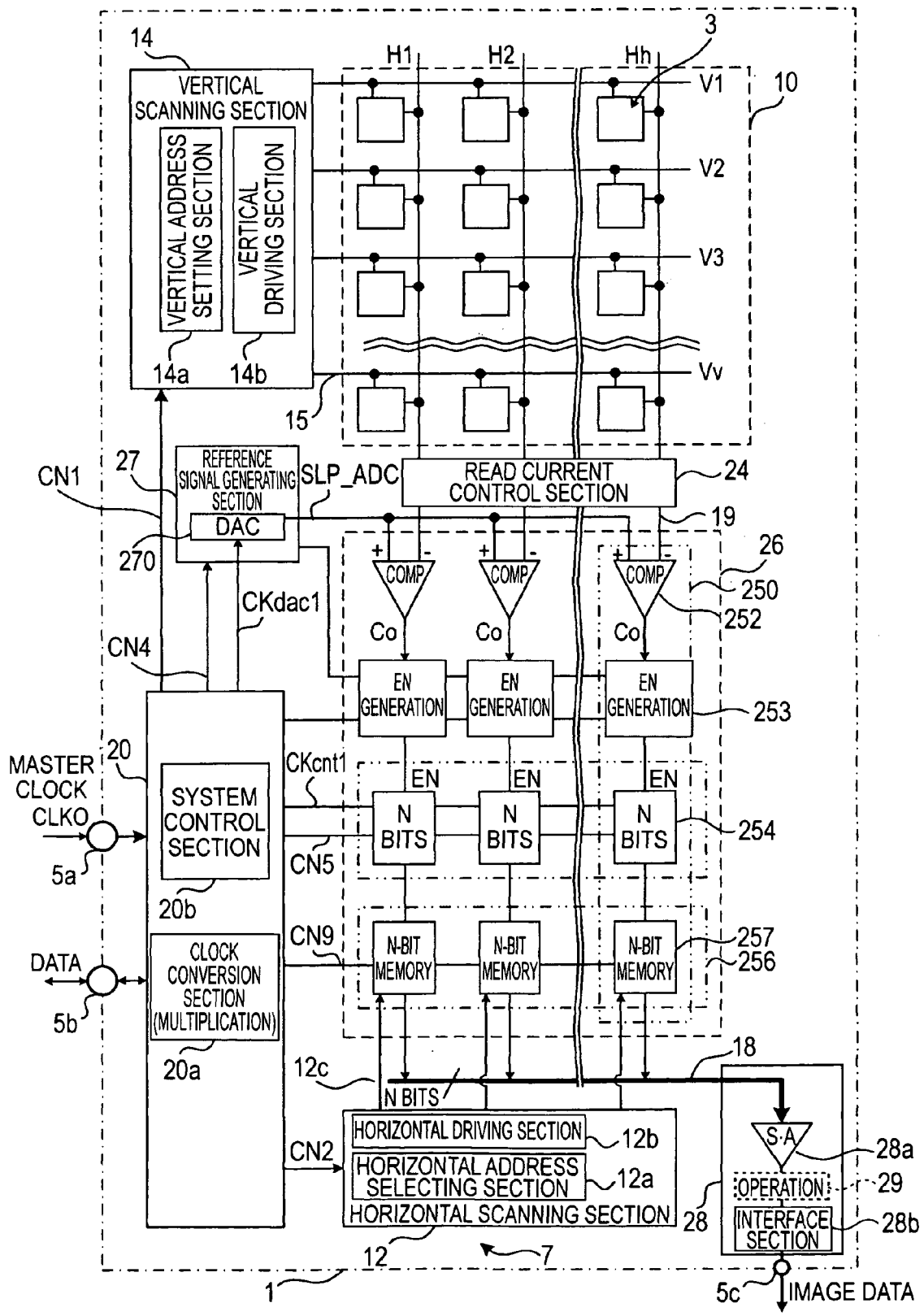
FIG. 1 is a view showing the basic configuration of a CMOS type solid state imaging device (CMOS image sensor) which is a solid state imaging device according to an embodiment of the present invention.

Hereinafter, embodiments of the present invention will be described in detail with reference to the accompanying drawings.

In addition, the explanation will be performed in following order.

1. Solid state imaging device: basic configuration
2. Reference signal generating section: basic configuration
3. Principle of double AD Conversion
4. First embodiment (example in which the inclination of a reference signal is set differently in each processing & example in which a digital comparator is used for determination of start of second processing)
5. Second embodiment (example in which the inclination of a reference signal is set differently in each processing & example in which a shift register is used for determination of start of second processing)
6. Third embodiment (example in which the count frequency is set differently in each processing)
7. Fourth embodiment (example of application to an imaging apparatus)
8. Fifth embodiment (example of application to an electronic apparatus)

In order to distinguish functional components according to embodiments, reference characters of capitals, such as A, B, C, . . . may be added. If it is not necessary to distinguish them from each other, the reference character is omitted. The same is applied to the drawings.

In addition, the case where a CMOS type solid state imaging device, which is an example of an X-Y address type solid state imaging device, is used as a device will be described below as an example. Unless there is a special notice, the CMOS type solid state imaging device will be described assuming that all unit pixels are formed of nMOS (n channel type MOS transistor) and a signal charge is a negative charge (electron). However, this is only an example, and the target device is not limited to the MOS type solid state imaging device. The unit pixel may be formed of pMOS (p channel type MOS transistor) and a signal charge may be a positive charge (hole):

All embodiments to be described below may be similarly applied to all kinds of semiconductor devices for detection of the physical quantity distribution detection in which a plurality of unit pixels sensitive to electromagnetic waves input from the outside, such as light or radiant rays, are arrayed linearly or in a matrix and which read a signal by address control.

<Solid State Imaging Device: Basic Configuration>

FIG. 1 is a view showing the basic configuration of a CMOS type solid state imaging device (CMOS image sensor) which is a solid state imaging device according to an embodiment of the present invention. The solid state imaging device is also an example of a semiconductor device. A solid state imaging device 1 includes a pixel array section 10 in which a plurality of unit pixels 3 are arrayed in a two-dimensional matrix. In the solid state imaging device 1, it is possible to make the pixel array section 10 prepared for color imaging by using a color separating filter in which color filters of R, G, and B are arrayed in a Bayer pattern, for example.

In FIG. 1, rows and columns are shown in a state where parts of the rows and columns are omitted, for the sake of simplicity. In practice, however, tens to thousands of unit pixels 3 are arrayed in each row or each column. The unit pixel 3 has an amplifier in a pixel which has three or four transistors, for example, a charge transfer transistor, a reset transistor, and an amplifying transistor, in addition to a photodiode as a light receiving element (charge generating section) that is an example of a detection section, which will be described later. From the unit pixel 3, a pixel signal voltage Vx is output through a vertical signal line 19 for every column.

In the pixel signal voltage Vx of the vertical signal line 19, a signal level Ssig appears after a reset level Srst including noise of a pixel signal as a reference level in a time-sequence manner. The signal level Ssig is a level obtained by adding a signal component Vsig to the reset level Srst, and the signal component Vsig can be obtained by Ssig (=Srst+Vsig)−Srst.

In addition, the solid state imaging device 1 includes a column AD conversion section 26 in which AD conversion sections 250, each of which has a CDS (Correlated Double Sampling) processing function or a digital conversion function, are provided in column parallel. The AD conversion section 250 has a comparing section 252 and a counter section 254 as main functional sections. "Column parallel" means that a plurality of CDS processing function sections, digital conversion sections (AD conversion sections), or the like are provided so as to be substantially parallel to the vertical signal line 19 (an example of a column signal line) of a vertical column. Such a read method is called a column read method.

In addition, the solid state imaging device 1 includes a driving control section 7, a read current control section 24 which supplies to the unit pixel 3 an operating current (read current) for pixel signal read, a reference signal generating section 27 which supplies to the column AD conversion section 26 a reference signal SLP_ADC for AD conversion, and an output section 28.

The driving control section 7 includes a horizontal scanning section 12 (column scanning circuit), a vertical scanning section 14 (row scanning circuit), and a communication and timing control section 20 for realizing a control circuit function for sequentially reading signals of the pixel array section 10.

The horizontal scanning section 12 has a horizontal address setting section 12*a*, a horizontal driving section 12*b*, or the like which controls a column address or column scanning and designates the column position of data to be read at the time of data transfer operation. The vertical scanning section 14 has a vertical address setting section 14*a*, a vertical driving section 14*b*, or the like which controls a row address or row scanning. The horizontal scanning section 12 and the vertical scanning section 14 start operations (scanning) of selecting a row and a column in response to control signals CN1 and CN2 supplied from the communication and timing control section 20.

The communication and timing control section 20 includes a functional block of a timing generator (an example of a read address control device) which supplies a clock, which is synchronized with a master clock CLK0 input through a terminal 5*a*, to each section (scanning sections 12 and 14 or the column AD conversion section 26) in the device. In addition, the communication and timing control section 20 includes a functional block of a communication interface that receives the master clock CLK0 supplied from an external main control section through the terminal 5*a* or receives data, which commands an operation mode or the like supplied from the external main control section through a terminal 5*b* and that outputs data including the information on the solid state imaging device 1 to the external main control section.

For example, the communication and timing control section 20 has a clock conversion section 20*a* which has a function of a clock converter that generates an internal clock, a system control section 20*b* which has a communication function or a function of controlling each section, and the like. The clock conversion section 20*a* has a multiplication circuit, which generates a pulse with a higher frequency than the master clock CLK0 on the basis of the master clock CLK0 input through the terminal 5*a*, and generates an internal clock, such as a count clock CKcnt1 or a count clock CKdac1.

The output section 28 has a sense amplifier 28*a* (S·A), which detects a signal (digital data with a small amplitude) on a horizontal signal line 18 that is a signal line for data transfer (transfer wiring line), and an interface section 28*b* (IF section) having a function for interface between the solid state imaging device 1 and the outside. An output of the interface section 28*b* is connected to an output end 5*c*, and the image data are output to a subsequent-stage circuit. In the output section 28, a digital operation section 29 which performs various kinds of digital processing may be provided between the sense amplifier 28*a* and the interface section 28*b* when necessary.

The unit pixel 3 is connected to the vertical scanning section 14 through a row control line 15 for row selection and connected to the AD conversion section 250, which is provided for every vertical column of the column AD conversion section 26, through the vertical signal line 19. Here, the row control line 15 indicates all wiring lines extending from the vertical scanning section 14 to pixels.

The vertical scanning section 14 selects a row of the pixel array section 10 and supplies a pulse necessary for the row. The vertical address setting section 14*a* selects not only a row through which a signal is read (read row; also called a selection row or a signal output row) but also a row for electronic shutter and the like.

[Details of a Column AD Circuit and a Reference Signal Generating Section]

As an AD conversion method in the AD conversion section 250, various methods may be considered from points of view of circuit structure, processing speed (improvement in the speed), resolution, and the like. As an example, an AD conversion method called a reference signal comparing type AD conversion method, a slope integration type AD conversion method, or a ramp signal comparing type AD conversion method is adopted. This method has a feature that the circuit size is not increased even if it is provided in parallel, since an AD converter can be realized with a simple configuration. In the reference signal comparing type AD conversion, a count operation effective period Ten (here, a count enable signal EN indicating the period) is determined on the basis of a time from the start of conversion (start of comparison processing) to the end of conversion (end of comparison processing), and a signal to be processed is converted into digital data on the basis of the clock number of the period.

When the reference signal comparing type AD conversion method is adopted, it may also be considered to provide the reference signal generating section 27 in column parallel (for every pixel column). For example, there is a case of adopting the configuration where a comparator and a reference signal generator are provided in each pixel column and the value of a reference signal is sequentially changed on the basis of a comparison result of the comparator in its own column by the reference signal generator of the corresponding column. In this case, however, the circuit size or the power consumption increases. Therefore, in the present embodiment, a configuration is adopted in which the reference signal generating section 27 is used in common in all columns and the reference signal SLP_ADC generated by the reference signal generating section 27 is used in common by the AD conversion section 250 of each pixel column.

Accordingly, the reference signal generating section 27 has a DA converter 270 (DAC; Digital Analog Converter) and generates the reference signal SLP_ADC with inclination (rate of change), which is indicated by control data CN4 from the communication and timing control section 20, from the initial value indicated by the control data CN4 in synchronization with the count clock CKdac1. The count clock CKdac1 may be the same as the count clock CKcnt1 for the counter section 254. It is preferable that the reference signal SLP_ADC has a waveform which has a predetermined inclination on the whole and changes linearly. The reference signal SLP_ADC may change in a smooth slope shape or may change sequentially in a stepwise manner.

In the reference signal comparing type AD conversion, the count operation effective period Ten (signal indicating the period is called the count enable signal EN) is determined on the basis of a comparison result of the reference signal SLP_ADC and the pixel signal voltage Vx using the comparing section 252, and the analog signal to be processed is converted into digital data on the basis of the clock number of the count clock CKcnt1 in a period where the count enable signal EN is active.

Processing regarding the reference level (reset level Srst) is called processing of a precharge phase (may be abbreviated to a P phase), and processing regarding the signal level Ssig is called processing of a data phase (may be abbreviated to a D phase). In the case where the D phase processing is performed after the P phase processing, the D phase processing is processing on the signal level Ssig obtained by adding the signal component Vsig to the reset level Srst.

Regarding the count operation effective period Ten, when the AD conversion section 250 performs differential processing between the P phase level and the D phase level, it is possible to adopt as a general example a first processing example in which in both the P phase processing and the D phase processing, a point of time of the start of change of the reference signal SLP_ADC is set for the count start and a point of time at which the reference signal SLP_ADC and a signal voltage to be processed become equal (in fact, a point of time at which the reference signal SLP_ADC and the signal voltage to be processed cross each other: the same hereinbelow) is set for the count end. This is a method (also called a first-half count method) of performing counting in the first half with respect to a change point of a comparison output Co in any AD conversion processing of P and D phases.

In this case, in count processing of P and D phases for acquiring digital data Dsig of the signal component Vsig of one pixel, it is efficient to make the counter operate so as to be switched between a down-count operation and an up-count operation because CDS processing can also be realized simultaneously. That is, assuming that digital data of the signal level Ssig obtained by P phase processing is Drst and digital data of the signal component Vsig is Dsig, the digital data obtained by D phase processing becomes Drst+Dsig. Here, if the count mode is changed according to the P or D phase, an operation result of Drst+Dsig−Drst=Dsig (or the negative value) is automatically acquired after D phase processing. The differential processing of P and D phases may also be said to be a method realized by changing the count mode while keeping the count operation effective period Ten equal (first-half count method).

Moreover, as a modification of the first processing example, it is possible to adopt a method (also called a second-half count method) of performing counting in the second half with respect to the change point of the comparison output Co in any AD conversion processing of P and D phases. Also in this case, the differential processing of P and D phases may be said to be a method realized by changing the count mode while keeping the count operation effective period Ten equal (second-half count method).

Alternatively, when the AD conversion section 250 performs differential processing between the P phase level and the D phase level, it is possible to adopt a second processing example in which a point of time of the start of change of the reference signal SLP_ADC is set for the count start and a point of time at which the reference signal SLP_ADC and the signal voltage to be processed become equal is set for the count end in one of the P phase processing and the D phase processing, and a point of time at which the reference signal SLP_ADC and the signal voltage to be processed become equal is set for the count start and a point of time of reaching the desired number of counts of the event (typically, a point of time of reaching the maximum AD conversion period) is set for the count end in the other processing. Counting is performed in the first half with respect to the change point of the comparison output Co in one AD conversion processing of a P or D phase, and counting is performed in the second half with respect to the change point of the comparison output Co in the other AD conversion processing of a P or D phase. That is, this is a method (called a first-half and second-half count method) of dividing the count operation effective period Ten into first and second halves by P and D phases.

A thought related to the second-half count is to use that assuming that the digital data of a full range is Dm and the digital data of the pixel signal voltage Vx is Dx, the data obtained in the second-half count is Dm−Dx (that is, a complement of Dx). This feature and a feature (real number) of the data obtained in the first-half count are used in the first-half and second-half count method. In this case, in the count processing of P and D phases, the counter preferably operates in a mode of only one of the down-count operation and the up-count operation. Also in this case, the CDS processing can be realized simultaneously.

That is, assuming that the initial value at the time of P phase processing is Dini, the digital data obtained in the P phase processing become Dini±Drst, and the digital data obtained in the subsequent D phase processing becomes {(Dini±Drst)±(Dm−(Dsig+Drst))}. "±" depends on the count mode, "+" is set in the up mode and "−" is set in the down mode. Here, in the up mode, −Dsig is automatically acquired after D phase processing by setting Dini=−Dm. In the down mode, Dsig is automatically acquired after D phase processing by setting Dini=Dm. The differential processing of P and D phases may also be said to be a method realized by changing the count operation effective period Ten while keeping the count mode equal.

Moreover, it may be considered to perform the differential processing between the P phase level and the D phase level in a subsequent stage (for example, the digital operation section 29) of the AD conversion section 250 in a state where a P phase processing result and a D phase processing result are stored separately. That is, the P phase data and the D phase data are separately transmitted toward the output section 28, and the digital operation section 29 performs the CDS processing. In this case, it is possible to adopt a third processing example in which in both the P phase processing and the D phase processing, a point of time of the start of change of the reference signal SLP_ADC is set for the count start and a point of time at which the reference signal SLP_ADC and a signal voltage to be processed become equal is set for the count end, or the point of time at which the reference signal SLP_ADC and the signal voltage to be processed become equal is set for the count start and a point of time of reaching the desired number of counts of the event (typically, a point of time of reaching the maximum AD conversion period) is set for the count end. In this case, in the count processing of P and D phases, the counter preferably operates in a mode of only one of the down-count operation and the up-count operation.

While the three processing examples have been described herein, various kinds of reference signal comparing type AD conversion methods in addition to the three processing examples are proposed, and basically, these methods may also be adopted in each embodiment to be described later.

In all of the processing examples, the AD conversion is performed, in principle, by supplying the reference signal SLP_ADC to a comparator (voltage comparator) and then comparing the analog pixel signal input through the vertical signal line 19 with the reference signal SLP_ADC and counting the clock number in the designated count operation effective period Ten by starting the counting in a clock signal when the count operation effective period Ten starts.

In order to perform the reference signal comparing type AD conversion described above, the AD conversion section 250 in the present embodiment includes the comparing section 252 (COMP), a count operation period control section 253 (EN generation), and the counter section 254. Preferably, the counter section 254 is made to be switchable between an up-count mode and a down-count mode. In this example, a data storage section 256 having a latch 257 (memory) for horizontal transfer is further provided after the counter section 254.

The comparing section 252 compares the reference signal SLP_ADC generated in the reference signal generating section 27 with the analog pixel signal voltage Vx obtained from the unit pixel 3 of the selection row through the vertical signal line 19 (H1, H2, ..., Hh). The comparing section 252 inverts the comparison output Co (comparator output) when the reference signal SLP_ADC and the pixel signal voltage Vx become equal.

The count operation period control section 253 controls the operation period of the counter section 254 of the AD conversion section 250 such that for the pixel signal voltage Vx which is a signal to be processed, data of upper N−M bits is acquired by performing AD conversion processing with N−M bit precision in first processing and data of lower M bits are acquired by performing AD conversion processing with N bit precision in second processing. The count operation period control section 253 controls the count operation period of the counter section 254 by supplying the count enable signal EN to the counter section 254.

The count operation period control section 253 generates the count enable signal EN, which specifies the next count operation effective period Ten (will be processed from here) that has predetermined relationship with the comparison output Co of the comparing section 252, referring to the comparison output Co from the comparing section 252 in both the first and second processing and also referring to, in the second processing, the level (for example, the count value of the DA converter 270 at that time) of the reference signal SLP_ADC at a point of time of change of the comparison output Co in the first processing. For the second processing, the count operation period control section 253 has a structure (function of one LSB level information acquisition section) of holding the information which specifies the level (for example, the count value of the DA converter 270 at that time) of the reference signal SLP_ADC at a point of time of change of the comparison output Co in the first processing.

In order to realize those described above, predetermined information is supplied from the reference signal generating section 27 to the count operation period control section 253. As the "predetermined information", information suitable for a configuration of the DA converter 270 or a specific configuration of the count operation period control section 253 corresponding thereto is used. The specific examples will be described in first to third embodiments. In order to determine the order of processing, a control signal is supplied from the communication and timing control section 20 to the count operation period control section 253.

The counter section 254 counts an active period of the count enable signal EN from the count operation period control section 253 using the count clock CKcnt1 and holds the count result.

In such a configuration, the AD conversion section 250 performs a count operation in a predetermined pixel signal read period and outputs the count result at a predetermined timing. That is, the comparing section 252 first compares the reference signal SLP_ADC from the reference signal generating section 27 with the pixel signal voltage Vx input through the vertical signal line 19. When both voltages become equal, the comparison output Co of the comparing section 252 is inverted. For example, the comparison output Co of the comparing section 252 changes to an L level (active state) when the pixel signal voltage Vx and the reference signal SLP_ADC become equal by changing an H level, such as a power supply potential, to an inactive state.

The AD conversion section 250 in the present embodiment performs AD conversion a plural number of times with different resolution (bit resolution) for the same signal to be processed. That is, the AD conversion is performed with low resolution (coarse bit resolution) in the first processing (coarse AD conversion), and the AD conversion is performed with high resolution (high-precision bit resolution) in the second processing (fine AD conversion) for one LSB which is difficult to resolve with the coarse bit resolution in the first processing. This will be described in detail later. This control is realized by generating the count enable signal EN using the count operation period control section 253.

In the present embodiment, the count operation period control section 253 holds the information indicating the level of the reference signal SLP_ADC when the comparison output Co of the comparing section 252 is inverted in first AD conversion processing and controls the counter operation period, in which the second AD conversion is performed, using the information such that the counter section 254 operates only in the neighborhood (specifically, one LSB of low resolution at the most). The power consumption is suppressed by restricting the count operation period of the counter section 254 at the time of the second AD conversion to the period in which one LSB of low resolution is counted with N bit precision at the most.

For the bit resolution change in this case, basically, it is possible to adopt either a method of changing the inclination of the reference signal SLP_ADC or a method of changing the frequency of the count clock CKcnt1. Undoubtedly, a method based on the combination of such methods may also be adopted. This will be described in detail later.

When performing AD conversion of N bits, AD conversion is coarsely performed in N−M bits in the first processing, and only about one LSB of N−M bit precision in the neighborhood where the comparison output Co (comparator output) of the comparing section 252 is inverted is AD-converted with high precision of N bits in the second processing. In the first processing, AD conversion of upper "N−M" bits is performed and excessive and deficient portions (one LSB of N−M bit precision at the most) of data in the relationship with N bit precision at that time is AD-converted with N bit precision, thereby specifying the data of remaining lower M bits.

In the reference signal comparing type AD conversion method, a larger amount of electric power is consumed in a count operation on the lower bit side. Accordingly, the entire power consumption can be reduced by performing control such that a count operation period of the second processing, in which the AD conversion is performed with N bit precision, becomes short. Since lower excessive and deficient portions which are difficult to resolve (AD conversion) with N−M bit precision in the first processing are modified by AD conversion in the second processing with high precision of N bit precision, the bit precision of the entire AD conversion can be maintained as N bit precision. Accordingly, the power consumption can be reduced without decreasing the bit resolution.

A control signal CN5 which designates the other control information, such as reset processing or setting of the initial value Dini in the P phase count processing or whether the counter section 254 operates the count processing of P and D phases in the up-count mode or down-count mode, is input from the communication and timing control section 20 to the counter section 254 of each AD conversion section 250.

The reference signal SLP_ADC generated by the reference signal generating section 27 is input in common to one input terminal (+) of the comparing section 252 and input terminals (+) of the other comparing sections 252, and the vertical signal line 19 of the corresponding vertical column is connected to the other input terminal (−) of the comparing section 252 so that the pixel signal voltage Vx from the pixel array section 10 is input separately.

The count clock CKcnt1 from the communication and timing control section 20 is input in common to a clock terminal CK of the counter section 254 and clock terminals CK of the other counter sections 254. When the data storage section 256 is not provided, a control pulse is input from the horizontal scanning section 12 to the counter section 254 through a control line 12c. The counter section 254 has a latch function of holding a count result and accordingly, holds the counter output value until there is an instruction using a control pulse through the control line 12c. In addition, regarding the data notified to the output section 28, either a method of setting the data to the count value immediately before the step change of the reference signal SLP_ADC or a method of setting the data to the count value immediately after the step change of the reference signal SLP_ADC may be adopted. According to which method is adopted, there is a difference of one LSB in data. As a whole, however, the data is output after being shifted by only one LSB. This may be thought as criteria of a quantizing error. Taking into consideration that the data is decided after the comparison output Co is inverted, it is thought that the circuit configuration in the latter one is compact.

The P phase data of the reset level Srst and the D phase data of the signal level Ssig may be separately transmitted toward the output section 28, and the CDS processing may be performed by the digital operation section provided after the AD conversion section 250. Various kinds of reference signal comparing type AD conversion methods of performing the AD conversion and the CDS processing by the AD conversion section 250 are proposed, and basically, other these methods may also be adopted in each embodiment.

Components of the driving control section 7, such as the horizontal scanning section 12, the vertical scanning section 14, and the like, are formed integrally with the pixel array section 10 in a semiconductor region, such as single crystal silicon, using the same technique as a technique of manufacturing a semiconductor integrated circuit. That is, they are formed in so-called one chip (provided on the same semiconductor substrate). Thus, the solid state imaging device 1 according to the present embodiment is formed.

The solid state imaging device 1 may be formed as one chip in which respective sections are integrally formed in a semiconductor region as described above. However, although not shown, the solid state imaging device 1 may also be formed in the shape of a module which has an imaging function and in which not only various signal processing sections, such as the pixel array section 10, the driving control section 7, and the column AD conversion section 26, but also an optical system, such as an imaging lens, an optical low pass filter, and an infrared cut-off filter, are included.

The output side of each AD conversion section 250, for example, an output of the counter section 254 may be connected to the horizontal signal line 18. Alternatively, as shown in the drawing, a configuration may be adopted in which the data storage section 256 as a memory device having a latch, which holds a count result that the counter section 254 holds, is provided after the counter section 254. The data storage section 256 holds and stores the count data output from the counter section 254 at a predetermined timing.

The horizontal scanning section 12 has a function of a read scanning section, which reads the count value that each data storage section 256 holds in parallel with execution of corresponding processing of each comparing section 252 and each counter section 254 of the column AD conversion section 26. The output of the data storage section 256 is connected to the horizontal signal line 18. The horizontal signal line 18 is a signal line with a bit width of the AD conversion section 250 or a width corresponding to twice the bit width (for example, at the time of complementary output) and is connected to the output section 28 which has the sense amplifier 28a corresponding to each output line. The number of horizontal transfer channels of the horizontal signal line 18 is not limited to one. Using a plurality of channels, data transfer may be performed for groups each of which includes a plurality of columns. In addition, each of the counter section 254, the data storage section 256, and the horizontal signal line 18 has a configuration corresponding to N bits.

<Reference Signal Generating Section: Basic Configuration>

Figure 2:
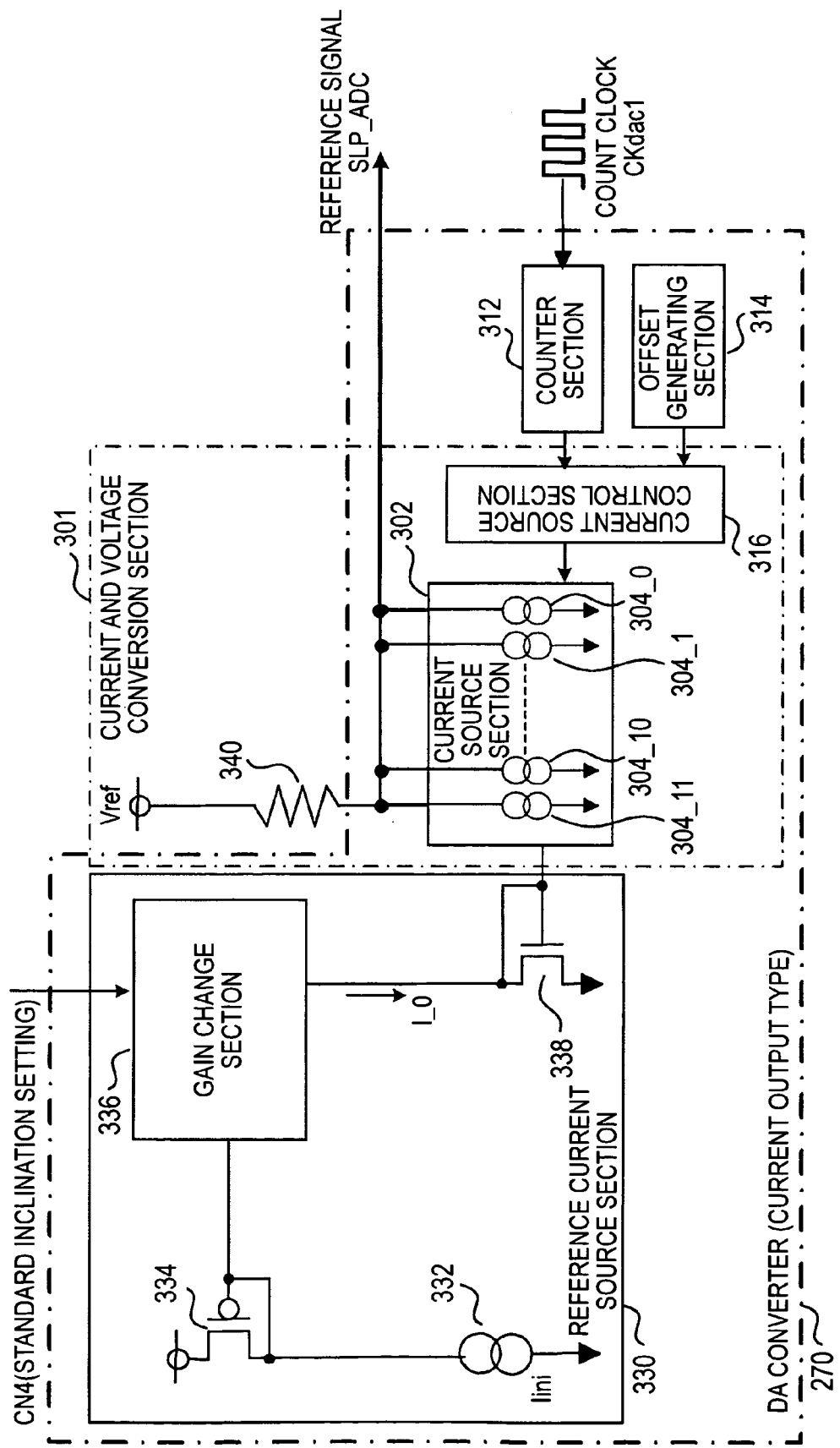
FIG. 2 is a view showing an example of the configuration of a DA conversion section of a reference signal generating section.

FIG. 2 is a view showing an example of the configuration of the DA converter 270 of the reference signal generating section 27. The DA converter 270 includes a current source section 302 formed by combination of constant current sources, a counter section 312, an offset generating section 314, a current source control section 316, and a reference current source section 330 which sets a reference current value I_0, and serves as a current output type D/A conversion circuit. To a current output end of the current source section 302, a resistor 340 with a resistance R_340 is connected as an element for current and voltage conversion. The current source section 302, the current source control section 316, and the resistor 340 form a current and voltage conversion section 301, and the voltage generated at a connection point between the current source section 302 and the resistor 340 is used as the reference signal SLP_ADC.

The current source section 302 has a constant current source 304 which outputs a predetermined defined current value. The current value of each constant current source 304 of the current source section 302 may be set in various ways, or the constant current sources 304 of the current source section 302 may be arrayed and controlled in various ways. Here, for easy understanding, it is assumed that the constant current source 304 has the constant current sources 304 as many as bits and each constant current source 304 outputs a current having a weight of bits with respect to the reference current value I_0 set by the reference current source section 330, as an example.

For example, in the case of 12 bits, assuming that "^" indicates power, a constant current source 304_0 of a 0-th bit outputs 2^0×I_0, a constant current source 304_1 of a first bit outputs 2^1×I_0, . . . , a constant current source 304_10 of a tenth bit outputs 2^10×I_0, and a constant current source 304_11 of an eleventh bit outputs 2^11×I_0. Current output ends of the constant current sources 304 are connected in common and are also connected to reference power Vref equivalent to an initial potential SLP_ini of the reference signal SLP_ADC through the resistor 340. Although the reference power Vref is set on the basis of the information indicating the initial value of the reference signal SLP_ADC for every comparison processing included in the control data CN4, any kind of circuit configuration for setting the reference power Vref may be used.

The reference current source section 330 includes a constant current source 332 which has one end connected to a negative power supply or ground and generates an initial current Iini, a Pch type transistor 334 which is a load of the constant current source 332, a gain change section 336, and an Nch type transistor 338 which applies a current output from the gain change section 336 to each constant current source 304 of the current source section 302. A source of the transistor 334 is connected to a positive power supply and a drain and a gate thereof are connected in common to an output end of the constant current source 332, and current mirror connection between the transistor 334 and a transistor (not shown) of the gain change section 336 is made.

Although not shown in detail, the gain change section 336 supplies to the transistor 338 the reference current value I_0 obtained by multiplying a mirror current from the transistor 334 by a predetermined number. A source of the transistor 338 is connected to a negative power supply or ground and a drain and a gate thereof are connected in common to an output end, of the gain change section 336, and current mirror connection between the transistor 338 and each constant current source 304 of the current source section 302 is made.

The gain change section 336 sets a voltage change ΔSLPdac (=I_0×R_340) per clock on the basis of the information indicating the inclination of the reference signal SLP_ADC for every comparison processing included in the control data CN4 and changes one count value for every count clock CKdac1. In practice, it is sufficient only to set the maximum voltage width for the maximum number of counts (for example, 1024 in the case of 10 bits) of the count clock CKdac1. By changing the gain for the amount of initial current Iini of the constant current source 332 of the reference current source section 330, ΔSLPdac per clock is adjusted and as a result, the inclination (rate of change) of the reference signal SLP_ADC is adjusted.

The counter section 312 performs the count operation on the basis of the count clock CKdac1 from the communication and timing control section 20 and supplies the count result to the current source control section 316. The offset generating section 314 applies a constant potential (offset amount) to the reference signal SLP_ADC separately from the change based on the count value of the counter section 312 and supplies the information to the current source control section 316. The current source control section 316 determines whether to turn on or off the constant current source 304 on the basis of the count value of the counter section 312 and the information on the offset amount from the current source control section 316, and turns on or off the constant current source 304 on the basis of the determination result.

For easy understanding, it is assumed that the offset amount is zero unless there is a special notice. Accordingly, whenever the count value of the counter section 312 progresses, the DA converter 270 changes a voltage, by ΔSLPdac for every one count clock CKdac1, from a voltage indicating the initial value included in the control data CN4. In the case of an up-count operation, a negative inclination occurs since the voltage is decreased by ΔSLPdac. In the case of a down-count operation, a positive inclination occurs since the voltage is increased by ΔSLPdac.

In this configuration example, the inclination of the reference signal SLP_ADC can be changed by changing any of the defined current I_0 of the DA converter 270, the resistance of the resistor 340 for current and voltage conversion, and the count clock CKdac1 used by the counter section 312 which forms the DA converter 270. On the contrary, even when any of them is changed, the inclination can be made uniform by performing correction on other components in the opposite direction.

For example, in order to change the inclination of the reference signal SLP_ADC, a method may be considered in which the count clock CKdac1 used by the counter section 312 which forms the DA converter 270 is changed without changing the defined current I_0 of the DA converter 270 or the resistance of the resistor 340 for current and voltage conversion. This method is called a method of changing the inclination by change of a clock operation of the counter section 312 of the DA converter 270.

As another method of changing the inclination of the reference signal SLP_ADC for AD conversion, a method may be considered in which the resistance of the resistor 340 for current and voltage conversion is changed without changing the defined current I_0 of the DA converter 270 or the operating speed of the counter section 312 which forms the DA converter 270. This method is called a method of changing the inclination by resistance change in current and voltage conversion.

It is also possible to adopt a method in which the weight corresponding to the count value of the counter section 312 is changed by changing the defined current I_0 of the DA converter 270 without changing the operating speed of the counter section 312, which forms the DA converter 270, or the resistance of the resistor 340 for current and voltage conversion. This method is called a method of changing the inclination by current change in current and voltage conversion. On the other hand, when the count clock CKdac1 is set to 1/M, the inclination can be made uniform by setting the resistance of the resistor 340 to 1/M or increasing the defined current I_0 M times.

In addition, the configurations of the reference signal generating section 27 shown herein are only examples, and the method of adjusting the inclination of the reference signal SLP_ADC is not limited to such methods. For example, it is also possible to generate the reference signal SLP_ADC which satisfies a function of y=α−β*x including α (initial value) and inclination (rate of change) β in the control data CN4, and the reference signal generating section 27 may be formed without using the counter section 312. However, the configuration of using the counter section 312 is advantageous in that it is easy to generate the reference signal SLP_ADC and correspondence of an operation with the counter section 254 is easily realized.

For example, a configuration may be considered in which the counter output value is set to x and the electric potential calculated by y=α−β*x is output while maintaining the period of the count clock CKdac1 applied to the reference signal generating section 27 constant. In this case, adjustment of a voltage change ΔSLPdac (that is, inclination β of the reference signal SLP_ADC) for every count clock CKdac1 based on the information indicating the inclination β is realized by changing the clock number, for example. In addition, ΔSLPdac per clock may be adjusted by changing the resistance for current and voltage conversion or changing the amount of current of a unit current source.

<Principle of Double AD Conversion>

Figure 3C:
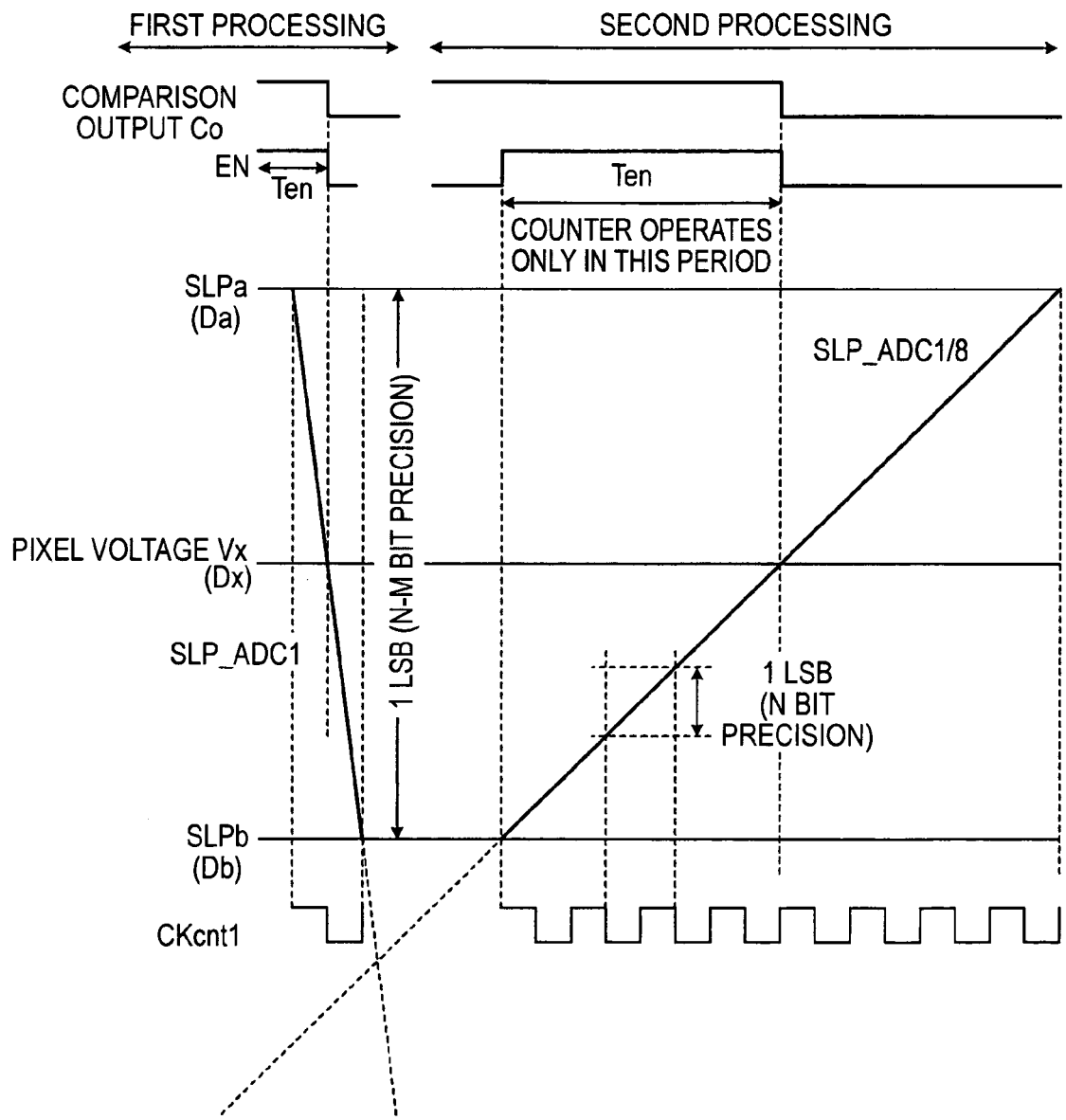
FIG. 3C is a view illustrating a basic operation (first example: first case) of double AD conversion in the present embodiment.

FIGS. 3A to 3I are views illustrating the principle of double AD conversion processing adopted in the present embodiment. Here, FIG. 3A is a view showing the relationship among bit resolution, inclination of the reference signal SLP_ADC, and a frequency of the count clock CKcnt1 that the counter section 254 uses. FIG. 3B is a view illustrating the relationship between operation processing and a second count period in double AD conversion processing. FIGS. 3C to 3I are views illustrating a basic operation in the double AD conversion processing of the present embodiment using the characteristics shown in FIG. 3A.

As shown in (1) of FIG. 3A, the step width ΔSLP of the reference signal SLP_ADC per count clock CKcnt1 that the counter section 254 uses in the count operation becomes the bit resolution. Accordingly, the inclination of the reference signal SLP_ADC and the frequency of the count clock CKcnt1 affect the bit resolution. For a frequency of the count clock CKcnt1 when acquiring N bit precision, the count clock CKcnt1 when setting the frequency to 1/M is described as a count clock CKcnt1/M.

For example, as shown in (2) of FIG. 3A, if the frequency of the count clock CKcnt1 is constant, the step width ΔSLP is large when the inclination of the reference signal SLP_ADC is large. Accordingly, the bit resolution becomes coarse. On the other hand, when the inclination of the reference signal SLP_ADC is small, the step width ΔSLP is small. Accordingly, the bit resolution becomes precise. On the other hand, as shown in (3) of FIG. 3A, if the inclination of the reference signal SLP_ADC is constant, the step width ΔSLP is large when the frequency of the count clock CKcnt1 is low. Accordingly, the bit resolution becomes coarse. On the other hand, when the frequency of the count clock CKcnt1 is high, the step width ΔSLP is small. Accordingly, the bit resolution becomes precise.

In AD conversion processing of the present embodiment, first AD conversion is performed with low resolution and second AD conversion is performed with high resolution using the above-described characteristics. In this case, first, the first AD conversion is coarsely performed with N−M bit precision to thereby acquire the data of upper N−M bits. In the second AD conversion, only about one LSB of N−M bit precision in the neighborhood where the comparison output Co of the comparing section 252 has been inverted is AD-converted with high precision of N bits by operating the counter section 254, thereby acquiring the data of lower M bits. Then, pixel data Dx of the pixel signal voltage Vx with N bit precision is acquired using the data of upper N−M bits acquired with N−M bit precision in the first AD conversion processing and the data of lower M bits acquired with N bit precision in the second AD conversion processing. When differential processing follows in this case, the differential processing can be performed by change of a count mode even if a calculator is not additionally prepared, in the same manner as CDS processing using a P phase processing result and a D phase processing result can be performed by change of a count mode.

FIG. 3B collectively shows the relationship of the data acquired in first processing by a first-half count method, the data acquired in second processing, an operation expression for acquiring the pixel data Dx on the basis of both the data, and a count operation period in the second processing in the relationship with the change direction of the reference signal SLP_ADC.

As shown in (1) of FIG. 3B, the change direction of the reference signal SLP_ADC is assumed to be negative, the value (lower limit) acquired in the first processing for a lower side of one LSB to which the pixel data Dx with N−M bit precision belongs is set to Da, and the value (upper limit) acquired in the first processing for an upper side is set to Db. The difference between the lower limit Da and the pixel data Dx is set to Dc (=Dx−Da), and the difference between the upper limit Db and the pixel data Dx is set to Dd (=Db−Dx). The lower limit Da and the upper limit Db satisfy the relationship of Da=Db−1LSB (N−M bit precision) and Db=Da+1LSB (N−M bit precision). Assuming that the change direction of the reference signal SLP_ADC is positive, the relationship between the upper limit and the lower limit becomes opposite. Accordingly, in order to acquire the differences Dc and Dd as positive values, first and second terms on the right side are reversed.

In the first AD conversion processing, when the reference signal SLP_ADC becomes equal to the pixel signal voltage Vx, either the lower limit Da or the upper limit Db with N−M bit precision is held as data of upper N−M bits with N bit precision. In the second AD conversion processing, either the difference Dc or the difference Dd is counted with N bit precision. The operation period of the second counter section 254 in the second AD conversion processing is limited to "when either the difference Dc or the difference Dd is counted with N bit precision". In the other periods, the operation of the second counter section 254 is stopped.

When acquiring the pixel data Dx, an operation is performed using the data (either Da or Db: data of upper N−M bits with N−M bit precision) acquired in the first processing and the data (either Dc or Dd: data of lower M bits with N bit precision) acquired in the second processing. As shown in (2) of FIG. 3B, four combinations may be adopted. The simple ones as operation expressions of correction are Da+Dc and Db−Dd.

In the second processing, in order to limit the operation period of the counter section 254 to "when either the difference Dc or the difference Dd is counted with N bit precision", start and stop timing is controlled according to the change direction of the reference signal SLP_ADC, as shown in (2) of FIG. 3B. The basic idea is that between the pixel signal voltage Vx which specifies the data (any of Dc and Dd) acquired in the second processing and either the level SLPa which specifies the lower limit Da or the level SLPb which specifies the upper limit Db, one which first reaches the level of the reference signal SLP_ADC is set as a starting point and the other one is set as a stop point.

In the case where a point of time when the pixel signal voltage Vx becomes equal to the reference signal SLP_ADC is set as a stop point, it is convenient to set the data acquired in the first processing so as to match the starting point in the second processing because the counter section 254 preferably operates after the level (any of SLPa and SLPb) of the data (any of Da and Db) acquired in the first processing becomes equal to the reference signal SLP_ADC. On the contrary, in the case where a point of time when the pixel signal voltage Vx becomes equal to the reference signal SLP_ADC is set as a starting point, it is convenient to set the data acquired in the first processing so as to match the endpoint in the second processing because the counter section 254 preferably stops when the level (any of SLPa and SLPb) of the data (any of Da and Db) acquired in the first processing becomes equal to the reference signal SLP_ADC. In any cases, a useless operation for setting of the start or stop timing is not necessary. Also in terms of count operation control, a method of performing the correction operation of any of Da+Dc and Db−Dd is simple.

For example, a first example shown in FIGS. 3C and 3D is a method of changing the inclination of the reference signal SLP_ADC in the first and second processing while maintaining the frequency of the count clock CKcnt1 constant. Especially, FIG. 3C shows a method of reversing positive and negative of the inclination of the reference signal SLP_ADC in the first and second processing, and FIG. 3D shows a method of making positive and negative of the inclination of the reference signal SLP_ADC equal in the first and second processing.

In both the methods shown in FIGS. 3C and 3D, the inclination of the reference signal SLP_ADC is made large in the first processing and small in the second processing. In order to make the structure of the present embodiment easily understood, in the first and second processing, states of the reference signal SLP_ADC near a point of time when the comparison output Co of the comparing section 252 is inverted are mixed in the drawings. For easy understanding, it is assumed that the count clock CKdac1 which the DA converter 270 uses and the count clock CKcnt1 which the counter section 254 uses are the same. N−M bit precision is set in the first processing, and N bit precision is set in the second processing.

In the first processing, the inclination of the reference signal SLP_ADC is large. Accordingly, since the step width ΔSLP_1 (equivalent to one LSB) between the level SLPa immediately before step change and the level SLPb immediately after step change is large, the bit resolution is coarse (N−M bit precision). If the pixel signal voltage Vx (reset level Vrst or the signal level Vsig) is within the step width ΔSLP_1, all become the same count value (that is, AD conversion result).

In the second processing, the inclination of the reference signal SLP_ADC is set small and the count operation is started when the value of the reference signal SLP_ADC reaches a level near a point of time when the comparison output Co is inverted. Thus, data (which is difficult to resolve with N bit precision) within the step width ΔSLP_1 in the first processing is AD-converted in a state where the step width ΔSLP_2 of one LSB is small (with N bit precision). If the counter section 254 is an up/down counter, an operation result of D1 (upper N−M bits)−D2 (lower M bits) is automatically obtained by performing counting in a count mode, which is opposite to that in the first processing, in the second processing.

The states shown in FIGS. 3C and 3D will be specifically described assuming that the data in the first processing is D1 (upper N−M bits of N bits), the data in the second processing is D2 (lower M bits of N bits), the level of the reference signal SLP_ADC corresponding to the count value of the counter section 312 of the DA converter 270 when the comparison output Co in the first processing is inverted is SLPa, and the level of the reference signal SLP_ADC corresponding to the count value after one clock therefrom is SLPb.

The processing method shown in FIG. 3C is an example where the inclination of the reference signal SLP_ADC is set negative in the first processing and set positive in the second processing and the count value when the reference signal SLP_ADC is at SLPb (when it is equal to a point of time when the comparison output Co is inverted) is held in the count operation period control section 253 at the completion of the first processing. In this case, the level SLPb of the reference signal SLP_ADC indicated by the count value held in the count operation period control section 253 is lower than the pixel signal voltage Vx. In the second processing, using the level SLPb as a starting point, a period until the reference signal SLP_ADC whose inclination is 1/M of that in the first processing and whose level gradually increases in the step width ΔSLP_2 (1/M of ΔSLP_1) narrower than in the first processing becomes equal to the pixel signal voltage Vx is counted. By performing the calculation of D1 (upper N−M bits)−D2 (lower M bits), the level of the pixel signal voltage Vx is converted into digital data with N bit precision.

The processing method shown in FIG. 3D is an example where the inclination of the reference signal SLP_ADC is set negative in the first processing and set negative also in the second processing and the count value when the reference signal SLP_ADC is at SLPa is held in the count operation period control section 253 at the completion of the first processing. In this case, the level SLPa of the reference signal SLP_ADC indicated by the count value held in the count operation period control section 253 is higher than the pixel signal voltage Vx. In the second processing, using the level SLPa as a starting point, a period until the reference signal SLP_ADC whose inclination is 1/M of that in the first processing and whose level gradually decreases in the step width ΔSLP_2 (1/M of ΔSLP_1) narrower than in the first processing becomes equal to the pixel signal voltage Vx is counted. By performing the calculation of D1 (upper N−M bits)+D2 (lower M bits), the level of the pixel signal voltage Vx is converted into digital data with N bit precision.

In addition, if the processing methods shown in FIGS. 3C and 3D are applied when a method of transmitting the count value immediately after step change of the reference signal SLP_ADC to the output section 28 is adopted, the count value when the reference signal SLP_ADC becomes higher than the level of the pixel signal voltage Vx is decided as data decided in the second processing. On the other hand, in the case where this method is not applied, the count value when the reference signal SLP_ADC becomes lower than the level of the pixel signal voltage Vx is decided as the data. As a result, there is a difference of one LSB all the time in both the cases. However, as described above, the data is output after being shifted by only one LSB as a whole. This may be thought as criteria of a quantizing error and does not cause any problem.

The second example shown in FIGS. 3E and 3F is a method of changing the frequency of the count clock CKcnt of the counter section 254 in the first and second processing while maintaining the inclination of the reference signal SLP_ADC constant (may be positive and negative). Especially, FIG. 3E shows a method of reversing positive and negative of the inclination of the reference signal SLP_ADC in the first and second processing, and FIG. 3F shows a method of making positive and negative of the inclination of the reference signal SLP_ADC equal in the first and second processing.

In both the methods shown in FIGS. 3E and 3F, it is assumed that the frequency of the count clock CKcnt1 is set low in the first processing so as to correspond to N−M bit resolution and set high in the second processing so as to correspond to normal N bit resolution. In order to make the structure of the present embodiment easily understood, in the first and second processing, states of the reference signal SLP_ADC near a point of time when the comparison output Co of the comparing section 252 is inverted are mixed in the drawings. For easy understanding, it is assumed that the count clock CKdac1 which the DA converter 270 uses and the count clock CKcnt1 which the counter section 254 uses are the same. N−M bit precision is set in the first processing, and N bit precision is set in the second processing.

In the first processing, the frequencies of the count clocks CKcnt1 and CKdac1 are set to 1/M of those in the second processing. The DA converter 270 sets the resistance of the resistor 340 to 1/M or increases the defined current I_0 M times so that the inclination of the reference signal SLP_ADC becomes equal to that in the second process even if the count clock CKdac1 is set to 1/M.

Since the count clock CKcnt1 is divided into 1/M in the first processing, the step width ΔSLP_1 of one LSB is large. Accordingly, the bit resolution is coarse (N−M bit precision). If the pixel signal voltage Vx (reset level Vrst or the signal level Vsig) is within the step width ΔSLP_1, all become the same count value (that is, AD conversion result). In the second processing, the count operation is started when the value of the reference signal SLP_ADC reaches a level near a point of time when the comparison output Co is inverted, such that the frequency of the count clock CKcnt1 corresponds to the normal N bit resolution. In the second processing, data (which is difficult to resolve with N bit precision) within the step width ΔSLP_1 in the first processing is AD-converted in a state where the step width ΔSLP_2 of one LSB is small (with N bit precision). If the counter section 254 is an up/down counter, an operation result of D1 (upper N−M bits)−D2 (lower M bits) is automatically obtained by performing counting in a count mode, which is opposite to that in the first processing, in the second processing.

Here, the states shown in FIGS. 3E and 3F will also be specifically described assuming that the data in the first processing is D1 (upper N−M bits of N bits), the data in the second processing is D2 (lower M bits of N bits), the level of the reference signal SLP_ADC corresponding to the count value of the counter section 312 of the DA converter 270 when the comparison output Co in the first processing is inverted is SLPa, and the level of the reference signal SLP_ADC corresponding to the count value after one clock therefrom is SLPb.

The processing method shown in FIG. 3E is an example where the inclination of the reference signal SLP_ADC is set negative in the first processing and set positive in the second processing and the count value when the reference signal SLP_ADC is at SLPb is held in the count operation period control section 253 at the completion of the first processing. In this case, the level SLPb of the reference signal SLP_ADC indicated by the count value held in the count operation period control section 253 is lower than the pixel signal voltage Vx. In the second processing, with the level SLPb as a starting point, a period until the reference signal SLP_ADC whose level gradually increases becomes equal to the pixel signal voltage Vx is counted using the count clock CKcnt1 the frequency of which has been increased to M times the frequency in the first processing. By performing the calculation of D1 (upper N−M bits)−D2 (lower M bits), the level of the pixel signal voltage Vx is converted into digital data with N bit precision.

The processing method shown in FIG. 3F is an example where the inclination of the reference signal SLP_ADC is set negative in the first processing and set negative also in the second processing and the count value when the reference signal SLP_ADC is at SLPa is held in the count operation period control section 253 at the completion of the first processing.

In this case, the level SLPa of the reference signal SLP_ADC indicated by the count value held in the count operation period control section 253 is higher than the pixel signal voltage Vx. In the second processing, with the level SLPa as a starting point, a period until the reference signal SLP_ADC whose level gradually decreases becomes equal to the pixel signal voltage Vx is counted using the count clock CKcnt1 the frequency of which has been increased to M times the frequency in the first processing. By performing the calculation of D1 (upper N−M bits)+D2 (lower M bits), the level of the pixel signal voltage Vx is converted into digital data with N bit precision.

In the processing method shown in FIG. 3C or 3E, subtraction processing is necessary in order to acquire the final value with N bit precision after performing the processing twice, as can be seen from the operation expression of D1 (upper N−M bits)−D2 (lower M bits). This can be realized by changing the count mode of the counter section 254. For example, at the time of P phase processing, "−Drst" of N bit precision is obtained by setting down count for upper N−M bits in first processing and setting up count for lower M bits in second processing using the data acquired in the first processing as an initial value. Then, at the time of D phase processing, "Dsig+Drst−Drst=Dsig" of N bit precision is obtained by setting up count for upper N−M bits in the first processing using the data acquired in the P phase processing as an initial value and setting down count for lower M bits in second processing using the data acquired in the first processing as an initial value.

In the processing method shown in FIG. 3D or 3F, it is sufficient to perform only addition processing in order to acquire the final value with N bit precision after performing the processing twice, as can be seen from the operation expression of D1 (upper N−M bits)+D2 (lower M bits). Accordingly, it is not necessary to change the count mode. For example, at the time of P phase processing, "−Drst" of N bit precision is obtained by setting down count for upper N−M bits in first processing and setting down count for lower M bits in second processing using the data acquired in the first processing as an initial value. Then, at the time of D phase processing, "Dsig+Drst−Drst=Dsig" of N bit precision is obtained by setting up count for upper N−M bits in the first processing using the data acquired in the P phase processing as an initial value and setting up count for lower M bits in second processing using the data acquired in the first processing as an initial value.

Although not shown, regardless of the inclination or the clock frequency, a method may be adopted in which the inclination of the reference signal SLP_ADC is set to be positive in the first processing and negative in the second processing and the count value when the reference signal SLP_ADC is at SLPb is held in the count operation period control section 253 at the completion of the first processing. Moreover, regardless of the inclination or the clock frequency, a method may be adopted in which the inclination of the reference signal SLP_ADC is set to be positive in the first processing and positive also in the second processing and the count value when the reference signal SLP_ADC is at SLPa is held in the count operation period control section 253 at the completion of the first processing.

That is, regardless of the inclination or the clock frequency, the case where it is combined with a method (first-half count method), in which a period until the comparison output Co is inverted is counted in second processing, may be thought as follows. First, when the change direction of the reference signal SLP_ADC is different between the first processing and the second processing, the count value when the reference signal SLP_ADC is at SLPb is held. This held count value is more excessive than the digital value (count value) of the pixel signal voltage Vx with N bit precision. The excessive portion is one LSB of N−M bit precision at the most. Then, in the second processing, the excessive portion is AD-converted with N bit precision. The operation expression of D1 (upper N−M bits)−D2 (lower M bits) expresses this.

On the other hand, when the change direction of the reference signal SLP_ADC is equal in the first processing and the second processing, the count value when the reference signal SLP_ADC is at SLPa is held. This held count value is more deficient than the digital value (count value) of the pixel signal voltage Vx with N bit precision. The deficient portion is one LSB of N−M bit precision at the most. Then, in the second processing, the deficient portion is AD-converted with N bit precision. The operation expression of D1 (upper N−M bits)+D2 (lower M bits) expresses this.

As can be expected from these explanations, regardless of the inclination or the clock frequency, the case of combination with a method (second-half count method), in which a period until the comparison output Co reaches one LSB of N−M bit precision after being inverted in second processing, may also be possible. In this case, it is preferable to adjust the relationship between the hold timing of count value and excess and deficiency in N bit precision in the relationship with the pixel signal voltage Vx when adopting the first-half count method in second processing.

FIG. 3G collectively shows the relationship among the data acquired in first processing by a second-half count method, the data acquired in second processing, an operation expression for acquiring the pixel data Dx on the basis of both the data, and a count operation period in the second processing in the relationship with the change direction of the reference signal SLP_ADC.

As shown in (1) of FIG. 3G, the change direction of the reference signal SLP_ADC is assumed to be negative, the value (lower limit) acquired in the first processing for a lower side of one LSB to which the pixel data Dx with N−M bit precision belongs is set to Dm−Da, the value (upper limit) on the upper side is set to Dm−Db, and the data of the pixel signal voltage Vx acquired in the second-half count method is set to Dm−Dx. The difference between the lower limit Dm−Da and the data of the pixel signal voltage Vx is set to Dc (=Dx−Da), and the difference between the upper limit Dm−Db and the data of the pixel signal voltage Vx is set to Dd (=Dd−Dx). The lower limit Dm−Da and the upper limit Dm−Db satisfy the relationship of Dm−Da=Dm−Db−1LSB (N−M bit precision) and Dm−Db=Dm−Da+0.1LSB (N−M bit precision). Assuming that the change direction of the reference signal SLP_ADC is positive, the relationship between the upper limit and the lower limit becomes opposite. Accordingly, in order to acquire the differences Dc and Dd as positive values, first and second terms on the right side are reversed.

In the first AD conversion processing, since the count starts when the reference signal SLP_ADC becomes equal to the pixel signal voltage Vx and then the count is performed in a full range, either the lower limit Dm−Da or the upper limit Dm−Db with N−M bit precision is held as data of upper N−M bits with N bit precision. In the second AD conversion processing, either the difference Dc or the difference Dd is counted with N bit precision. The operation period of the second counter section 254 in the second AD conversion processing is limited to "when either the difference Dc or the difference Dd is counted with N bit precision". In the other periods, the operation of the second counter section 254 is stopped.

When acquiring the pixel data Dm−Dx, an operation is performed using the data (either Dm−Da or Dm−Db: data of upper N−M bits with N−M bit precision) acquired in the first processing and the data (either Dc or Dd: data of lower M bits with N bit precision) acquired in the second processing. As shown in (2) of FIG. 3G, four combinations may be adopted. The simple ones as operation expressions of correction are Dm−Da−Dc and Dm−Db+Dd.

In the second processing, in order to limit the operation period of the counter section 254 to "when either the difference Dc or the difference Dd is counted with N bit precision", start and stop timing is controlled according to the change direction of the reference signal SLP_ADC, as shown in (2) of FIG. 3G. The basic idea is that between the pixel signal voltage Vx which specifies the data (any of Dc and Dd) acquired in the second processing and either the level SLPa which specifies the lower limit Dm−Da or the level SLPb which specifies the upper limit Dm−Db, one which first reaches the level of the reference signal SLP_ADC is set as a starting point and the other one is set as a stop point.

In the case where a point of time when the pixel signal voltage Vx becomes equal to the reference signal SLP_ADC is set as a stop point, it is convenient to set the data acquired in the first processing so as to match the starting point in the second processing because the counter section 254 preferably operates after the level (any of SLPa and SLPb) of the data (any of Dm−Da and Dm−Db) acquired in the first processing becomes equal to the reference signal SLP_ADC. On the contrary, in the case where a point of time when the pixel signal voltage Vx becomes equal to the reference signal SLP_ADC is set as a starting point, it is convenient to set the data acquired in the first processing so as to match the end point in the second processing because the counter section 254 preferably stops when the level (any of SLPa and SLPb) of the data (any of Dm−Da and Dm−Db) acquired in the first processing becomes equal to the reference signal SLP_ADC. In any cases, a useless operation for setting of the start or stop timing is not necessary. Also in terms of count operation control, a method of performing the correction operation of any of Dm−Da−Dc and Dm−Db+Dd is simple.

For example, in a third example (first case of the third example) shown in FIG. 3H, a combination with a method of changing the inclination of the reference signal SLP_ADC in the first and second processing while maintaining the frequency of the count clock CKcnt constant is shown. In this method, when the change direction of the reference signal SLP_ADC is different between the first processing and the second processing, the count value when the reference signal SLP_ADC is at SLPa is held in the count operation period control section 253. This held count value is more excessive than the complement data corresponding to the digital value (count value) of the pixel signal voltage Vx with N bit precision, in the second-half count method. The excessive portion is one LSB of N−M bit precision at the most.

Then, in the second processing, the excessive portion is AD-converted with N bit precision after the comparison output Co is inverted. The held data in first processing with N−M bit precision is Dm−D_SLPa and the number of counts in second processing with M bit precision is Dx−D_SLPa. Accordingly, since Dm−Dx is obtained by performing subtraction processing of (Dm−D_SLPa)−(Dx−D_SLPa), the excessive portion in the first processing is corrected. The subtraction processing can be automatically realized by changing the count mode in the first and second processing, for example.

Figure 3I:
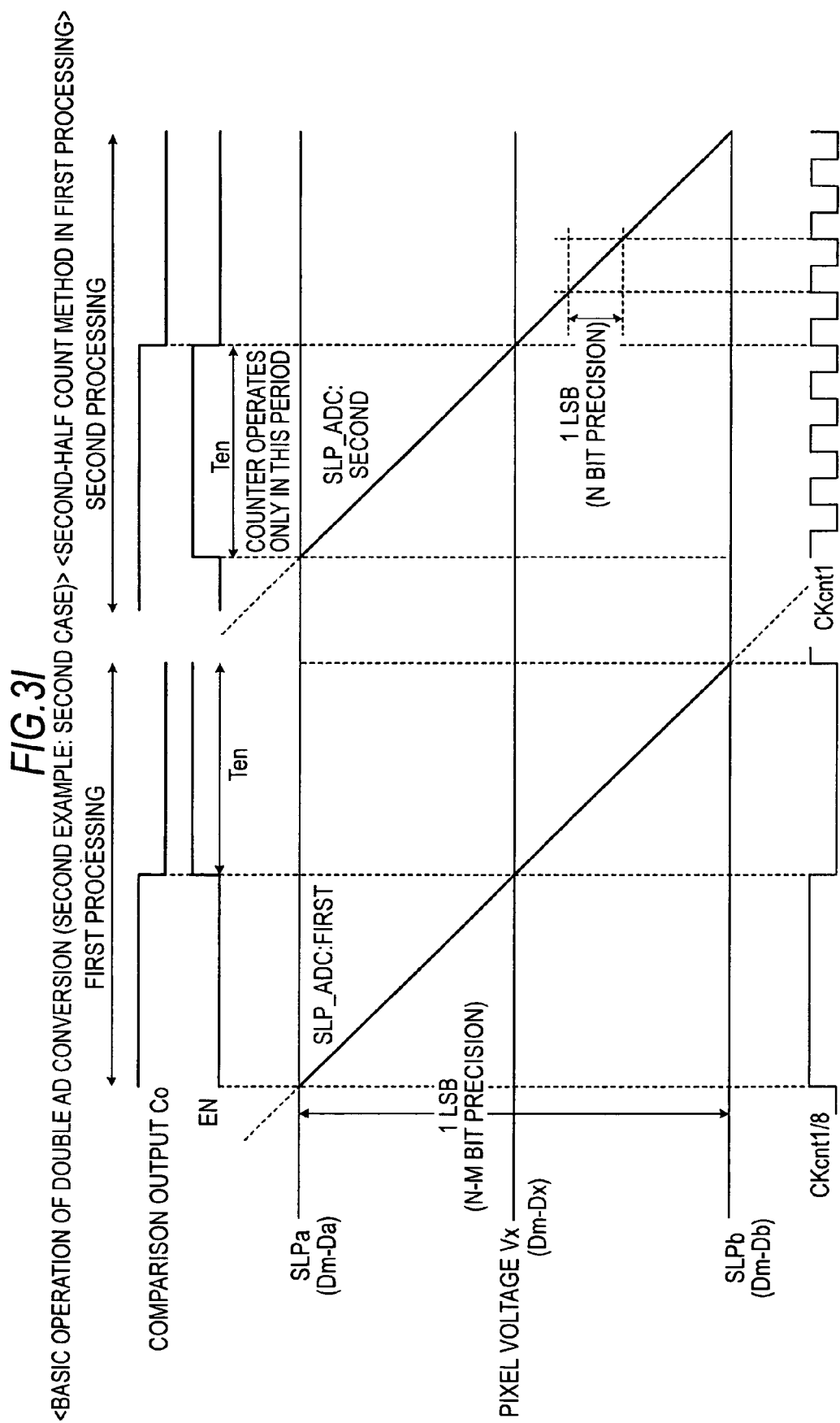
FIG. 3I is a view illustrating a basic operation (third example: second case) of the double AD conversion in the present embodiment.

On the other hand, in the third example (second case of the third example) shown in FIG. 3I, a combination with a method of changing the frequency of the count clock CKcnt in the first and second processing while making positive and negative of the inclination of the reference signal SLP_ADC equal is shown. In this method, when the change direction of the reference signal SLP_ADC is equal in the first processing and the second processing, the count value when the reference signal SLP_ADC is at SLPb is held in the count operation period control section 253. This held count value is more deficient than the complement data corresponding to the digital value (count value) of the pixel signal voltage Vx with N bit precision, in the second-half count method. The deficient portion is one LSB of N−M bit precision at the most.

Then, in the second processing, the deficient portion is AD-converted with N bit precision after the comparison output Co is inverted. The held data in first processing with N−M bit precision is Dm−D_SLPb and the number of counts in second processing with M bit precision is D_SLPb−Dx. Accordingly, since Dm−Dx is obtained by performing addition processing of (Dm−D_SLPa)+(Dx−D_SLPa), the deficient portion in the first processing is corrected. It can be seen that the count mode is the same in the first and second processing.

The following advantages are obtained by adopting the structure of double AD conversion in the present embodiment. First, in both first processing and second processing in each of P and D phases, the reference signal generating section 27 (DA converter 270) may change the reference signal SLP_ADC in the positive or negative direction in a full range.

Accordingly, unlike the structures disclosed in JP-A-56-096527, JP-A-2002-232291, and U.S. Pat. No. 6,670,904, it is not necessary to generate a reference voltage in which a change point of the inclination changes for every pixel (column). By adopting a method of creating the count operation effective period Ten for controlling the operation period of the counter section 254 for every column using the count operation period control section 253, control of the count operation of the counter section 254 can be realized only by a digital circuit, and this is advantageous in that deterioration of a signal does not occur.

Also in the method of changing the inclination of the reference signal SLP_ADC in the first processing (at the time of coarse precision conversion) and the second processing (at the time of high precision conversion), it is preferable that the reference signal SLP_ADC is changed with a gentle inclination in a full range in the second processing so as to be equal for all columns and the count operation effective period Ten for controlling the operation period of the counter section 254 is created for every column.

Since the configuration of a control circuit is relatively simple, the circuit structure can be reduced if a configuration optimized for a mode and a method is adopted. The large logic control circuit disclosed in JP-A-56-096527 is not necessary. Accordingly, it becomes easy to reduce the circuit area by miniaturization of an element. Even in the case where the combination of new mode and method is devised in the reference signal comparing type AD conversion method in which AD conversion is performed only once similar to the related art, it is sufficient only to create the count operation effective period Ten which defines a period for which high precision conversion is performed for one LSB which is difficult to resolve with the coarse bit resolution in the first AD processing. Since this can be realized by changing the configuration of the count operation period control section 253 formed by a digital circuit, it can be said to be a method with redundancy.

Unlike disclosed in JP-A-56-096527, JP-A-2002-232291, and U.S. Pat. No. 6,670,904, it is not necessary to provide a reference voltage source which changes a change point of the reference signal for every column. Therefore, the circuit size is reduced even if the reference signal generating section 27 is provided for every column. Undoubtedly, it is also possible to adopt a configuration in which only one reference signal generating section 27 used in common in all columns is performed, as shown in FIG. 1. This is significantly different from the structures disclosed in JP-A-56-096527, JP-A-2002-232291, and U.S. Pat. No. 6,670,904 in which one reference voltage source used in common in all columns is difficult to realize.

Moreover, since this is not a method of changing the inclination of a reference signal using a capacitor or a switch unlike the methods disclosed in JP-A-2002-232291 and U.S. Pat. No. 6,670,904, the case where miniaturization is difficult due to a capacitor does not occur. In addition, deterioration of linearity caused by variation, noise, and the like or a problem of noise caused by joint level difference and on/off operation of a switch, does not occur either.

First Embodiment

Figure 4A:
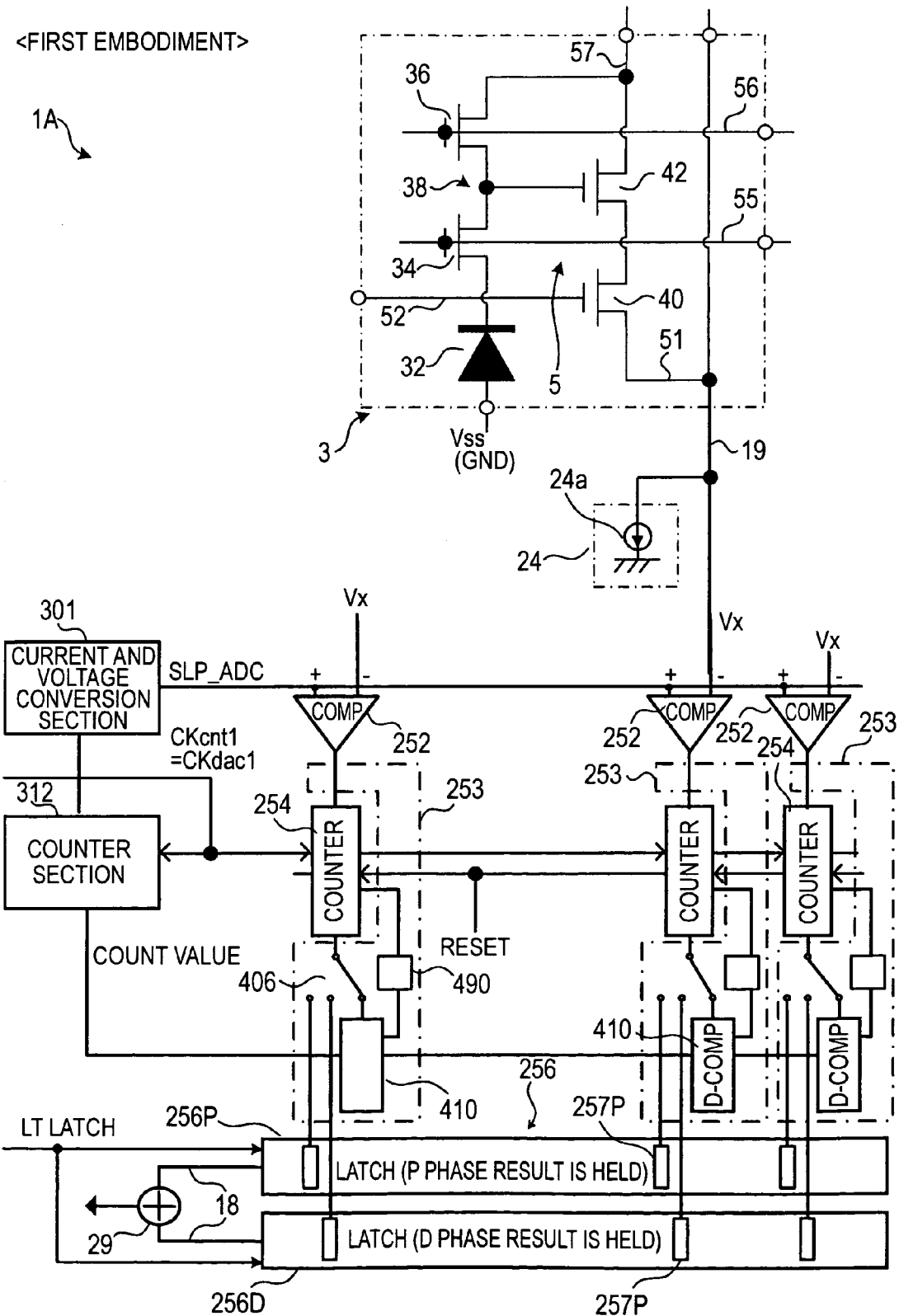
FIG. 4A is a view showing the simple circuit configuration of a solid state imaging device according to a first embodiment when AD conversion processing and CDS processing are taken into consideration.
Figure 4D:
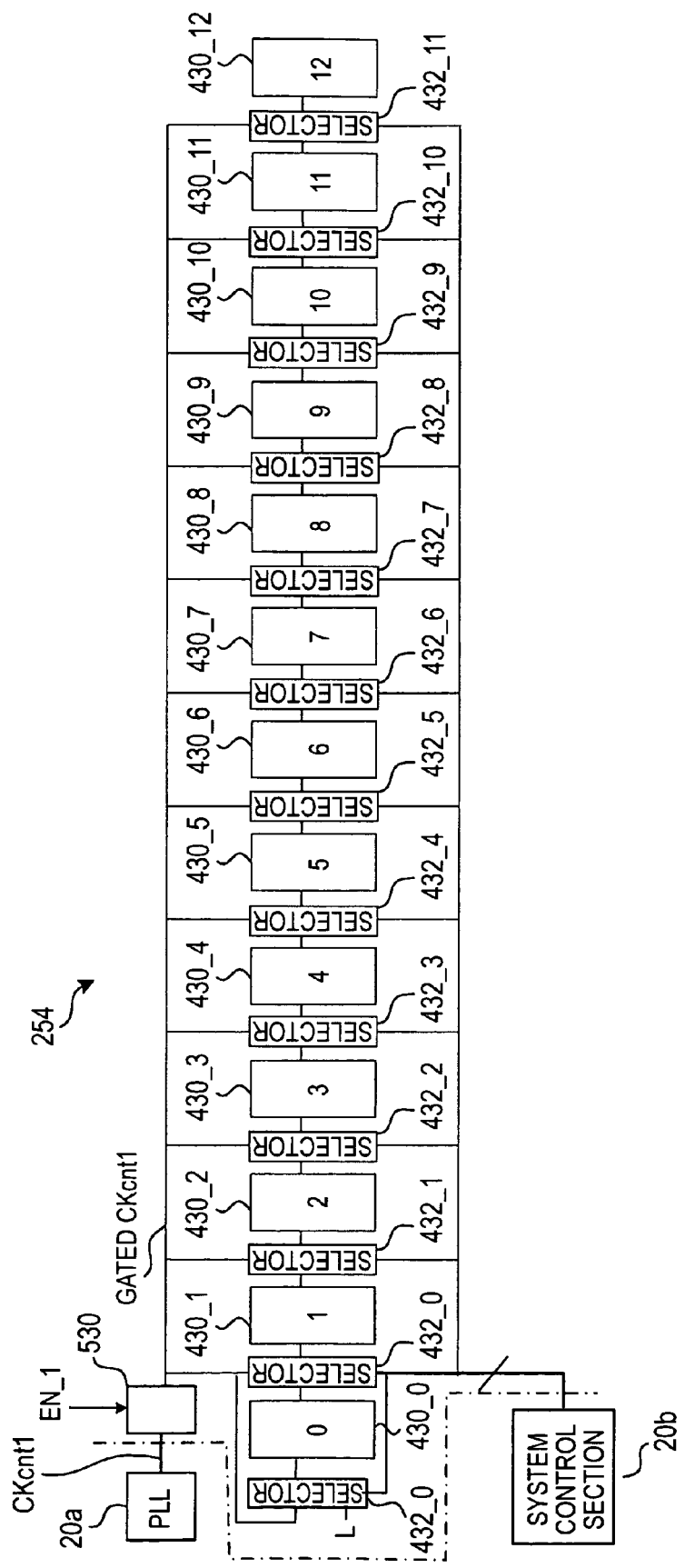
FIG. 4D is a view showing an example of the configuration of a counter section used in the solid state imaging device according to the first embodiment.

FIGS. 4A to 4E are views illustrating a first embodiment. In the first embodiment, AD processing is performed twice similar to the processing shown in FIG. 3C. Here, FIG. 4A is a view showing the simple circuit configuration of a solid state imaging device 1A according to the first embodiment when AD conversion processing and CDS processing are taken into consideration. FIG. 4B is a view showing an example of the configuration of the comparing section 252 used in the solid state imaging device 1A according to the first embodiment. FIG. 4C is a view showing an example of the detailed configuration of a part of the count operation period control section 253 used in the solid state imaging device 1A according to the first embodiment. FIG. 4D is a view showing an example of the configuration of the counter section 254 used in the solid state imaging device 1A according to the first embodiment. FIG. 4E is a timing chart illustrating double AD conversion operations in the solid state imaging device 1A according to the first embodiment.

As shown in FIG. 4A, the unit pixel 3 has not only a charge generating section 32 but also four transistors (a read selection transistor 34, a reset transistor 36, a vertical selection transistor 40, and an amplifying transistor 42) as basic components which form a pixel signal generating section 5, as an example. The read selection transistor 34 which forms a transfer section is driven by a transfer signal TRG. The reset transistor 36 which forms an initialization section is driven by a reset signal RST. The vertical selection transistor 40 is driven by a vertical selection signal VSEL.

The charge generating section 32 is an example of a detector formed by a light receiving element DET, such as a photodiode PD. One end (anode side) of the light receiving element DET is connected to a reference potential Vss (negative potential: for example, about −1 V) on the low potential side, and the other end (cathode side) is connected to an input end (typically, a source) of the read selection transistor 34. In addition, the reference potential Vss may be a ground potential GND. An output end (typically, a drain) of the read selection transistor 34 is connected to a connection node at which the reset transistor 36, a floating diffusion 38, and the amplifying transistor 42 are connected. A source of the reset transistor 36 is connected to the floating diffusion 38, and a drain of the reset transistor 36 is connected to a reset power supply Vrd (usually set in common with the power supply Vdd).

A drain of the vertical selection transistor 40 is connected to a source of the amplifying transistor 42, a source of the vertical selection transistor 40 is connected to a pixel line 51, and a gate (especially called a vertical selection gate SELV) of the vertical selection transistor 40 is connected to a vertical selection line 52, as an example. A gate of the amplifying transistor 42 is connected to the floating diffusion 38, a drain of the amplifying transistor 42 is connected to the power supply Vdd, and a source of the amplifying transistor 42 is connected to the pixel line 51 through the vertical selection transistor 40 and is also connected to a vertical signal line 19. In addition, the vertical selection transistor 40 and the amplifying transistor 42 may be disposed inversely without being limited to the above connection configuration. For example, a case may also be adopted in which the drain of the vertical selection transistor 40 is connected to the power supply Vdd, the source of the vertical selection transistor 40 is connected to the drain of the amplifying transistor 42, and the source of the amplifying transistor 42 is connected to the pixel line 51.

One end of the vertical signal line 19 extends to the column AD conversion section 26, and the read current control section 24 is connected in the path. Although not shown in detail, the read current control section 24 has a load MOS transistor in each vertical column. Gates are connected between a reference current source section and a transistor to thereby form a current mirror circuit which functions as a current source 24a for the vertical signal line 19. In addition, a source follower configuration in which an approximately constant operating current (read current) is supplied may be adopted between the read current control section 24 and the amplifying transistor 42.

The count operation period control section 253 (control circuit) is configured to include a switch 406 and a digital comparator 410 (D-COMP). In this configuration example, the counter section 254 is shown in a state of being removed from the count operation period control section 253. In practice, however, a configuration is adopted in which a data holding function of the counter section 254 is used as a functional section which holds the count value when the reference signal SLP_ADC is at SLPb at the completion of the first processing.

In this configuration example, the counter section 254 functions as a one LSB level information acquisition section which acquires the information, which specifies the level SLPa on the lower side or the level SLPa on the upper side by one LSB of N–M bit precision to which AD conversion data of the pixel signal voltage Vx belongs, when the comparing section 252 detects that the reference signal SLP_ADC becomes equal to the pixel signal voltage Vx in first processing. Adopting such a configuration is because the count clock CKcnt1 and the count clock CKdac1 are in common. When they adopt different configurations, a dedicated counter section which operates with the count clock CKdac1 on a side of the reference signal generating section 27 or with a corresponding clock is provided in the count operation period control section 253, so that the function of the one LSB level information acquisition section is realized.

The digital comparator 410 starts the count operation of the counter section 254 by activating the count enable signal EN when the count value of the counter section 312 on a side of the reference signal generating section 27 becomes equal to the count value held in the counter section 254 of each column in the second processing.

The switch 406 changes the output destination of the data held in the counter section 254. The digital comparator 410 compares the counter value, which is held in the counter section 254, with the counter value of the counter section 312 at the time of the second AD conversion, and outputs an active H when they are equal. The count operation period control section 253 generates the count enable signal EN, which has an H level during a period until the comparison output Co of the comparing section 252 is inverted from the start of change of the reference signal SLP_ADC at the time of the first AD conversion and which has an H level during a period until the comparison output Co of the comparing section 252 is inverted after the output of the digital comparator 410 changes to active H at the time of the second AD conversion, and supplies the count enable signal EN to the counter section 254. The H level period of the count enable signal EN is the count operation effective period Ten.

The data storage section 256 includes a first data storage section 256P, which has a latch 257P for holding a P phase result, and a second data storage section 256D, which has a latch 257D for holding a D phase result, in order to separately hold the AD conversion result of a P phase level (reset level Srst) and the AD conversion result of a D phase level (signal level Ssig). It is controlled by the switch 406 to which of the latches 257P and 257D and the digital comparator 410 the data held in the counter section 254 will be transmitted. The data of the first data storage section 256P (latch 257P) and the data of the second data storage section 256D (latch 257D) are transmitted to the digital operation section 29 provided in the output section 28. The P phase data held in the first data storage section 256P is negative data (−Drst), and the D phase data held in the second data storage section 256D is positive data (Drst+Dsig). Accordingly, the digital operation section 29 acquires the digital data Dsig of the signal component Vsig by an adding operation.

In the present embodiment, in any processing of P and D phases, the change direction of the reference signal SLP_ADC changes between the first and second times. Accordingly, in the first and second AD conversion, the relationship between the reference signal SLP_ADC and the pixel signal voltage Vx changes and the relationship of H/L of the comparison output Co of the comparing section 252 is inverted. For this reason, in order for matching with a known structure, measures for matching of the direction, in which the comparison output Co of the comparing section 252 changes, in the first and second AD conversion are made as an example. The difference between the first AD conversion and the second AD conversion may be said that a comparing output of a comparator of a basic component, which forms the comparing section 252, is inverted once more in the second AD conversion.

As the configuration example, although not shown, a configuration may be considered in which a ½ frequency divider is formed by a D latch (D flip-flop) and an edge detection result of a comparing output of a comparator of a basic component which forms the comparing section 252 is supplied to a clock end of the D latch, for example.

Moreover, as shown in (1) of FIG. 4B, it may be realize by inserting an adder 512 in a final stage of a comparator 510 which forms the comparing section 252 and by supplying a distinction signal DET for distinguishing the first AD conversion and the second AD conversion from an external system control section 20b. A final-stage output of the comparator 510 is input to one input end of the adder 512, and the distinction signal DET is input to the other input end. It is assumed that the distinction signal DET has an L(0) level in the first AD conversion and an H(1) level in the second AD conversion. As also can be seen from the truth table, the lowest bit data of the output of the adder 512 is preferably used as the comparison output Co.

Moreover, as shown in (2) of FIG. 4B, it may be realize by inserting an EX-OR-gate 514 in a final stage of the comparator 510 which forms, the comparing section 252 and by supplying the distinction signal DET for distinguishing the first AD conversion and the second AD conversion from the outside. The output of the comparator 510 is input to one input end of the EX-OR-gate 514, and the distinction signal DET is input to the other input end. It is assumed that the distinction signal DET has an L level in the first AD conversion and an H level in the second AD conversion. As also can be seen from the truth table, the EX-OR-gate 514 performs logic inversion of the output of the comparator 510 of one input end when the distinction signal DET of the other input end is "H".

Moreover, as shown in (3) of FIG. 4B, an inverter 516 and a selector 518 may be added in the final stage of the comparator 510. The final-stage output of the comparator 510 is input to one input end of the selector 518, an output of the inverter 516 is supplied to the other input end, and the distinction signal DET is input to a control input end. It is assumed that the distinction signal DET has an L level in the first AD conversion and an H level in the second AD conversion. By the selector 518, the final-stage output of the comparator 510 and the output of the inverter 516 are changed in the first and second AD conversion.

In any configuration, the final-stage output of the comparator 510 can be inverted once more in the second AD conversion.

In a normal configuration where the present embodiment is not applied, for example, the source count enable signal EN_0 in which a period for which the reference signal SLP_ADC changes is set as H is received from the communication and timing control section 20 and the count enable signal EN to be transmitted to the counter section 254 is generated by dropping the count enable signal EN_0 to L in response to the output of the comparing section 252, thereby controlling the operation period of the counter. In this case, for both the P and D phases, the operation start of the counter in first processing is when a source count enable signal changes to H, and the operation end is when the size relationship of the reference signal SLP_ADC and the pixel signal voltage Vx is inverted in both the first processing and the second processing.

On the other hand, in the present embodiment, the second processing is distinctive. For both the P and D phases, the operation start of the counter in second processing changes with a column, and the operation end is when the size relationship of the reference signal SLP_ADC and the pixel signal voltage Vx is inverted as usual in both the first processing and the second processing. Therefore, as control of the second AD conversion, "an operation of a counter starts when it matches a result of the first AD conversion" is necessary. For this, a "column counter enable signal EN_1" is introduced.

In order to generate "column counter enable signal EN_1", the count operation period control section 253 has a matching circuit 490 with a configuration shown in FIG. 4C, for example. The matching circuit 490 is configured to include a D latch 492, an AND gate 494, and a two input type switch 496 (selector). A D input end of the D latch 492 is fixed to H, and an output (H when matched) of the digital comparator 410 is supplied to a clock input end. A control signal which resets a non-inverting output Q of the D latch 492 to L at the start of second processing is supplied from the system control section 20b to a reset end. The non-inverting output Q of the D latch 492 is supplied to one input end of the AND gate 494, and the count enable signal EN_0 is supplied to the other input end.

An output of the AND gate 494 is supplied to one input end of the switch 496, the count enable signal EN_0 is supplied to the other input end, and the distinction signal DET for distinguishing the first processing from the second processing is supplied from the system control section 20b to a control input end of the AND gate 494.

Accordingly, since the source count enable signal EN_0 is used as the "column counter enable signal EN_1" as it is in the first processing, the operation start of a counter is when the source count enable signal changes to H for both the P and D phases. On the other hand, in the second processing, the counter operation can be started when the output of the digital comparator 410 changes to H, that is, "when it matches the first AD conversion result".

As shown in FIG. 4D, the counter section 254 is an asynchronous counter which has a latch 430 (D flip-flop) and a selector 432 corresponding to a bit. The counter section 254 includes a clock matching circuit 530 for supplying the count clock CKcnt1 from the clock conversion section 20a (PLL) of the communication and timing control section 20 to the latch 430 for a necessary period specified by the column counter enable signal EN_1. The selector 432 is disposed at the input side of each latch 430 corresponding to a bit. The selector 432 is controlled by a control signal from the system control section 20b, and selects the count clock CKcnt1 after gate processing in the clock matching circuit 530, an output of the latch 430 in a preceding stage, or an L level and then supplies it to a clock input end of the latch 430 in a subsequent stage.

That is the selector 432 controls the supply destination of a clock by changing an input from a lower bit and the count clock CKcnt1 from the outside of the counter. For example, the configuration corresponding to 13 bits is shown in FIG. 4D. A case will be considered in which the data corresponding to upper 8 bits is acquired in first processing and the data corresponding to lower 5 bits are decided in second processing.

In the first processing, only latches 430_5 to 430_12 corresponding to upper 8 bits are activated, the count clock CKcnt1 after gate processing is input to the clock input end of the latch 430_5 in the lowest stage, and lower side output data is supplied to the clock input ends in the following stages. Latches 430_0 to 430_4 on the lower side do not operate because there is no clock input. Accordingly, the power consumption can be reduced. In the second processing, all latches 430_0 to 430_12 are activated, the count clock CKcnt1 is supplied to the clock input end of the latch 430_0 in the first stage, and lower side output data is supplied to the clock input ends in the following stages.

Thus, only upper bits are made to operate in the first AD conversion, and all bits are made to operate in the second AD conversion. By adopting such a structure, it is possible to realize double AD conversion processing without increasing the circuit area significantly.

The DA converter 270 generates the reference signal SLP_ADC with a different step width ΔSLP in first and second AD conversion. The counter section 254 of each column operates in synchronization with the counter section 312 of the DA converter 270.

As shown in FIG. 4E, the counter section 254 of each column holds the count value and stops when the reference signal SLP_ADC and the pixel signal voltage Vx to the comparing section 252 become equal, but the counter section 312 of the DA converter 270 operates for full count all the time.

Counter Up/Down means switching between an up-count operation and a down-count operation in the counter section 254.

As control of the counter section 254, first, in the first AD conversion processing, down-count control is set at the time of P phase processing for AD conversion of the reset level Srst and up-count control is set at the time of D phase processing for AD conversion of the signal level Ssig. After the completion of P phase processing, a counter latch signal LT is supplied to the first data storage section 256P of the data storage section 256 so that the count data (−Drst is shown) held in the counter section 254 is held in the first data storage section 256P, and then a counter reset signal is supplied to the counter section 254 so that the data held in the counter section 254 is reset.

After the completion of D phase processing, the counter latch signal LT is supplied to the second data storage section 256D of the data storage section 256 so that the count data (indicating Drst+Dsig) held in the counter section 254 is held in the second data storage section 256D, and then a counter reset signal is supplied to the counter section 254 so that the data held in the counter section 254 is reset.

In addition, for both the P and D phases, the second AD conversion is performed in an opposite mode to the first AD conversion. That is, control is performed such that counting is executed in the opposite direction to the first AD conversion. In the second AD conversion, the count operation is performed using the count data acquired in the first processing as a start point without resetting the counter section 254.

In this case, the count operation period control section 253 controls the counter section 254 using a result of comparison between the counter value held in the counter section 254 of each column and the counter value of the counter section 312 of the DA converter 270 at the time of the second AD conversion. Specifically, the counter section 254 of each column does not operate at first. When the count value of the counter section 312 and the value held in the counter section 254 of each column become equal, the counter section 254 activates all latches 430 of the counter section 254 to start counting. In this example, the digital comparator 410 outputs an H level when the second reference signal SLP_ADC in the second processing reaches the level SLPb which specifies an upper limit Db of one LSB of N−M bit precision including a level at which the pixel signal voltage Vx and the reference signal SLP_ADC are equal. The second AD conversion ends when the pixel signal voltage Vx and the reference signal SLP_ADC become equal.

In addition, in this example, it is necessary to hold an AD conversion result of the P phase level (reset level Srst) and an AD conversion result of the D phase level (signal level Ssig) separately in order to perform digital CDS. For this reason, the data storage section 256 is configured to include latches for two rows.

In addition, in the case where the configuration shown in FIG. 4A is not adopted, the AD conversion section 250 also performs CDS processing by performing the count operation using the count data acquired in P phase processing as a start point, without resetting the counter section 254, when shifting from P phase processing to D phase processing. On the other hand, in the present embodiment, it is necessary to determine when to start the second D phase processing for every column. In the configuration shown in FIG. 4A, the determination is performed by using a method of comparing the value held in the counter section 254 of each column with the output value of the counter section 312 which generates the reference signal SLP_ADC. For this reason, it is necessary to reset the counter section 254 when shifting from P phase processing to D phase processing. If the count of D phase is started in the opposite direction from the P phase processing result, the start timing of the second D phase processing becomes unsuitable.

Thus, in the first embodiment, AD conversion of different AD conversion resolution (number of bits) is performed twice on the analog output of each of the reset level Srst and the signal level Ssig. In double AD conversion, AD conversion of low resolution (small number of bits) is performed in the first AD conversion in order to coarsely search a first range where the signal voltage exists, and AD conversion of high resolution (large number of bits) is performed in the second AD conversion in order to convert the signal voltage into the digital value with high precision. For example, when the AD conversion resolution of 12 bits is necessary, the first AD conversion is performed with precision of 8 bits and the second AD conversion is performed with precision of 12 bits.

In the first embodiment, in order to change the resolution of double AD conversion, the reference signal SLP_ADC with the different step width ΔSLP (staircase wave) is used. That is, in the double AD conversion, the reference signal SLP_ADC which has a large voltage step width ΔSLP1 and a staircase wave shape is used in the first AD conversion in order to coarsely search a range where the signal voltage exists, and the reference signal SLP_ADC which has a small voltage step width ΔSLP2 and a staircase wave shape is used in the second AD conversion in order to convert the signal voltage into the digital value with high precision. The reference signals SLP_ADC used in the first and second AD conversion are made to change in opposite directions.

By controlling a period, for which the counter section 254 operates in the second AD conversion, for every column referring to the first AD conversion result, the period for which the counter section 254 actually operates can be shortened without decreasing the precision of AD conversion. As a result, the power consumption can be reduced. In the above example, it is a total of 272 counts including 256 counts in the case of full count of 8 bits and 16 (4096/256) counts which are to operate actually in the counter at the time of 12-bit operation. Therefore, compared with 4096 counts at the time of full count of 12 bits, the counter operation can be significantly reduced.

Second Embodiment

Figure 5A:
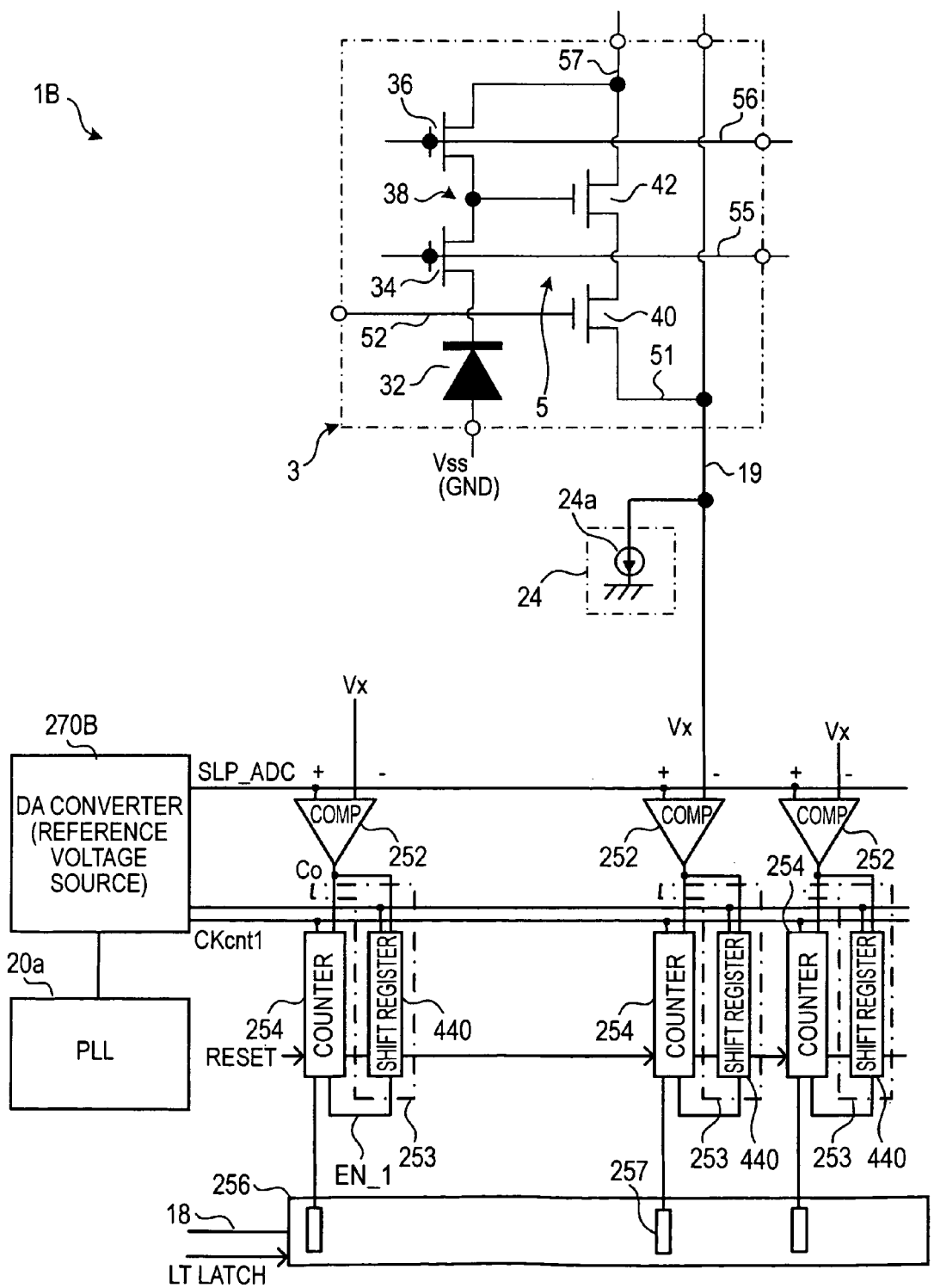
FIG. 5A is a view showing the simple circuit configuration of a solid state imaging device according to a second embodiment when AD conversion processing and CDS processing are taken into consideration.
Figure 5B:
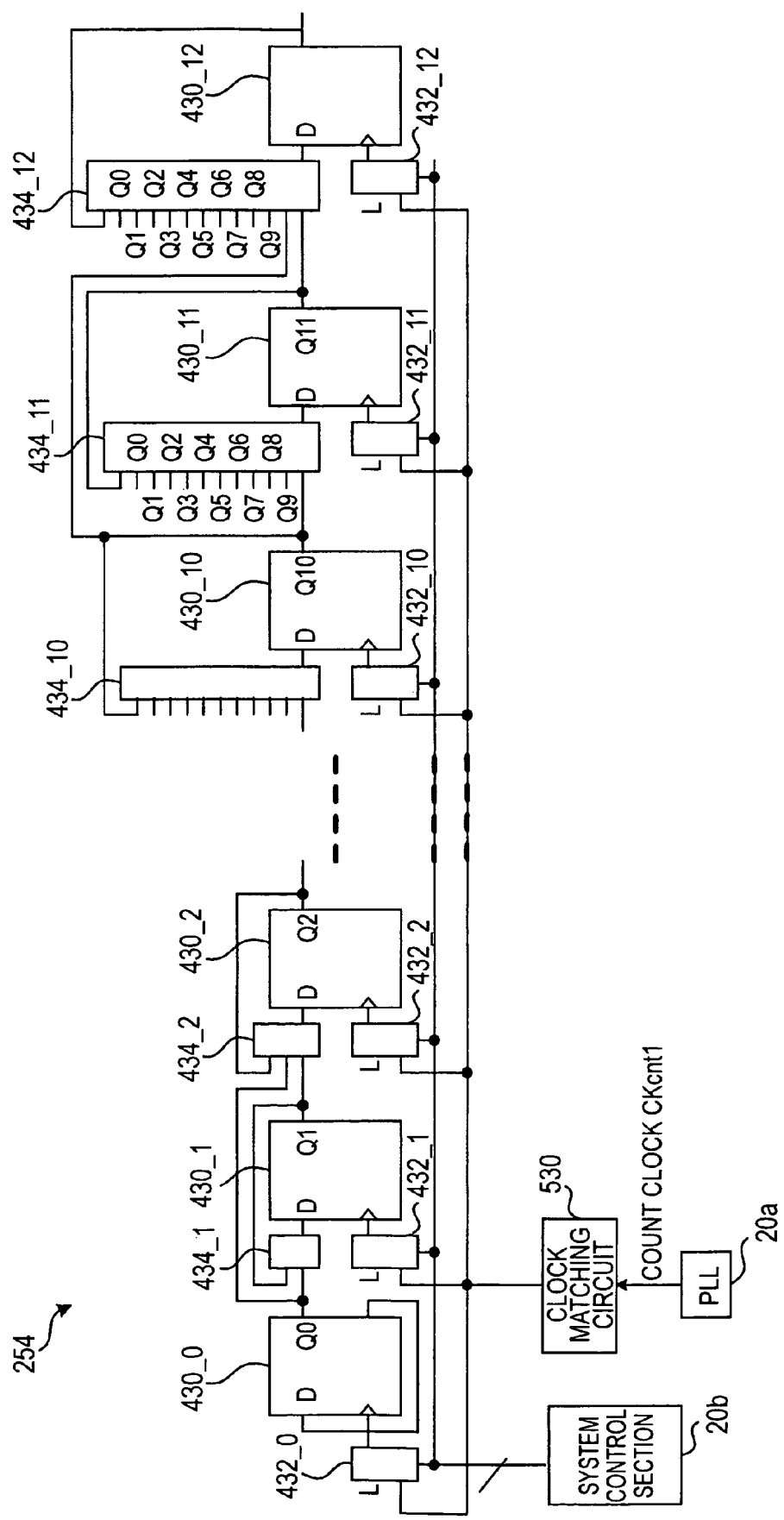
FIG. 5B is a view showing an example of the configuration of a counter section used in the solid state imaging device according to the second embodiment.
Figure 5C:
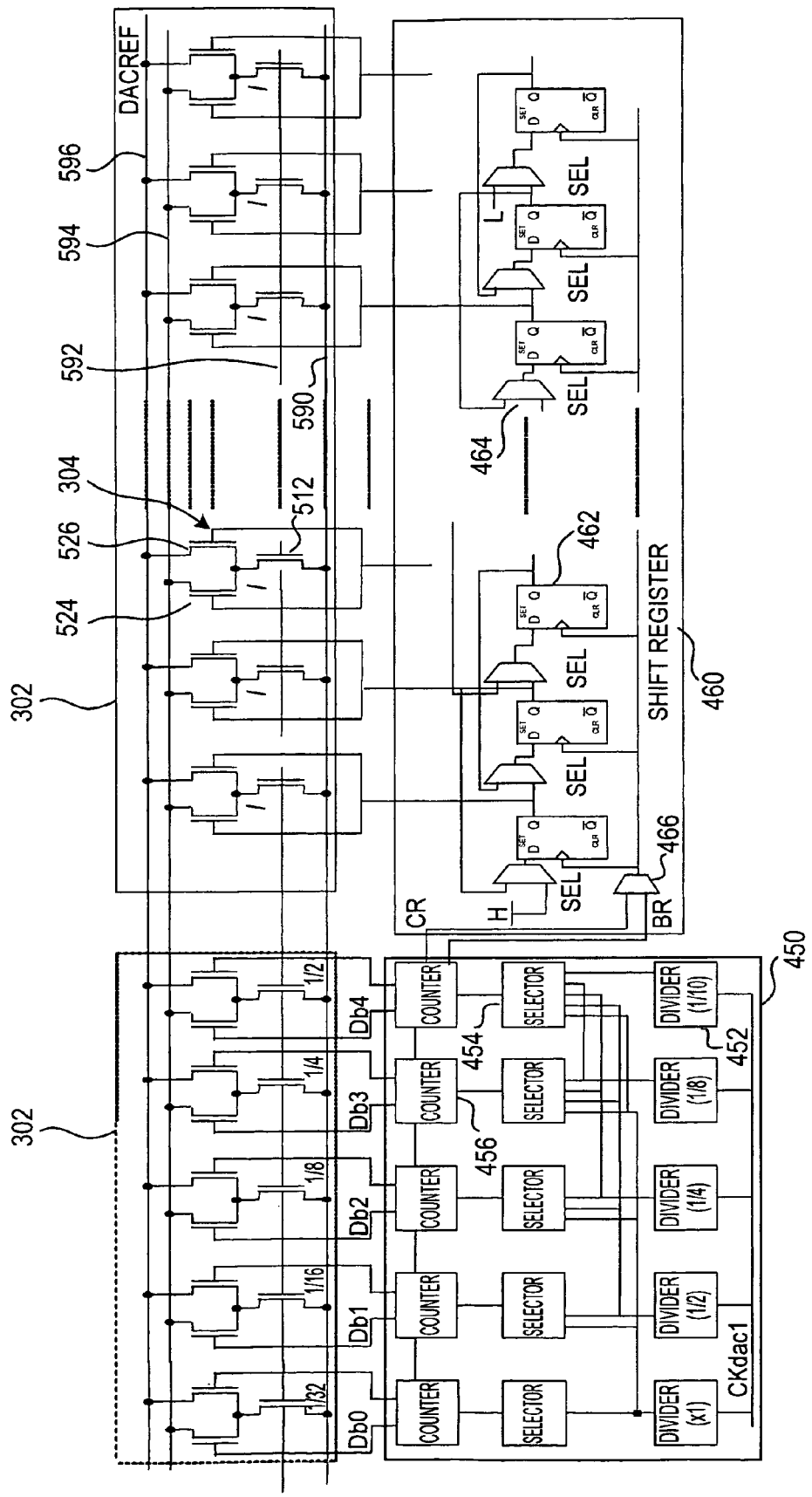
FIG. 5C is a view showing an example of the configuration of a reference signal generating section (DA converter) used in the solid state imaging device according to the second embodiment.
Figure 5E:
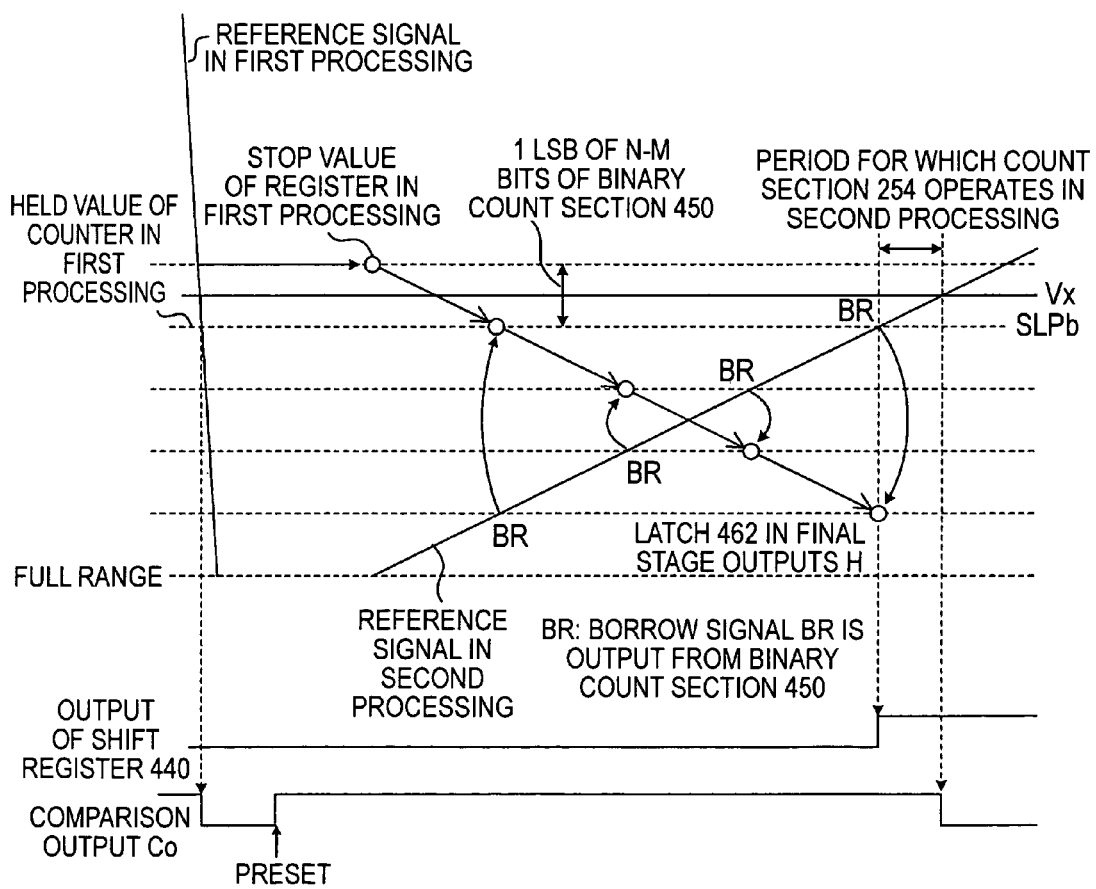
FIG. 5E is a view illustrating an operation of the count operation period control section in the second embodiment.
Figure 5G:
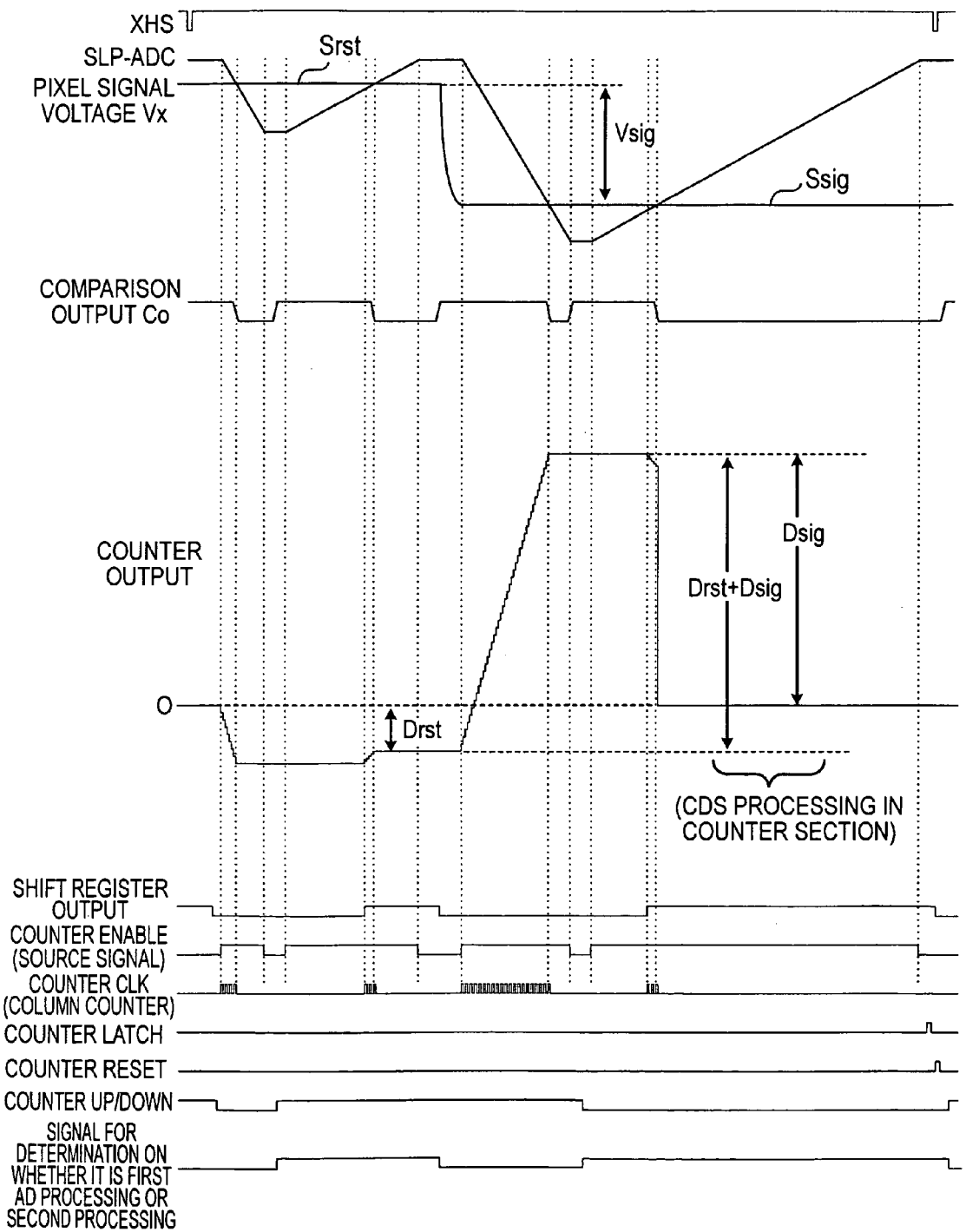
FIG. 5G is a timing chart illustrating double AD conversion operations in the solid state imaging device according to the second embodiment.

FIGS. 5A to 5G are views showing a second embodiment. Here, FIG. 5A is a view showing the simple circuit configuration of a solid state imaging device 1B according to the second embodiment when AD conversion processing and CDS processing are taken into consideration. FIG. 5B is a view showing an example of the configuration of a counter section used in the solid state imaging device according to the second embodiment. FIG. 5C is a view showing an example of the configuration of the reference signal generating section 27 (DA converter 270B) used in the solid state imaging device 1B according to the second embodiment. FIGS. 5D to 5F are views showing the details of the count operation period control section 253 in the second embodiment. FIG. 5D shows an example of the configuration, and FIGS. 5E and 5F are views showing an operation. FIG. 5G is a timing chart illustrating double AD conversion operations in the solid state imaging device 1B according to the second embodiment.

Also in the second embodiment, AD processing is performed twice similar to the processing shown in FIG. 3C. Also in the second embodiment, staircase waves with different step widths in the first and second AD conversion are used as the reference signal SLP_ADC.

As shown in FIG. 5A, the AD conversion section 250 includes a shift register 440 in parallel with the counter section 254 for every column. In this configuration example, the shift register 440 is formed as a main part of the count operation period control section 253. The data storage section 256 is configured to include a latch 257 for one row unlike the first embodiment. A structure of completing the CDS processing by the count mode change function of the counter section 254 is adopted.

The counter section 254 in the second embodiment is of a synchronous type instead of an asynchronous type. As an example, as shown in FIG. 5B, a synchronous configuration is adopted in which the count clock CKcnt1 after gate processing in the clock matching circuit 530 is supplied in common to clock ends of latches in respective stages which form the counter section 254. An inverted output of a synchronous latch 430_0 in the first stage is supplied to a D input end, and a combination circuit 434 with a configuration corresponding to each interstage is disposed between stages of the remaining latches 430. To each combination circuit 434, an output of each latch 430 in the preceding stage and an output of each latch 430 in the following stage are input. An output of the combination circuit 434 is supplied to a D input end of the latch 430 in the following stage.

Also in this case, the selector 432 which changes the supply destination of the count clock CKcnt1 in first and second processing is provided. In the first processing, in order to acquire the data corresponding to upper bits, the count clock CKcnt1 after gate processing is supplied only to latches for upper bits. Latches on the lower side do not operate because there is no clock input. Accordingly, the power consumption can be reduced. In the second processing, the count clock CKcnt1 is supplied to all latches.

From points of view of circuit structure, processing speed, resolution, and the like, a method of dividing a multi-bit digital input signal into upper bits and lower bits is used in the DA converter 270B in the second embodiment. On the lower bit side, a current source cell with a current value obtained by giving a weight of one over power of 2 to a current source cell on the upper bit side is prepared and a current source cell is selected with the lower bit value of a multi-bit digital input signal. On the upper bit side, a number of current source cells which are uniformly weighted is prepared, and an analog current output corresponding to the digital input signal value is obtained by mixing the output currents by specifying a current source cell activated on the basis of a carry signal CR or a borrow signal BR from the lower bit side.

For example, as shown in FIG. 5C, the counter section 312 for generating the reference signal SLP_ADC has a shift register 460 which performs current control on the lower bit side and a binary count section 450 which performs current control on the upper bit side. The binary count section 450 has a frequency divider 452, a selector 454, and a counter 456 so as to be suitable o that a part for the heavy attachment response of a bit may be suited. The current source section 302 has a binary block, which includes constant current sources 304 that are weighted ($\frac{1}{2}$, ... $\frac{1}{32}$ in the drawing) for the current value I according to the bit, and a thermo block, which includes the constant current sources 304 for which the same weight "1" is set.

Each constant current source 304 (current source cell) has an NMOS type transistor 512, which forms a unit current source, and a changeover switch which changes the output current of the unit current source. The changeover switch is formed by differential connection of two NMOS type transistors 524 and 526. A source terminal of the transistor 512 is connected to an analog ground line 590, and a drain terminal of the transistor 512 is connected in common to source terminals of the transistors 524 and 526. To a gate terminal of the transistor 512, a bias voltage applied in common to all cells is applied from a gain change section 336 (voltage amplitude control section) through a current control line 592 in a current mirror method. The value of the current flowing through the transistor 512 is influenced by the potential difference Vgs.

Complementary control signals Qin and xQin (x indicates a logic inversion signal) are input to gate terminals of the two transistors 524 and 526 which form a changeover switch, respectively. Lead lines 594 and 596 are connected to drain terminals of the two transistors 524 and 526, respectively. For example, the control signal (non-inverting input) Qin of active H is input to the gate terminal of the transistor 524, the drain terminal of the transistor 524 is connected to the lead line 594, and the lead line 594 is connected with a resistor 340 for current and voltage conversion. The control signal (inverted input) xQin is input to the gate terminal of the transistor 526, the drain terminal of the transistor 526 is connected to the lead line 596, and the lead line 596 is connected with a reference power supply DACRE (for example, the reference power Vref of the resistor 340). As a whole, the active H is input as the control signal (non-inverting input) Qin to the lead line 594 regarding D/A conversion, the transistor 524 is turned on, and the current source cell is turned on.

Although not described in detail herein, the reason why differential connection between the transistors 524 and 526 is made and the output sides are connected to the lead lines 594 and 596, respectively, is to prevent the level instability of the reference signal SLP_ADC cause by the occurrence of glitch and the like.

A part corresponding to the weight of each bit of the frequency divider 452, the selector 454, and the counter 456 in the binary count section 450 can be matched with each weight of the binary block of the current source section 302. The shift register 460 includes latches 462 (D flip-flop) in a plurality of stages, and each latch 462 is matched with the constant current source 304 in the thermo block of the current source section 302. The binary count section 450 is configured to be able to switch between the up-count operation and the down-count operation in order to reverse the inclination direction of the reference signal SLP_ADC.

As each frequency divider 452 of the binary count section 450 divides the count clock CKdac1, the weight increases to the current source section 302 side. An output of each frequency divider 452 is input to the selector 454 corresponding to its weight and also input to the selector 454 corresponding to the upper weight. The selector 454 operates the corresponding counter 456 when each output level of the frequency divider 452 is H.

In such a configuration, whenever the count value of the counter 456 which controls the binary block side is counted, activation and deactivation of the constant current source 304 with a weight to which the binary block of the current source section 302 corresponds are controlled. In addition, whenever the count value becomes a fixed number (64 count in this example), the carry signal CR or the borrow signal BR is input from the binary count section 450 to the shift register 460. Specifically, the carry signal CR is input to the shift register 460 when the binary count section 450 performs an up-count operation, and the borrow signal BR is input to the shift register 460 when the binary count section 450 performs a down-count operation.

In order that the inclination direction of the reference signal SLP_ADC can be reversed, the shift register 460 is formed to be able to reverse the shift direction in association with the up-count operation or down-count operation of the binary count section 450. As an example, a selector 464 is disposed between the latches 462 (flip-flop), which form a shift register, and a non-inverting output of the latch 462 is supplied to one input end of the selector 464 located one stage before the latch 462. The non-inverting output of the latch 462 is also supplied to the other input end of the selector 464 located between the corresponding stage and the following stage. The other input end of the selector 464 disposed before the latch 462 in the first stage (closest to the binary count section 450) is set to have an H level, and the other input end of the selector 464 disposed before the latch 462 in a final stage is set to have an L level. Moreover, a selector 466 which performs switching between the carry signal CR and the borrow signal BR is provided, and the output is supplied to the clock end of each latch 462.

Although not shown, a control signal CN462RST which resets the non-inverting output end to L at the start of first processing is supplied from the communication and timing control section 20 to the reset end of the latch 462. Although not shown, a control signal CN442SET which presets the non-inverting output end to H at the start of second processing is supplied from the communication and timing control section 20 to the preset end of the latch 462.

By changing an output signal with the selectors 464 and 466, it becomes possible to transfer the shift register 460 in the reverse order. For example, when the binary count section 450 performs an up-count operation, the selector 464 selects the output of the latch 462 in the preceding stage and the selector 466 selects the carry signal CR, such that the output of the latch 462 is set to an H level in order from the first stage side on the basis of the carry signal CR. This is called a transfer in a forward direction. On the other hand, when the binary count section 450 performs a down-count operation, the selector 464 selects the output of the latch 462 in the subsequent stage and the selector 466 selects the borrow signal BR, such that the output of the latch 462 is set to an L level in order from the final stage side on the basis of the borrow signal BR. This is called a transfer in a backward direction.

In this manner, the shift register 460 sets the output of the latch 462 to H (or L) sequentially whenever the carry signal CR or the borrow signal BR is input. As a result, the constant current sources 304 (current value I) in the thermo block of the current source section 302 are controlled to be activated or deactivated in order.

Corresponding to the configuration on a side of such a count phase change section 260, the count operation period control section 253 on a side of the AD conversion section 250 has a shift register 440 for holding the output data of the shift register 460 on a side of the DA converter 270 for every column.

The shift register 440 of each column synchronizes with the shift register 460 in the DA converter 270. It is assumed that a mechanism, which stops the counter section 254 and the shift register 440 of each column when the reference signal SLP_ADC and the pixel signal voltage Vx input to the comparing section 252 of each column become equal in the first AD conversion, is provided.

FIG. 5D shows an example of the configuration of the count operation period control section 253 in the second embodiment which has the shift register 440 as a main component. The shift register 440 includes the latches 442 in a plurality of stages. The number of stages of the shift register 460 on the side of the DA converter 270 is equal to that of each of the latches 442 and 462 of the shift register 440 on the side of the count operation period control section 253. The count operation period control section 253 includes a selector 446, which performs switching between the carry signal CR and the borrow signal BR from the binary count section 450 that is input to the selector 466 of the shift register 460, and supplies the output to the clock end of each latch 462. This is different from those described above in that only transfer in a forward direction is performed with no selector provided between stages unlike the shift register 460 and a selector 448, which stops a shift operation on the basis of the comparison output Co from the comparing section 252, is provided after the selector 446.

A control signal CN442 which resets the non-inverting output end to L at the start of first processing is supplied from the communication and timing control section 20 to the reset end of the latch 442. The determination signal DET for switching between first processing and second processing is supplied from the communication and timing control section 20 to a control input end of the selector 448, the output of the selector 446 is supplied to one input end of the selector 448, and the L level is supplied to the other input end. The shift register 440 inserted for every column operates in response to a signal (carry signal CR or borrow signal BR) from the binary count section 450. Controlling the shift register 460 on the side of the reference signal generating section 27 and the shift register 440 of each column is to make the same signal, and the amount of reduction in the resolution in the first processing becomes the same as the number of bits of the block which is binary-controlled.

When the comparison output Co of the comparing section 252 changes to an L level, the selector 448 stops supply of the output (carry signal CR or borrow signal BR) from the binary count section 450 to the latch 442. Then, the shift register 440 stops the shift operation. The selector 448 functions as a switch which stops a signal from the binary count section 450, and the comparison output Co from the comparing section 252 is for positioning of an enable signal of the shift register 440.

As control of the counter section 254, first, down-count control is set at the time of P phase processing for AD conversion of the reset level Srst and up-count control is set at the time of D phase processing for AD conversion of the signal level Ssig. After the completion of P phase processing, the counter latch signal LT is supplied to the data storage section 256 so that the count data (indicating −Drst) held in the counter section 254 is held. In this case, the held data of the counter section 254 is not reset unlike the first embodiment accordingly, in the D phase AD conversion, the count operation is performed using the count data acquired in the P phase processing as a start point. After the completion of D phase processing, the counter latch signal LT is supplied to the data storage section 256 so that the count data (indicating Drst+Dsig−Drst=Dsig) held in the counter section 254 is held in the data storage section 256, and then a counter reset signal is supplied to the counter section 254 so that the data held in the counter section 254 is reset.

In addition, for both the P and D phases, the second AD conversion is performed in an opposite mode to the first AD conversion. That is, control is performed such that counting is executed in the opposite direction to the first AD conversion. Thus, only upper bits of the counter section 254 are made to operate in the first AD conversion, and all bits are made to operate in the second AD conversion.

When performing the second AD conversion, first, the shift register 440 transmits the values held in the first AD conversion in order. Then, the count operation period control section 253 starts an operation of the counter section 254 from the point of time when the output from the latch 442 in the final stage of the shift register 440 changes to "H". Then, similar to the first embodiment, the second AD conversion ends when the pixel signal voltage Vx and the reference signal SLP_ADC become equal.

For example, FIG. 5E shows an operation example of the shift register 440. When the comparison output Co of the comparing section 252 changes to an L level in first processing, the selector 448 stops supply of the carry signal CR from the binary count section 450 to the latch 442. Then, the shift register 440 stops the shift operation. Accordingly, the output of each latch 442 of the shift register 440 is held in a state when the comparison output Co of the comparing section 252 changes to an L level. On the other hand, the counter section 254 holds the count value after a point of time when the reference signal SLP_ADC becomes equal to the pixel signal voltage Vx (goes too far to stop the count operation). Accordingly, the difference between the output value of the shift register 440 and the count value corresponding to upper N−M bits of the counter section 254 indicates a difference of one LSB of "N−M" bit precision (equal to the number of bits of the block which is binary-controlled).

The binary count section 450 and the shift register 460 continue their operations even after the comparison output Co of the comparing section 252 has changed to the L level and stop after making the reference signal SLP_ADC reach the final value. In the binary count section 450, outputs of all counters 456 stop at the H level. In the shift register 460, however, outputs of all latches 462 do not change to the H level. This is because the inclination per clock in the first processing is M times that in the second processing.

When the second processing starts, each output of the latch 462 in the shift register 460 is preset to the H level, and the opposite operation to the first processing is performed to invert the inclination of the reference signal SLP_ADC. The inclination is set to 1/M of that in the first processing.

In the second processing, the borrow signal BR is supplied from the binary count section 450 to the shift register 440, and the shift register 440 performs a shift operation in the forward direction from the held value in the first processing on the basis of the borrow signal BR. Then, the output of the latch 442 in the final stage of the shift register 440 changes to the H level. The output signal of the latch 442 is treated similar to the output of the digital comparator 410 in the first embodiment, and is used in order to gate the count clock CKcnt1 of the counter section 254. Then, the counter section 254 starts the count operation, such that count processing is performed until the level of the pixel signal voltage Vx and the level of the reference signal SLP_ADC become equal.

Thus, the shift register 440 outputs an H level when the second reference signal SLP_ADC in the second processing reaches the level SLPb which specifies the upper limit Db of one LSB of N−M bit precision including a level at which the pixel signal voltage Vx and the reference signal SLP_ADC are equal. The function of the shift register 440 may be the same as that of the digital comparator 410 in the first embodiment. That is, the shift register 440 is an example of the one LSB level information acquisition section.

Moreover, in practice, it is necessary to consider a point that the amplitude of the reference signal SLP_ADC used for AD conversion is different in P and D phases. FIG. 5F is a view illustrating this point. For example, in the P phase, it is assumed that the amplitude is ¼ of that in the D phase. In addition, it is assumed that the number of shift registers 440 is 12.

First, for the D phase, as shown in (1) of FIG. 5F, the case is considered in which the comparison output Co of the comparing section 252 is inverted when it has progresses to the eighth shift register 440 in first AD conversion. A hatched portion in the drawing is a latch 442 which holds "1". When sequential transfer is performed in the latches 442 of the shift register 440 at the start of second AD conversion, it is not necessary to operate the latch 442 in which "0" is held, and the counter operation preferably starts when "1" appears in the final stage.

Next, consideration for the P phase will be made as shown in (2) of FIG. 5F. From the above assumption, the maximum amplitude of the reference signal SLP_ADC in the P phase is equivalent to the three latches 442 in the shift register 440. Now, the case will be considered in which in the first AD conversion of the P phase, the comparison output Co of the comparing section 252 is inverted when "1" is input to the second latch 442.

Similar to the case of D phase, when the transfer operation starts simultaneously with the start of second AD conversion, transfer of ten stages is necessary for the latch 442 in order to make "1" appear as the output first. However, the portion in which the output of "1" is actually preferable is after one stage of the latch 442 when two stages of a period until the comparison output Co is inverted is subtracted from three stages of P phase amplitude.

For consistency, it is necessary to transfer the shift register 440 (latch 442) beforehand by the amplitude difference of P and D phases between the first AD conversion and the second AD conversion.

For this reason, as shown in FIG. 5G, an operation period of the shift register 440 is added to the timing chart in the first embodiment. However, in terms of the entire operation, it is the same as in the first embodiment.

In the second embodiment, the configuration of the DA converter 270 or the count operation period control section 253 is different from that in the first embodiment. However, since the basic operation for changing the resolution in double AD conversion is realized by inclination control of the reference signal SLP_ADC, the second embodiment is equal to the first embodiment.

Third Embodiment

FIG. 6 is a timing chart illustrating double AD conversion operations in a solid state imaging device 1C according to a third embodiment. The configuration of the solid state imaging device 1C may be the same as that of the solid state imaging device 1A according to the first embodiment or the solid state imaging device 1B according to second embodiment. Here, the solid state imaging device 1C which has the same configuration as the solid state imaging device 1B according to the second embodiment is used.

In the third embodiment, AD processing is performed twice similar to the processing shown in FIG. 3E. Although the reference signal SLP_ADC with the same inclination (step width ΔSLP) is used in first and second AD conversion, the frequency of the count clock CKcnt1 that the counter section 254 uses is changed in the first and second AD conversion. The AD conversion resolution (number of bits) in the first and second processing is changed by changing the clock frequency of the counter section 254 without changing the step width ΔSLP which specifies the reference signal SLP_ADC.

FIG. 6 shows a timing chart in the case where this driving method is used in the solid state imaging device 1C with the same configuration as the solid state imaging device 1B according to the second embodiment. In this driving, a low clock frequency is used in the first AD conversion and a high clock frequency is used in the second AD conversion.

For example, in the case where the first AD conversion is performed with 8-bit precision and the second AD conversion is performed with 12-bit precision, a clock with a speed of 16 times the clock frequency in the first AD conversion is used as the clock frequency in the second AD conversion. Also in this driving, only upper bits of the counter are made to operate in the first AD conversion, and all bits are made to operate in the second AD conversion.

Thus, in the third embodiment, in order to change the resolution of double AD conversion, the inclination of the reference signal SLP_ADC is made equal and the frequency of the count clock CKcnt of the counter section 254 is changed (high frequency is used in the second processing). For every column, a period for which the counter section 254 operates in the second AD conversion is controlled by referring to the first AD conversion result. This is the same as the first and second embodiments in that the power consumption can be reduced by shortening a period for which the counter section 254 actually operates without decreasing the precision of AD conversion.

Imaging Apparatus

Fourth Embodiment

Figure 7:
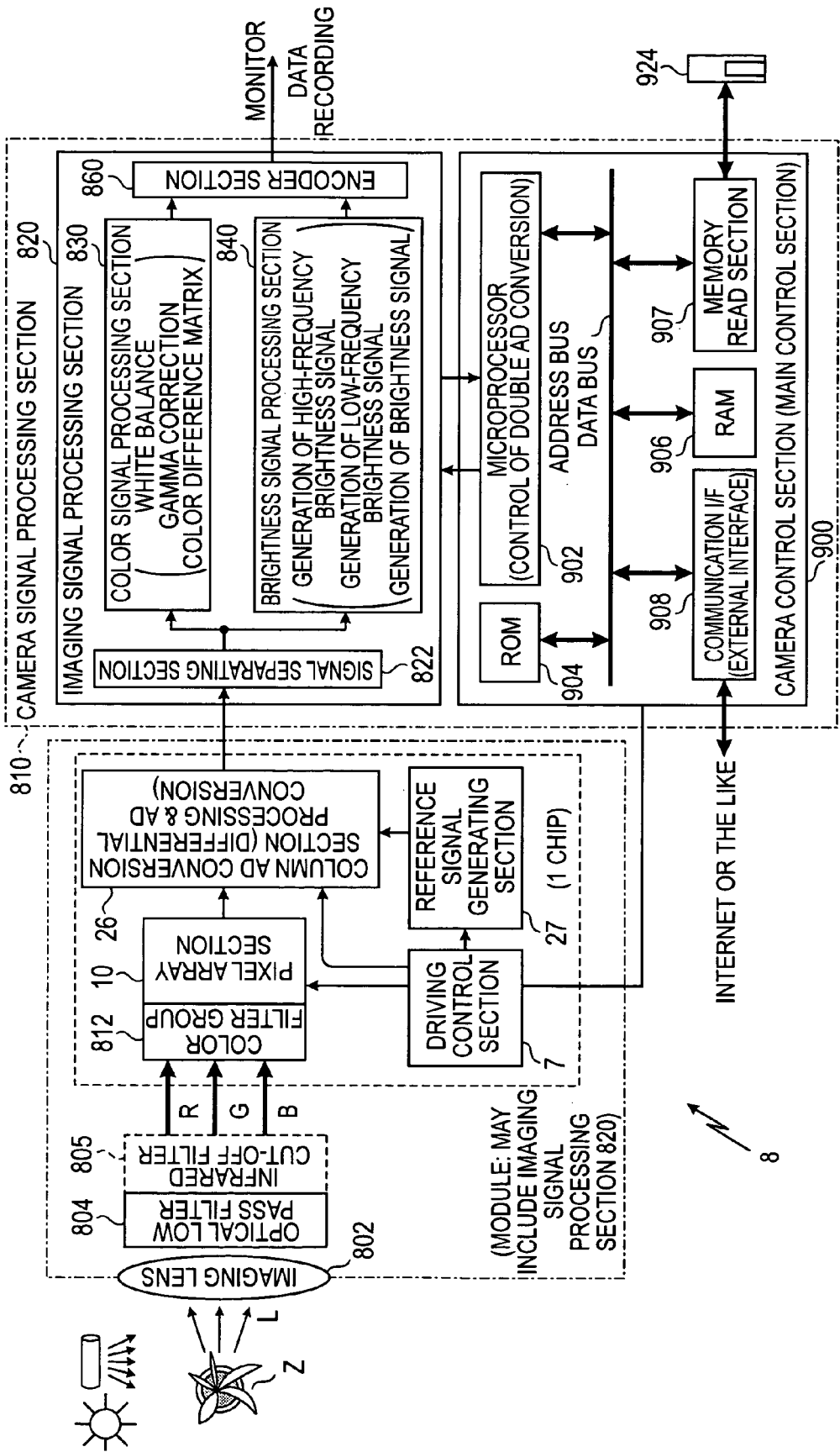
FIG. 7 is a view illustrating an imaging apparatus according to a fourth embodiment.

FIG. 7 is a view showing an imaging apparatus according to a fourth embodiment. In the fourth embodiment, the structure for AD conversion processing adopted in the solid state imaging device 1 according to each of the embodiments described above is applied to an imaging apparatus which is an example of a physical information acquisition apparatus. FIG. 7 is a view showing the schematic configuration of the imaging apparatus 8. Main components of the imaging apparatus 8 are as follows (other components will not be described).

The imaging apparatus 8 includes an imaging lens 802, an optical low pass filter 804, a color filter group 812, a pixel array section 10, a driving control section 7, a column AD conversion section 26, a reference signal generating section 27, and a camera signal processing section 810. As shown by a dotted line in FIG. 7, an infrared cut-off filter 805 for reducing an infrared component may also be provided so as to be combined with the optical low pass filter 804. The camera signal processing section 810 provided behind the column AD conversion section 26 includes an imaging signal processing section 820 and a camera control section 900 functioning as a main control section that controls the entire imaging apparatus 8. The imaging signal processing section 820 includes a signal separating section 822, a color signal processing section 830, a brightness signal processing section 840, and an encoder section 860.

The camera control section 900 in the present embodiment includes: a microprocessor 902, a ROM (Read Only Memory) 904 which is a storage section for read only, a RAM (Random Access Memory) 906, and other peripheral members not shown in the drawing. The microprocessor 902 is a core section of a computer, a representative example of which is a CPU (Central Processing Unit) in which functions of operations and controls performed by the computer are integrated in a micro integrated circuit. The RAM 906 is an example of a volatile storage section in which writing and reading are possible when necessary. The microprocessor 902, the ROM 904, and the RAM 906 are collectively called a microcomputer.

The camera control section 900 controls the entire system. In connection with the double AD conversion processing in the present embodiment, the camera control section 900 has a function of adjusting the frequencies of the count clocks CKcnt1 and CKdac1, the inclination of the reference signal SLP_ADC, and the like. A control program of the camera control section 900 is stored in the ROM 904. Particularly in this example, a program for controlling normal reference signal comparing type AD conversion processing and double AD conversion by the camera control section 900 is stored in the ROM 904. Data and the like necessary when the camera control section 900 performs various kinds of processing are stored in the RAM 906.

The camera control section 900 is configured such that a recording medium 924, such as a memory card, can be inserted thereinto or detached therefrom and is also configured to be able to be connected with a communication network, such as the Internet. For example, the camera control section 900 includes a memory read section 907 and a communication I/F (interface) 908 in addition to the microprocessor 902, the ROM 904, and the RAM 906.

For example, the recording medium 924 is used to register program data, which is used to cause the microprocessor 902 to execute software processing, or various data such as set values of various kinds of control information for double AD conversion processing and exposure control processing (including an electronic shutter control) or a convergence range of photometric data DL based on a brightness signal from the brightness signal processing section 840. The memory read section 907 stores (installs) the data read from the recording medium 924 in the RAM 906. The communication I/F 908 performs transmission and reception of the communication data between a communication network, such as the Internet, and the camera control section 900.

In addition, the imaging apparatus 8 is shown in a module shape in which the driving control section 7 and the column AD conversion section 26 are formed separately from the pixel array section 10. However, as described for the solid state imaging device 1, it is needless to say that the imaging apparatus 8 may use the solid state imaging device 1 in the form of one chip in which the driving control section 7 and the column AD conversion section 26 are integrally formed on the same semiconductor substrate as the pixel array section 10. In the drawing, the imaging apparatus 8 is shown under the conditions in which an optical system, such as the imaging lens 802, the optical low pass filter 804, and the infrared cut-off filter 805, is also included in addition to the pixel array section 10, the driving control section 7, the column AD conversion section 26, the reference signal generation section 27, and the camera signal processing section 810. This is suitable for a case of adopting a shape of a module which has an imaging function and in which the above-described components are collectively packaged. Such an imaging apparatus 8 is provided, for example, as a camera or a portable apparatus having an imaging function, which is used to perform 'imaging'. In addition, the 'imaging' includes not only imaging of an image at the time of normal camera shot but also detection of a fingerprint as a broad sense of meaning.

Also in the imaging apparatus 8 with such a configuration, the structure capable of suppressing the power consumption by shortening the counter operation period can be realized by performing AD conversion processing twice on the pixel signal voltage Vx. In this case, regarding the control in connection with double AD conversion processing, such as at least frequency setting of the count clocks CKcnt1 and CKdac1 and inclination setting of the reference signal SLP_ADC, an external main control section (camera control section 900) is set to be able to arbitrarily designate the instruction information for control by data setting for the communication and timing control section 20. Control of the normal reference signal comparing type AD conversion processing in which AD conversion processing is not performed twice may also be performed.

Application to an Electronic Apparatus

Fifth Embodiment

Figure 8:
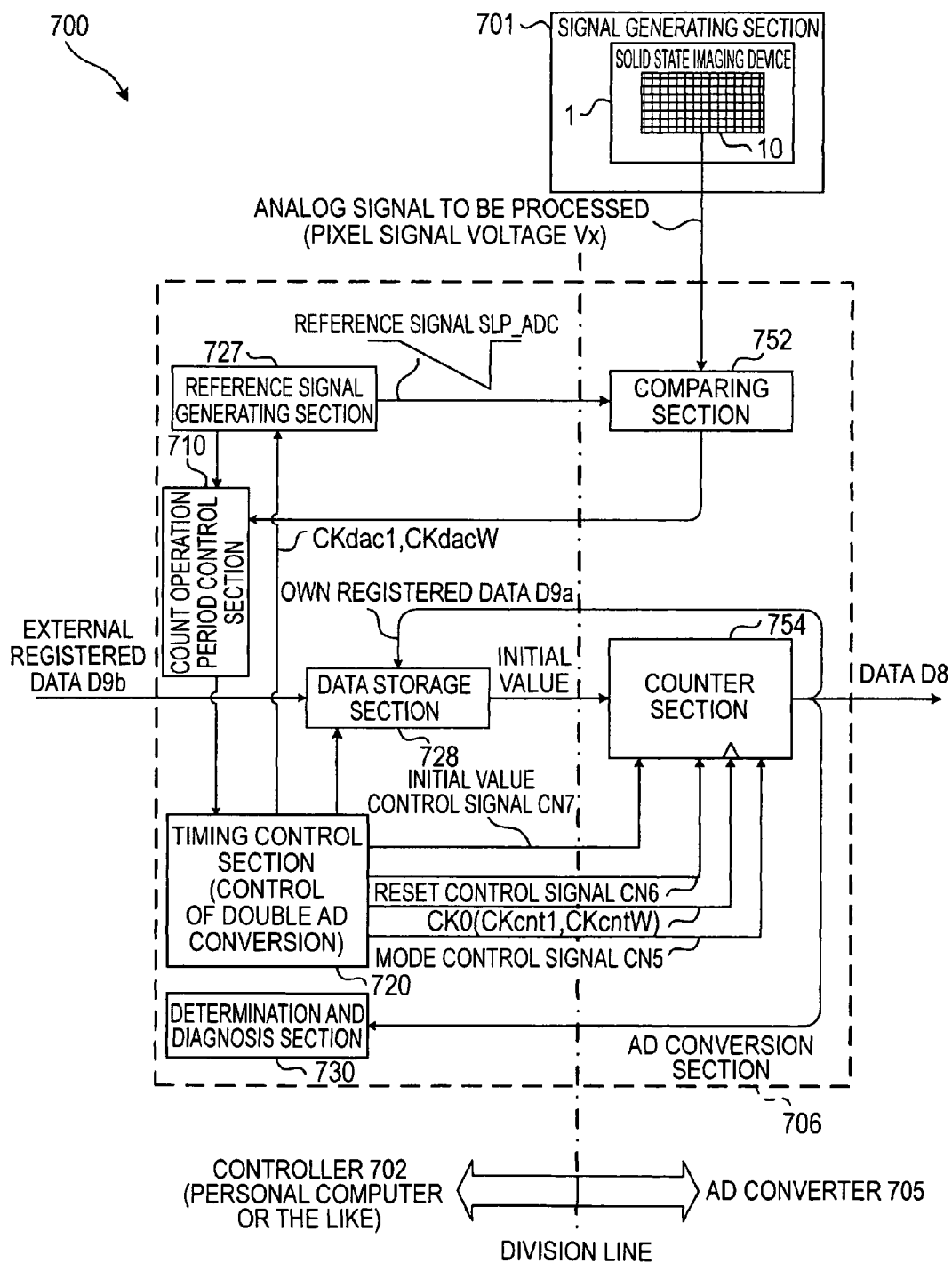
FIG. 8 is a view illustrating an electronic apparatus according to a fifth embodiment.
Figure 9B:
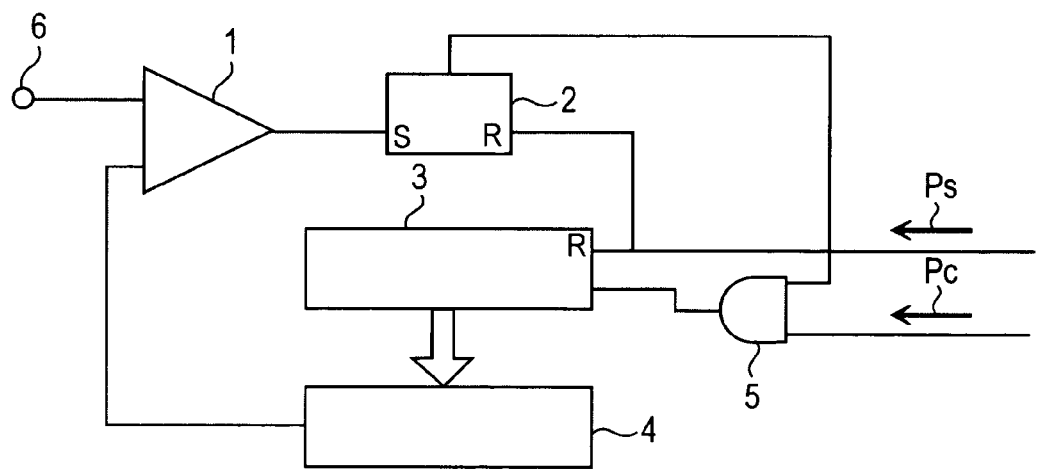
FIG. 9B is a view showing the structure disclosed in JP-A-56-096527.
Figure 9D:
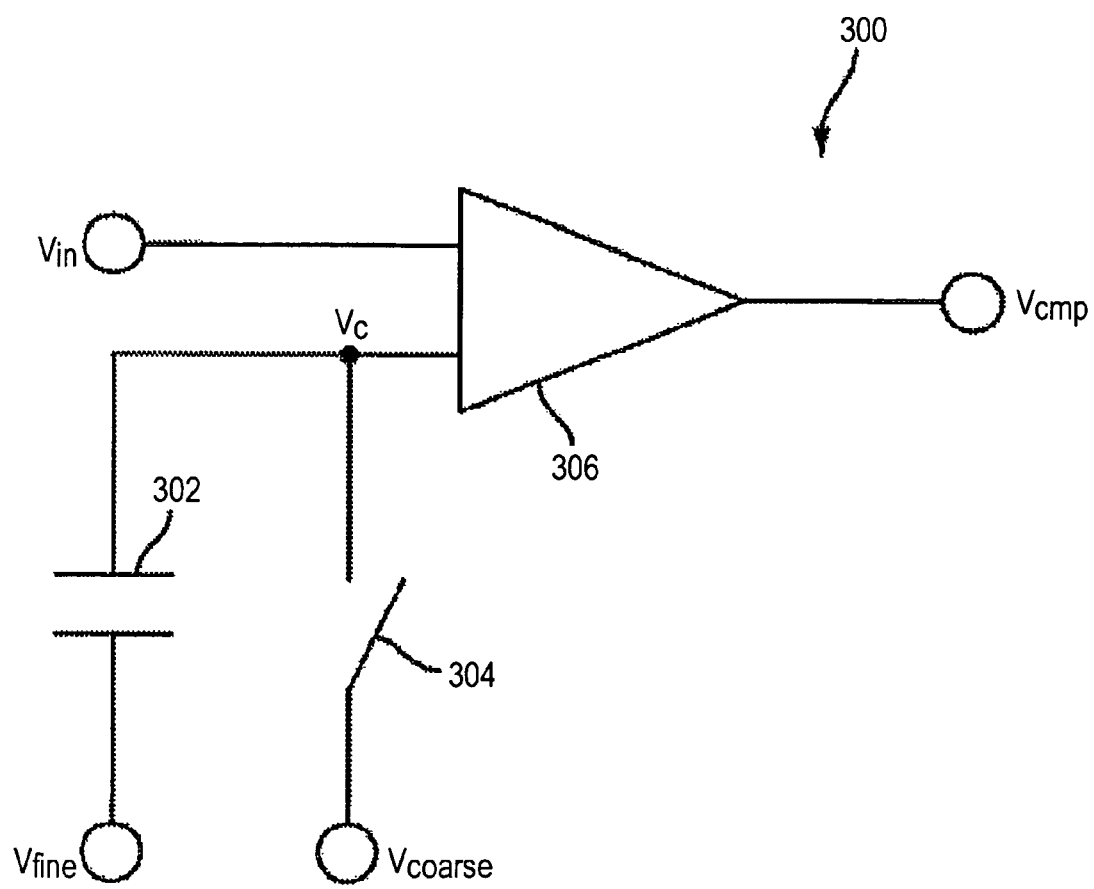
FIG. 9D is a view showing the structure disclosed in U.S. Pat. No. 6,670,904.

FIG. 8 is a view illustrating an electronic apparatus according to a fifth embodiment. In the fifth embodiment, the structure for AD conversion processing adopted in the solid state imaging device 1 according to each of the embodiments described above is applied to an electronic apparatus. That is, in the fifth embodiment, the case is shown in which an AD conversion processing method or an AD conversion processor according to the embodiment of the invention is applied to an electronic apparatus other than the solid state imaging device. FIG. 8 is a view showing the schematic configuration of an electronic apparatus.

In the first to fourth embodiments, the examples have been explained in which in the reference signal comparing type AD conversion processing, AD conversion processing is performed twice on the same signal in the solid state imaging device 1 or the imaging apparatus 8. However, the application range is not limited to the solid state imaging device and the like. The double AD conversion processing based on the reference signal comparing type AD conversion processing may be applied to all kinds of electronic apparatuses for which a structure of acquiring the AD conversion data is necessary. Also in the electronic apparatus, the power consumption can be reduced by performing AD conversion processing twice for at least one signal to be processed.

An electronic apparatus 700 shown in the drawing has various processing functions based on product and sum operation results, such as diagnosing the defective pixel of the solid state imaging device 1 or performing moving body detection processing. Main components of the imaging apparatus 8 are as follows (other components will not be described). For example, first of all, the electronic apparatus 700 includes a signal generating section 701 which generates an analog signal to be processed. The signal generating section 701 uses the pixel signal voltage Vx, which is output from the pixel array section 10 of the solid state imaging device 1, as a signal to be processed. That is, also in the present embodiment, the signal to be processed is assumed to be the pixel signal (pixel signal voltage Vx) output from the pixel array section 10 of the solid state imaging device 1, similar to the first to fourth embodiments. However, this is only an example. Any signal may be used without being limited to the pixel signal as long as they have the same physical property suitable for product and sum operations.

The electronic apparatus 700 includes a controller 702 such as a personal computer, which is disposed on the left side of a division line shown in the middle of the drawing and which controls the entire operation of the electronic apparatus 700, and an AD converter 705 disposed on the right side of the division line. The pixel signal voltage Vx is supplied from a signal generating section 701 to the AD converter 705. In addition, instead of dividing the electronic apparatus into the controller 702 and the AD converter 705 with a division line, it is possible to form one AD conversion section 706 (AD converter) which includes both the controller 702 and the AD converter 705 and which has a function of a data processor which obtains the digital data of product and sum operation results between a plurality of signals.

The AD conversion section 706 (AD converter 705) has a comparing section 752 and a counter section 754. The comparing section 752 converts an analog pixel signal acquired from the signal generating section 701 (solid state imaging device 1) into digital data. The comparing section 752 corresponds to the comparing section 252, and the counter section 754 corresponds to the counter section 254. Their basic operations are the same as those of the comparing section 252 and counter section 254 in the first to third embodiments.

As functional components for controlling the AD converter 705, the controller 702 includes: a reference signal generating section 727 which supplies a reference voltage for AD conversion to the comparing section 752; a count operation period control section 710 which controls the operation period of the counter section 754 in each processing on the basis of a comparison result of the comparing section 752 or the count operation situation in the reference signal generating section 727; and a timing control section 720 which controls the reference signal generating section 727 or the counter section 754 while referring to the count enable signal EN from the count operation period control section 710. The count operation period control section 710 corresponds to the count operation period control section 253, the timing control section 720 corresponds to the communication and timing control section 20, and the reference signal generating section 727 corresponds to the reference signal generating section 27. Their basic operations are the same as those of the communication and timing control section 20, reference signal generating section 27, and count operation period control section 253 in the first to third embodiments.

The controller 702 includes a data storage section 728 which holds the data of one to be subjected to product and sum operations and a determination and diagnosis section 730 with a function of diagnosing the solid state imaging device 1 or performing other decision processing on the basis of data D8 of product and sum operation results obtained in the counter section 754.

In order to realize the function of diagnosing a defective pixel of the solid state imaging device 1 in such a configuration of the electronic apparatus 700, normal pixel data (called normal data; there is no pixel defect) as a comparison object of the solid state imaging device 1 is first acquired, a pixel signal is then read from the solid state imaging device 1 to be diagnosed, differential processing is performed between the normal data and the pixel signal, and the existence of a defect is diagnosed on the basis of the result. As a pixel defect, it is preferable to diagnose a defect when it is dark and a defect when it is bright, for example. In order to diagnose a defect when it is dark, acquisition and diagnosis of the normal data are performed under the condition where the solid state imaging device 1 is in a non-exposed state. In order to diagnose a defect when it is bright, acquisition and diagnosis of the normal data of the solid state imaging device 1 are performed in the entirely white photographing state, for example. In this case, the double AD conversion processing described in the first to third embodiments is performed.

In the case where the electronic apparatus 700 is used to diagnose a pixel defect, differential processing of pixel data is performed between a normal device and a device to be diagnosed using the AD conversion section 706 formed by combination of the comparing section 752 and the counter section 754. By applying the double AD conversion processing to the digital data indicating the difference of an actual state with respect to a normal state, similar to those described in the first to third embodiments, when performing AD conversion on a pixel signal in the actual state, pixel defect diagnosis can be performed with the same bit precision as in the related art while shortening the operation period of the counter section and suppressing the power consumption.

In addition, although an example of application to the pixel defect diagnosis has been described herein, the application example of the double AD conversion processing is not limited thereto. For example, in order to realize a moving body detection function, the pixel signal voltage Vx of a current frame is read from the solid state imaging device 1, differential processing is performed between the pixel signal voltage Vx of the current frame and the pixel signal voltages Vx of a previous frame, and a moving body is detected on the basis of the result. In this case, by applying the double AD conversion processing, the moving body detection data can be acquired with the same bit precision as in the related art while shortening the operation period of the counter section and suppressing the power consumption.

The present application contains subject matter related to that disclosed in Japanese Priority Patent Application JP 2009-089787 filed in the Japan Patent Office on Apr. 2, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid state imaging device comprising:
an AD conversion section that has a comparing section, which receives a reference signal whose level changes gradually from a predetermined reference signal generating section that generates the reference signal and which compares the reference signal with an analog signal to be processed, and a counter section, which receives a count clock for AD conversion and performs a count operation on the basis of a comparison result of the comparing section, and that acquires digital data of the signal to be processed on the basis of output data of the counter section;
a count operation period control section that controls an operation period of the counter section in each processing on the basis of the comparison result of the comparing section; and
a driving control section that controls the reference signal generating section and the AD conversion section such that for the signal to be processed, data of upper N−M bits is acquired by performing AD conversion processing with N−M bit precision in first processing and data of lower M bits is acquired by performing AD conversion processing with N bit precision for one LSB of N−M bit precision, which is difficult to resolve with N−M bit precision in the first processing, in second processing,
wherein the driving control section controls the reference signal generating section such that the reference signal changes in a full range of AD conversion in both the first and second processing, and
the count operation period control section operates the counter section, in the first processing, in a first-half period of the full range of AD conversion until the comparison result of the comparing section is inverted or a second-half period of the full range of AD conversion after the comparison result of the comparing section is inverted and operates the counter section, in the second processing, in a period between a point of time when the reference signal reaches a level equivalent to a lower limit or upper limit of one LSB of N−M bit precision to which AD-converted data of the signal to be processed belongs and a point of time when the comparison result of the comparing section is inverted.

2. The solid state imaging device according to claim 1, wherein the count operation period control section has a one LSB level information acquisition section that acquires information, which specifies the level of the reference signal equivalent to the lower limit or upper limit of one LSB of N−M bit precision to which the AD-converted data of the signal to be processed belongs, when the comparing section detects that the reference signal and the signal to be processed have become equal in the first processing, and
the driving control section operates the counter section during a period for which the reference signal changes between a level based on the information acquired by the one LSB level information acquisition section and a level equal to the signal to be processed.

3. The solid state imaging device according to claim 2, wherein the driving control section performs control such that an inclination of the reference signal in the second processing is set to 1/M of that in the first processing while maintaining an operating frequency of the counter section constant in the first and second processing.

4. The solid state imaging device according to claim 2, wherein the driving control section performs control such that an operating frequency of the counter section in the first processing is set to 1/M of that in the second processing while maintaining an inclination of the reference signal constant in the first and second processing.

5. The solid state imaging device according to claim 2, further comprising:
a pixel array section in which unit pixels that output the signal to be processed are arrayed in a matrix,
wherein the AD conversion section is provided for every column of the pixel array section, and
the reference signal generating section supplies the reference signal to the comparing section of each column in common.

6. The solid state imaging device according to claim 1, wherein the driving control section performs control such that an inclination of the reference signal in the second processing is set to 1/M of that in the first processing while maintaining an operating frequency of the counter section constant in the first and second processing.

7. The solid state imaging device according to claim 6, further comprising:
a pixel array section in which unit pixels that output the signal to be processed are arrayed in a matrix,
wherein the AD conversion section is provided for every column of the pixel array section, and
the reference signal generating section supplies the reference signal to the comparing section of each column in common.

8. The solid state imaging device according to claim 1, wherein the driving control section performs control such that an operating frequency of the counter section in the first processing is set to 1/M of that in the second processing while maintaining an inclination of the reference signal constant in the first and second processing.

9. The solid state imaging device according to claim 8, further comprising:
a pixel array section in which unit pixels that output the signal to be processed are arrayed in a matrix,
wherein the AD conversion section is provided for every column of the pixel array section, and
the reference signal generating section supplies the reference signal to the comparing section of each column in common.

10. The solid state imaging device according to claim 9, wherein the signal to be processed which is output from the unit pixel has a reset level and a signal level, and
a functional section that calculates a difference between digital data of the reset level and the signal level, which are obtained by executing the AD conversion processing twice, for the reset level and the signal level.

11. The solid state imaging device according to claim 1, further comprising:
a pixel array section in which unit pixels that output the signal to be processed are arrayed in a matrix,
wherein the AD conversion section is provided for every column of the pixel array section, and
the reference signal generating section supplies the reference signal to the comparing section of each column in common.

12. The solid state imaging device according to claim 11, wherein the signal to be processed which is output from the unit pixel has a reset level and a signal level, and
a functional section that calculates a difference between digital data of the reset level and the signal level, which are obtained by executing the AD conversion processing twice, for the reset level and the signal level.

13. An imaging apparatus comprising:
a pixel array section in which unit pixels, each of which has a charge generating section and a transistor that outputs a signal to be processed including a reset level and a signal level corresponding to an electric charge generated in the charge generating section, are arrayed in a matrix;
a reference signal generating section that generates a reference signal whose level changes gradually;
an AD conversion section that is provided for every column of the pixel array section, that has a comparing section, which compares each of the reset level and the signal level of the signal to be processed with the reference signal output from the reference signal generating section, and a counter section, which receives a count clock for AD conversion and performs a count operation on the basis of a comparison result of the comparing section, and that acquires digital data corresponding to a difference between the reset level and the signal level on the basis of output data of the counter section;
a count operation period control section that controls an operation period of the counter section in each processing on the basis of the comparison result of the comparing section;
a driving control section that controls the reference signal generating section and the AD conversion section such that for the signal to be processed, data of upper N–M bits is acquired by performing AD conversion processing with N–M bit precision in first processing and data of lower M bits is acquired by performing AD conversion processing with N bit precision for one LSB of N–M bit precision, which is difficult to resolve with N–M bit precision in the first processing, in second processing; and
a main control section that controls the driving control section,
wherein the driving control section controls the reference signal generating section such that the reference signal changes in a full range of AD conversion in both the first and second processing, and
the count operation period control section operates the counter section, in the first processing, in a first-half period of the full range of AD conversion until the comparison result of the comparing section is inverted or a second-half period of the full range of AD conversion after the comparison result of the comparing section is inverted and operates the counter section, in the second processing, in a period between a point of time when the reference signal reaches a level equivalent to a lower limit or upper limit of one LSB of N–M bit precision to which AD-converted data of the signal to be processed belongs and a point of time when the comparison result of the comparing section is inverted.

14. An electronic apparatus comprising:
a signal generating section that generates an analog signal to be processed;
a reference signal generating section that generates a reference signal whose level changes gradually;
a comparing section that compares the signal to be processed generated by the signal generating section with the reference signal supplied from the reference signal generating section;
a counter section that receives a count clock for AD conversion and performs a count operation on the basis of a comparison result of the comparing section;
a count operation period control section that controls an operation period of the counter section in each processing on the basis of the comparison result of the comparing section; and
a driving control section that controls the reference signal generating section and the counter section such that for the signal to be processed, data of upper N–M bits is acquired by performing AD conversion processing with N–M bit precision in first processing and data of lower M bits is acquired by performing AD conversion processing with N bit precision for one LSB of N–M bit precision, which is difficult to resolve with N–M bit precision in the first processing, in second processing,
wherein the driving control section controls the reference signal generating section such that the reference signal changes in a full range of AD conversion in both the first and second processing, and
the count operation period control section operates the counter section, in the first processing, in a first-half period of the full range of AD conversion until the comparison result of the comparing section is inverted or a second-half period of the full range of AD conversion after the comparison result of the comparing section is inverted and operates the counter section, in the second processing, in a period between a point of time when the reference signal reaches a level equivalent to a lower limit or upper limit of one LSB of N–M bit precision to which AD-converted data of the signal to be processed belongs and a point of time when the comparison result of the comparing section is inverted.

15. An AD converter comprising:
a reference signal generating section that generates a reference signal whose level changes gradually;
a comparing section that compares an analog signal to be processed with the reference signal supplied from the reference signal generating section;
a counter section that receives a count clock for AD conversion and performs a count operation on the basis of a comparison result of the comparing section;
a count operation period control section that controls an operation period of the counter section in each processing on the basis of the comparison result of the comparing section; and
a control section that controls the reference signal generating section and the counter section such that for the signal to be processed, data of upper N–M bits is acquired by performing AD conversion processing with N–M bit precision in first processing and data of lower M bits is acquired by performing AD conversion processing with N bit precision for one LSB of N–M bit precision, which is difficult to resolve with N−M bit precision in the first processing, in second processing, wherein the control section controls the reference signal generating section such that the reference signal changes in a full range of AD conversion in both the first and second processing, and the count operation period control section operates the counter section, in the first processing, in a first-half period of the full range of AD conversion until the comparison result of the comparing section is inverted or a second-half period of the full range of AD conversion after the comparison result of the comparing section is inverted and operates the counter section, in the second processing, in a period between a point of time when the reference signal reaches a level equivalent to a lower limit or upper limit of one LSB of N−M bit precision to which AD-converted data of the signal to be processed belongs and a point of time when the comparison result of the comparing section is inverted.

16. An AD conversion method comprising the steps of:

comparing a reference signal whose level changes gradually with an analog signal to be processed using a comparing section;

receiving a count clock for AD conversion and performing a count operation on the basis of a result of the comparison using a counter section; and acquiring digital data of the signal to be processed on the basis of output data of the counter section, wherein while changing the reference signal in a full range of AD conversion in both first and second processing, the counter section is made to operate, in the first processing, in a first-half period of the full range of AD conversion until the comparison result of the comparing section is inverted or a second-half period of the full range of AD conversion after the comparison result of the comparing section is inverted and to operate, in the second processing, in a period between a point of time when the reference signal reaches a level equivalent to a lower limit or upper limit of one LSB of N−M bit precision to which AD-converted data of the signal to be processed belongs and a point of time when the comparison result of the comparing section is inverted, and for the signal to be processed, data of upper N−M bits is acquired by performing AD conversion processing with N−M bit precision in the first processing and data of lower M bits is acquired by performing AD conversion processing with N bit precision for one LSB of N−M bit precision, which is difficult to resolve with N−M bit precision in the first processing, in second processing.

* * * * *